US012315695B2

(12) United States Patent
Hatano et al.

(10) Patent No.: US 12,315,695 B2
(45) Date of Patent: May 27, 2025

(54) SAMPLE HOLDER, INTERMEMBRANE DISTANCE ADJUSTMENT MECHANISM, AND CHARGED PARTICLE BEAM DEVICE

(71) Applicants: Hitachi High-Tech Corporation, Tokyo (JP); National Institute of Advanced Industrial Science and Technology, Tokyo (JP)

(72) Inventors: Michio Hatano, Tokyo (JP); Mitsuhiro Nakamura, Tokyo (JP); Toshihiko Ogura, Tsukuba (JP)

(73) Assignees: Hitachi High-Tech Corporation, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 68 days.

(21) Appl. No.: 17/767,595

(22) PCT Filed: Oct. 10, 2019

(86) PCT No.: PCT/JP2019/040075
§ 371 (c)(1),
(2) Date: Apr. 8, 2022

(87) PCT Pub. No.: WO2021/070336
PCT Pub. Date: Apr. 15, 2021

(65) Prior Publication Data
US 2024/0079201 A1    Mar. 7, 2024

(51) Int. Cl.
*H01J 37/20* (2006.01)
*H01J 37/28* (2006.01)
(52) U.S. Cl.
CPC ............. *H01J 37/20* (2013.01); *H01J 37/28* (2013.01); *H01J 2237/2005* (2013.01)

(58) Field of Classification Search
CPC .. H01J 37/00; H01J 37/02; H01J 37/26; H01J 37/20; H01J 37/28; H01J 2237/2005; H01J 2237/2003
(Continued)

(56) References Cited

U.S. PATENT DOCUMENTS

| | | | |
|---|---|---|---|
| 9,269,534 B2* | 2/2016 | Ogura | G01N 23/225 |
| 2008/0179518 A1* | 7/2008 | Creemer | H01J 37/26 |
| | | | 250/311 |

(Continued)

FOREIGN PATENT DOCUMENTS

| | | |
|---|---|---|
| JP | 2013-535795 A | 9/2013 |
| JP | 2014-203733 A | 10/2014 |
| JP | 2016-72184 A | 5/2016 |

OTHER PUBLICATIONS

International Search Report (PCT/ISA/210) issued in PCT Application No. PCT/JP2019/040075 dated Dec. 17, 2019 with English translation (two (2) pages).

(Continued)

*Primary Examiner* — Jason L McCormack
(74) *Attorney, Agent, or Firm* — Crowell & Moring LLP

(57) ABSTRACT

A sample holder reliably holds a liquid or gel sample, and the yield of observation with a charged particle beam device is improved. A sample holder 101 includes a first member 102 that has a lid member 111 and a first chip 105 provided with a first window 123 where a laminated film including a first insulating thin film 104 is formed, and a second member 103 that has a base material 127 having a first bottom seal surface 203 and a second bottom seal surface 200, an electrode 108 disposed on the base material, and a second chip 107 provided with a second window 124 where a second insulating thin film 106 is formed and held on the second bottom seal surface via a second seal material 119 such that the second window faces the electrode, in which a (Continued)

region inside a first seal material is maintained airtightly from a region outside the first seal material by the first member and the second member being combined and the first seal material being crushed between the first bottom seal surface and an upper seal surface of the lid member.

31 Claims, 40 Drawing Sheets

(58) Field of Classification Search
USPC .................................................. 250/453.11
See application file for complete search history.

(56) References Cited

U.S. PATENT DOCUMENTS

| | | | | |
|---|---|---|---|---|
| 2012/0193550 A1* | 8/2012 | Tsuji | ........................ | F16F 1/50 250/396 R |
| 2012/0199739 A1* | 8/2012 | Nakano | ................ | H01J 37/153 250/307 |
| 2013/0264476 A1 | 10/2013 | Damiano, Jr. et al. | | |
| 2016/0056012 A1 | 2/2016 | Ogura | | |
| 2017/0199114 A1* | 7/2017 | Holm | .................... | H01J 37/244 |
| 2018/0166312 A1* | 6/2018 | Kimball | .............. | H01L 21/6831 |
| 2018/0204704 A1* | 7/2018 | Suzuki | .................... | H01J 37/20 |
| 2019/0013177 A1* | 1/2019 | Ominami | ................ | H01J 37/20 |

OTHER PUBLICATIONS

Japanese-language Written Opinion (PCT/ISA/237) issued in PCT Application No. PCT/JP2019/040075 dated Dec. 17, 2019 (three (3) pages).

Ogura, "Non-Destructive Observation of Intact Bacteria and Viruses in Water by the Highly Sensitive Frequency Transmission Electric-Field Method Based on SEM", Biochemical and Biophysical Research Communications, Jul. 21, 2014, pp. 1684-1689, vol. 450, No. 4 (six (6) pages).

* cited by examiner

[FIG. 1A]
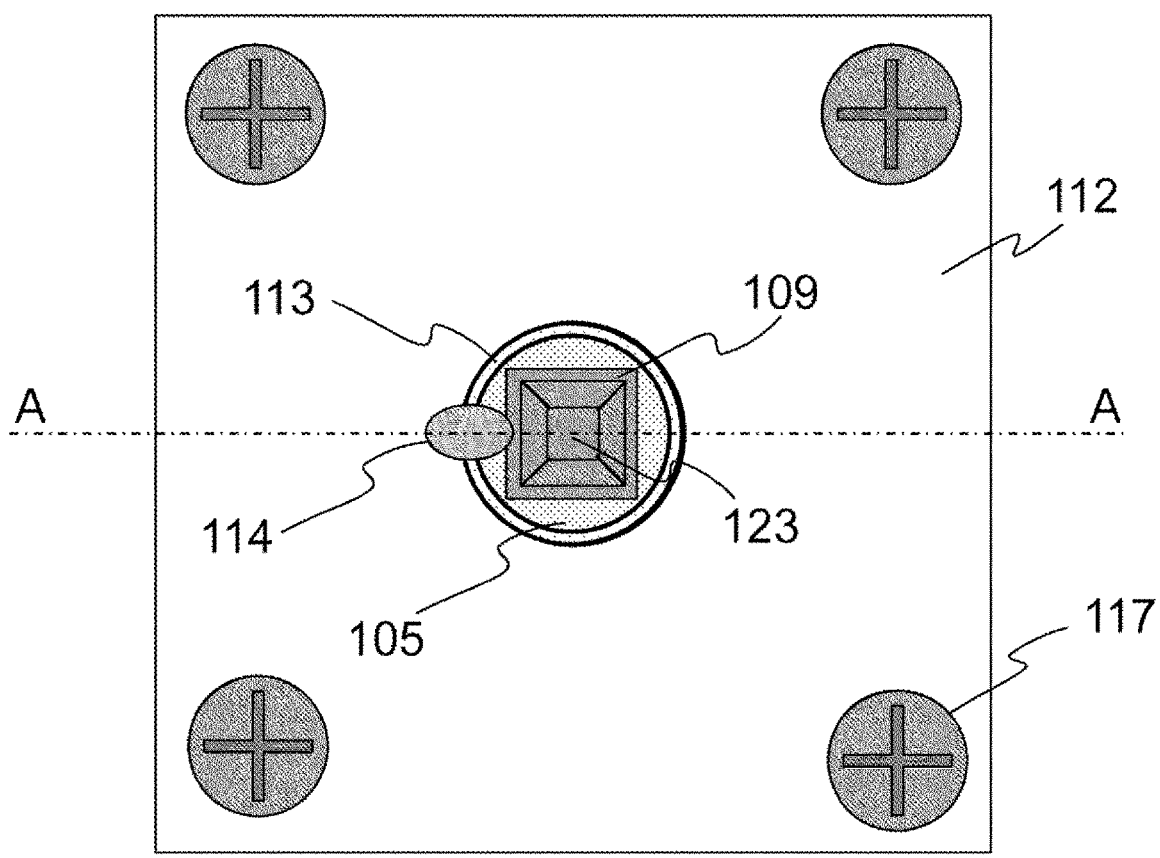

[FIG. 1B]
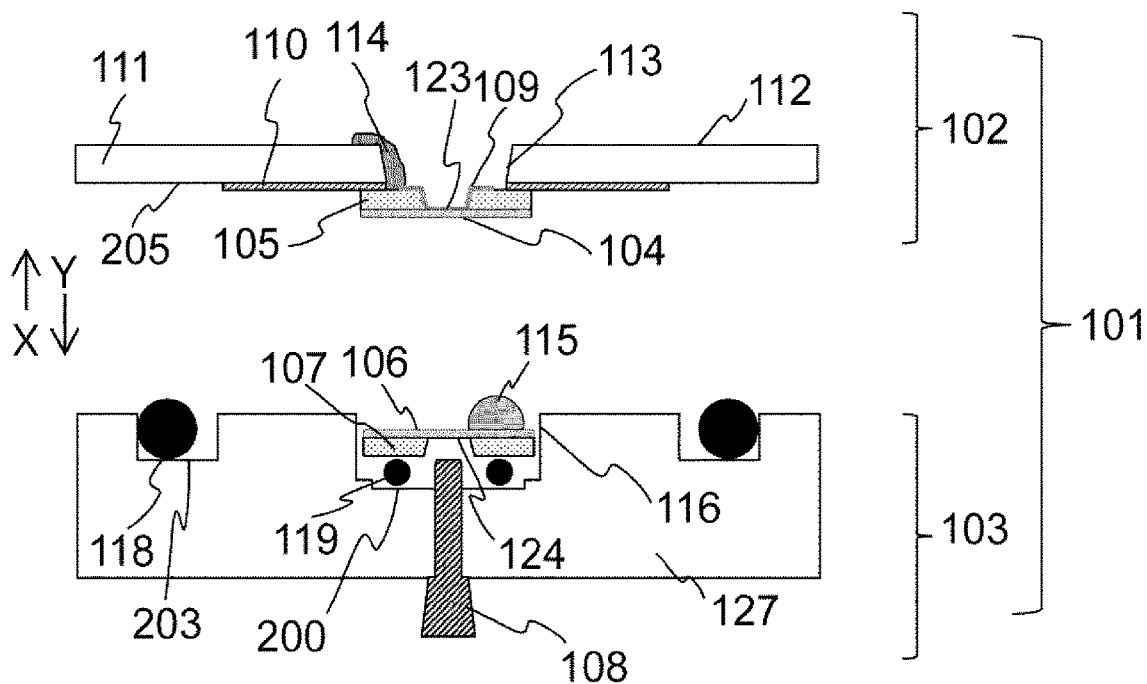
[FIG. 1C]
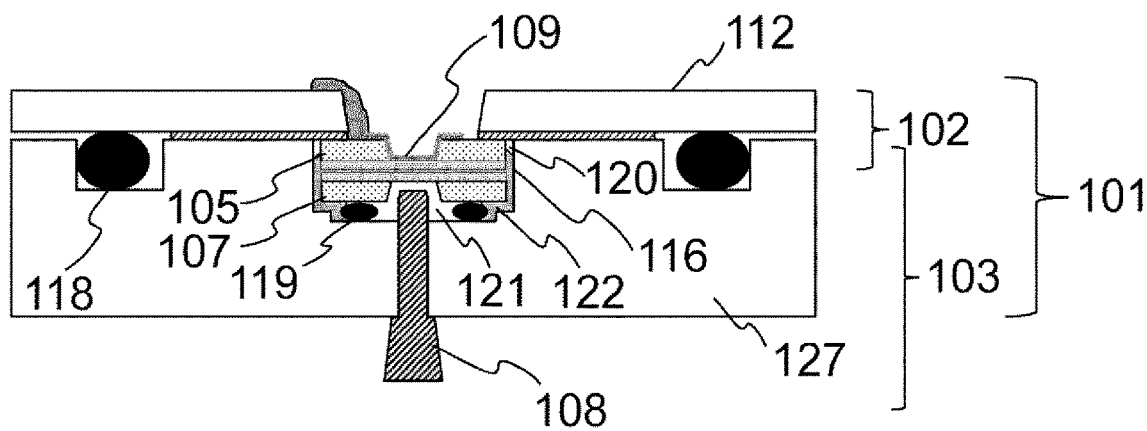

[FIG. 1D]
102
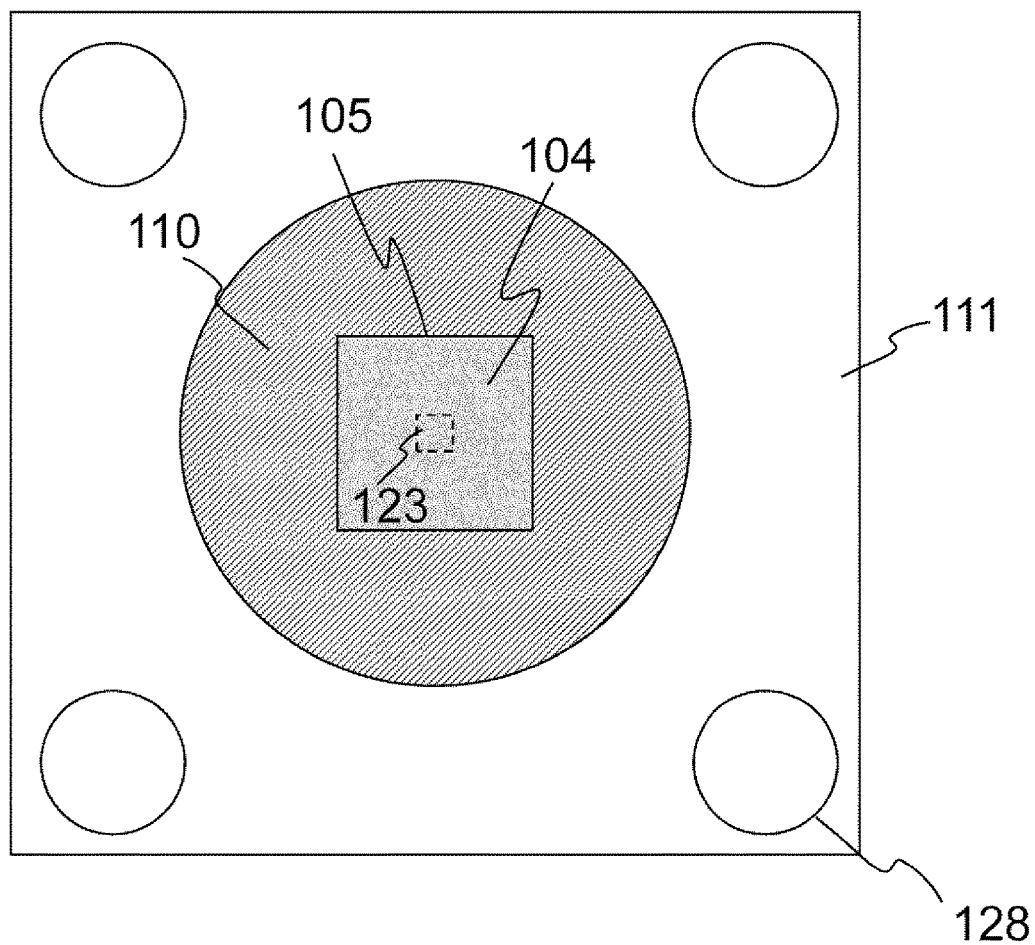

[FIG. 1E]
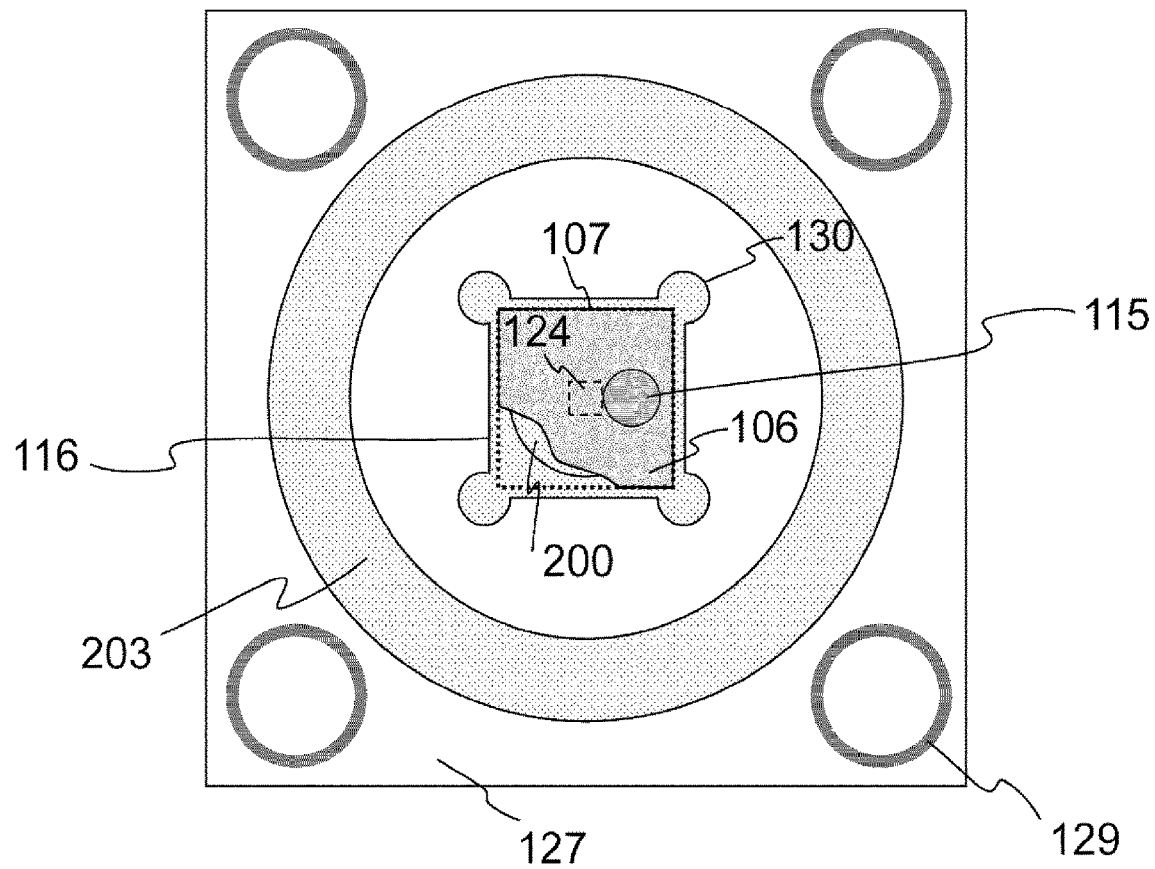

[FIG. 1F]
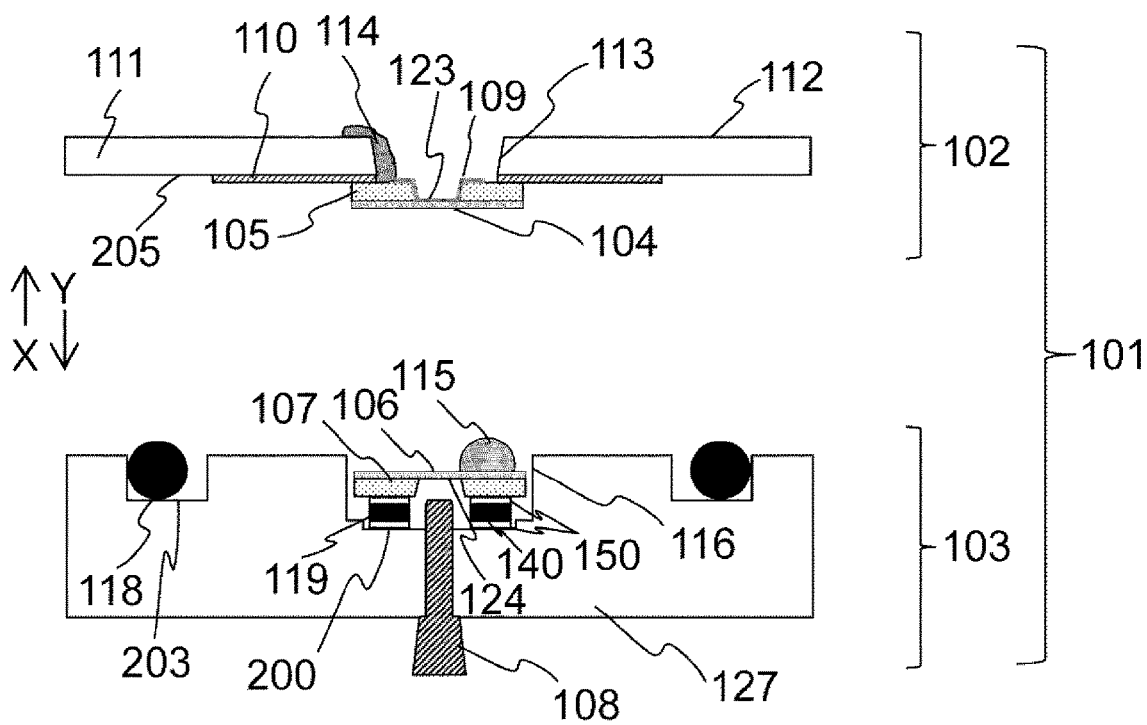
[FIG. 1G]
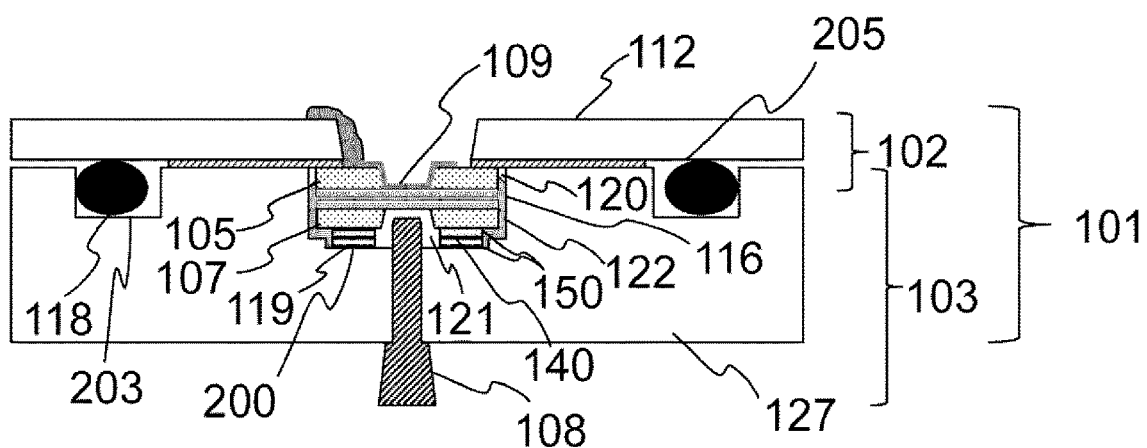

[FIG. 2A]
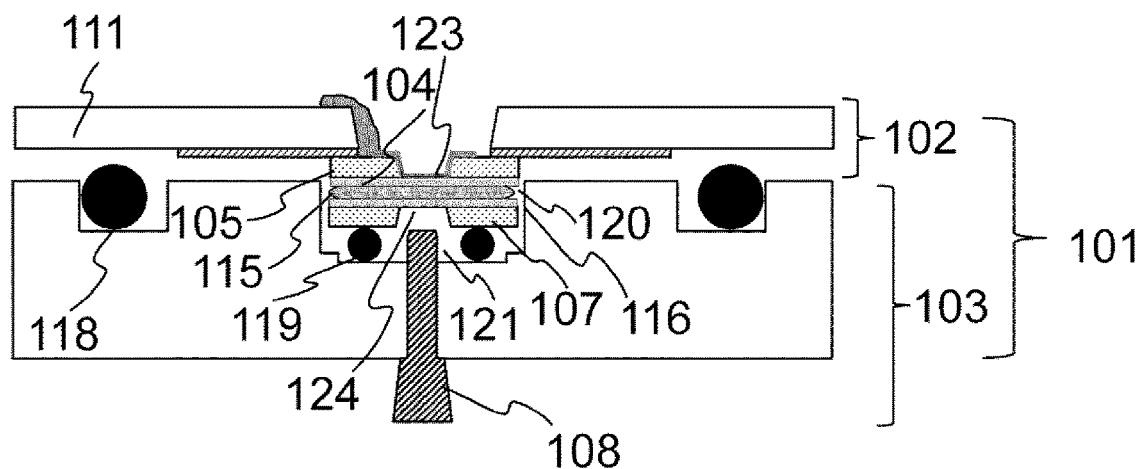
[FIG. 2B]
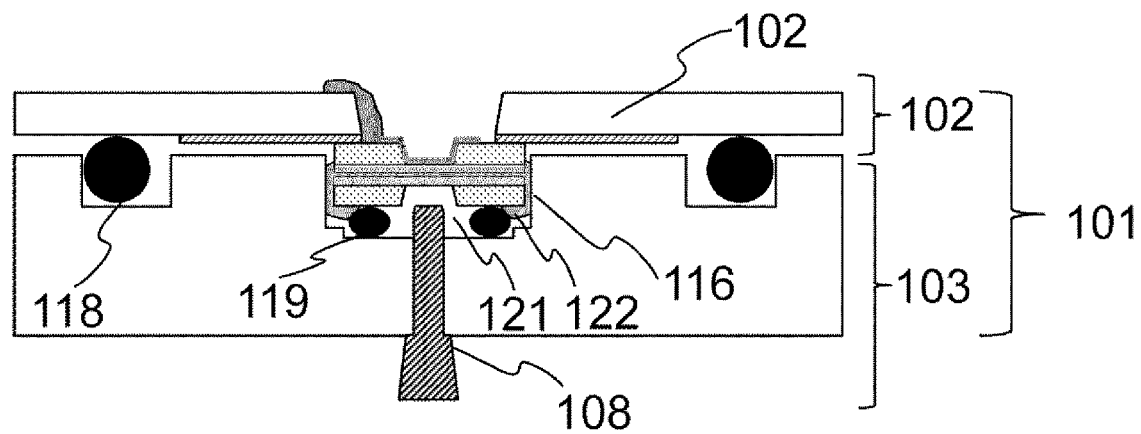

[FIG. 2C]
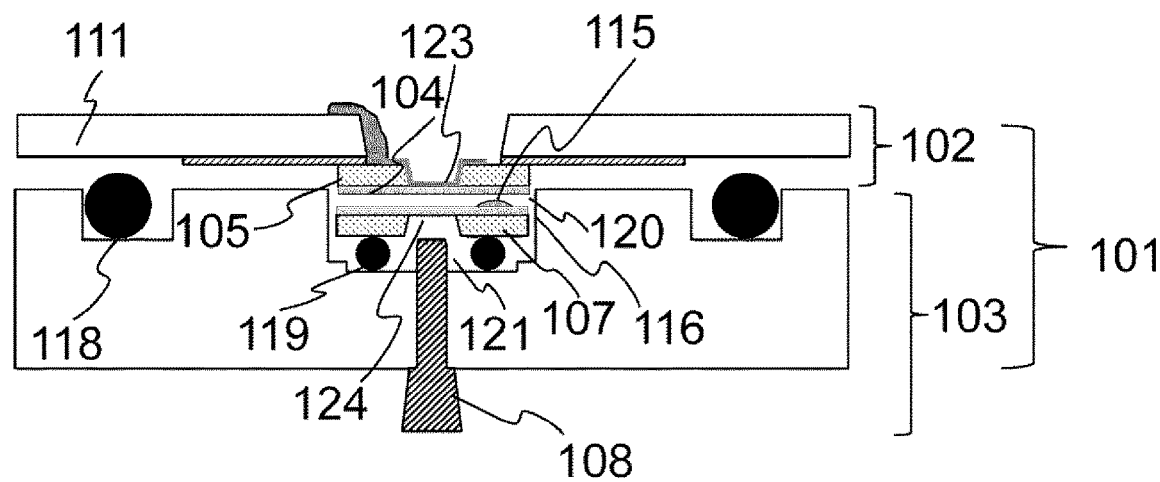
[FIG. 3]
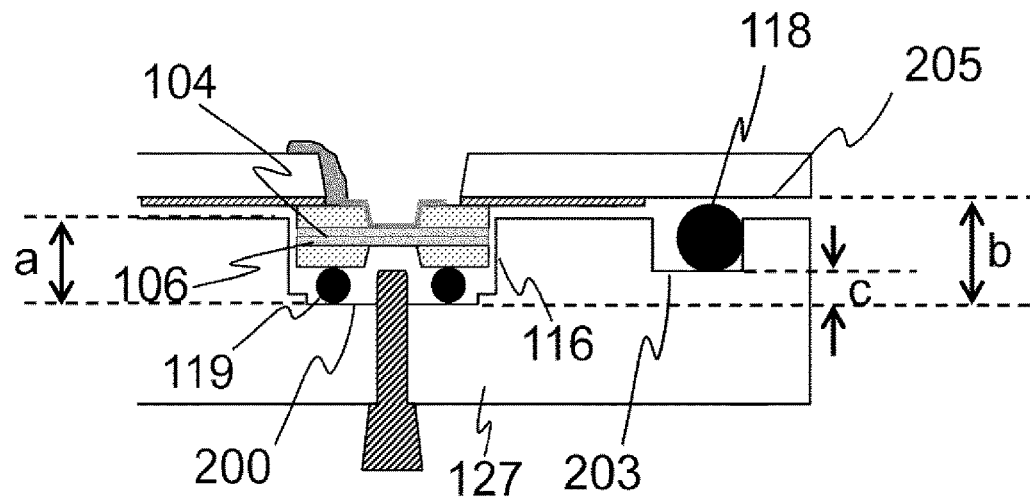

[FIG. 4A]
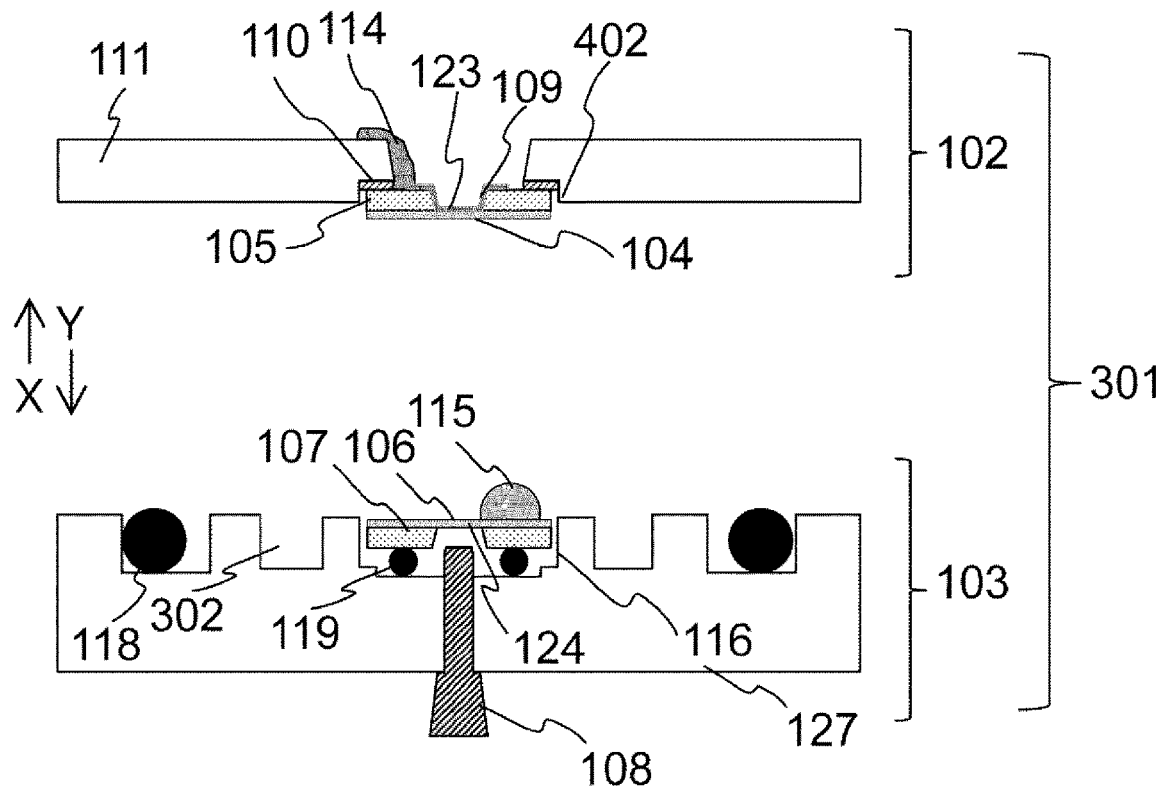
[FIG. 4B]
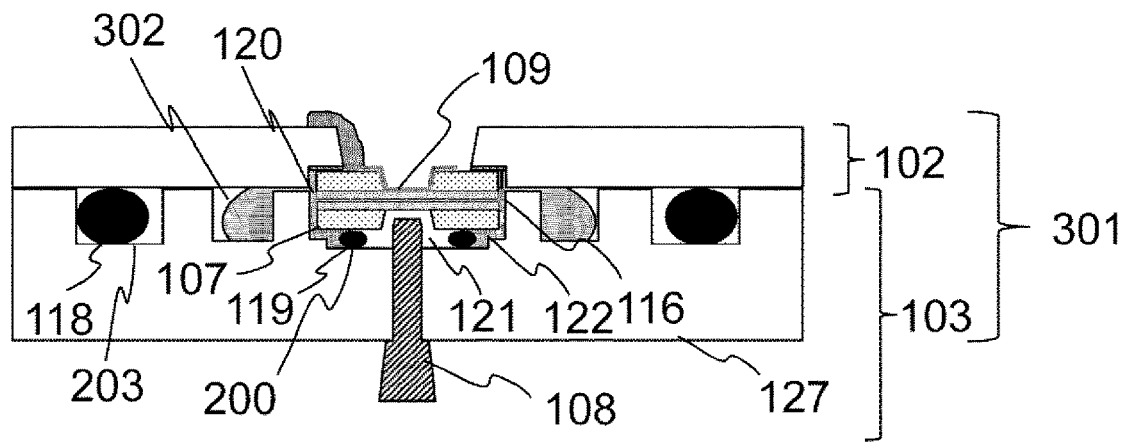

[FIG. 4C]
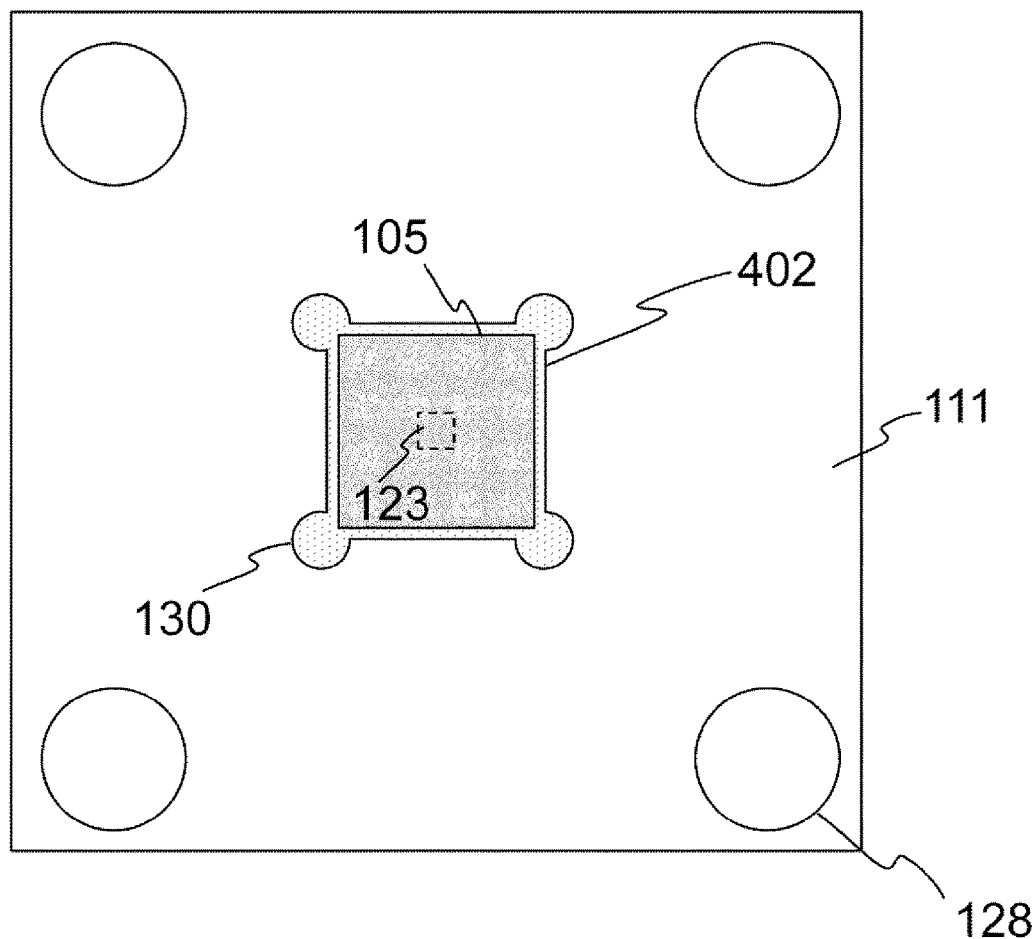

[FIG. 4D]
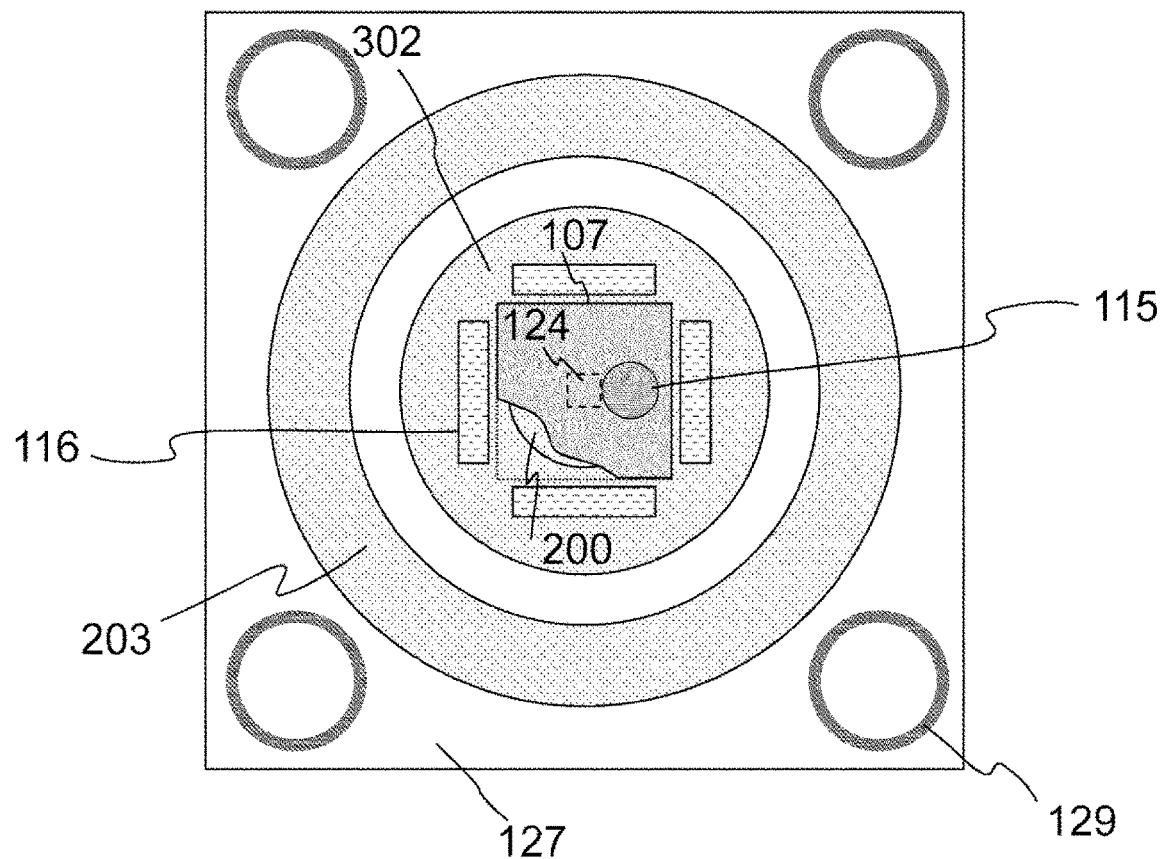

[FIG. 5A]
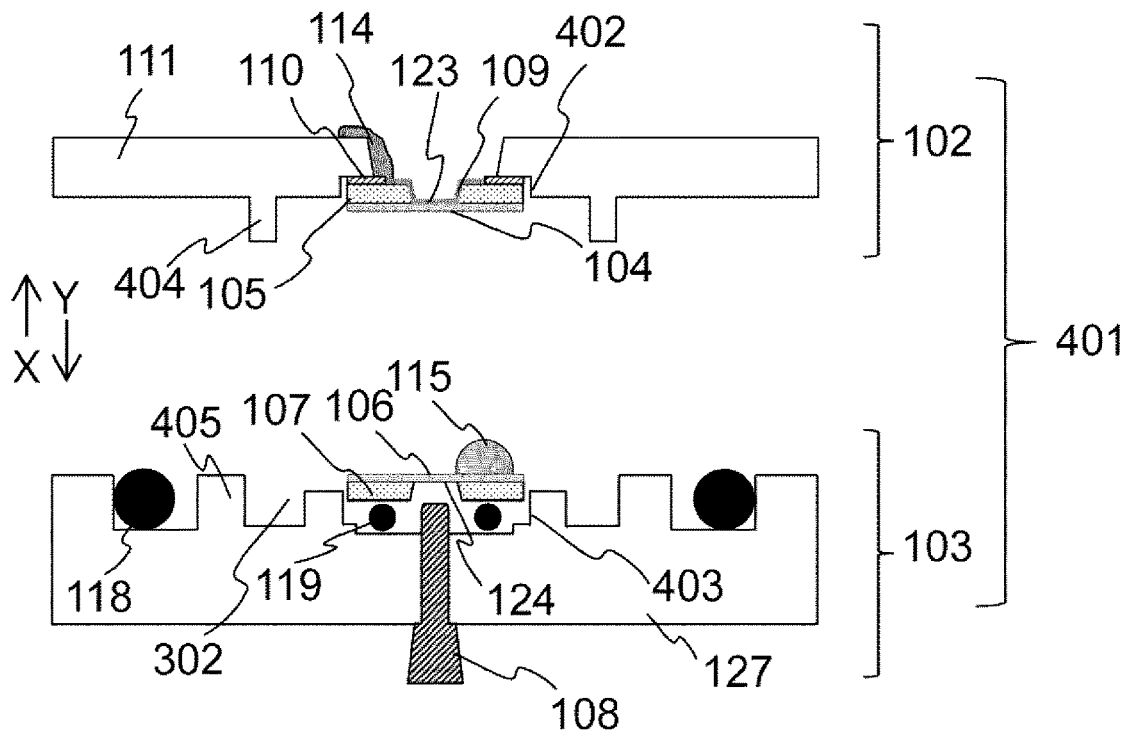
[FIG. 5B]
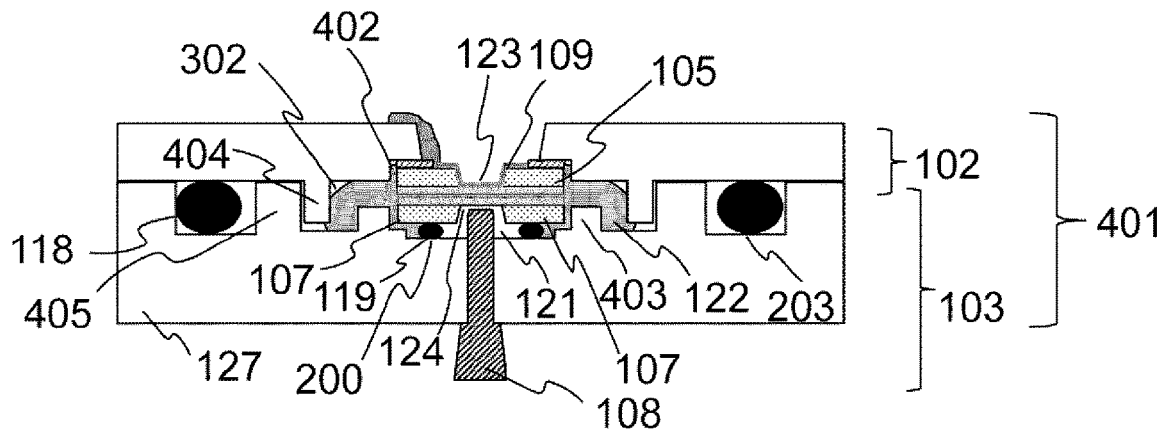

[FIG. 5C]
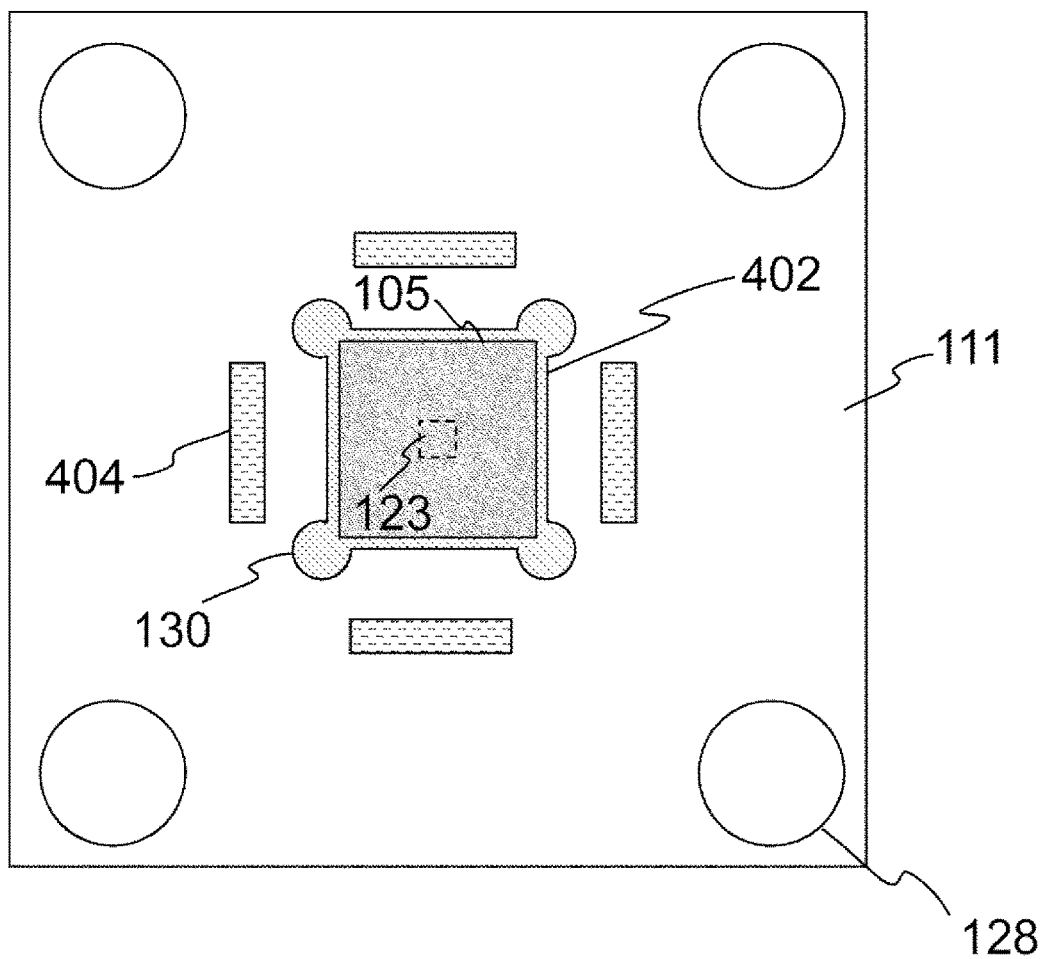

[FIG. 5D]
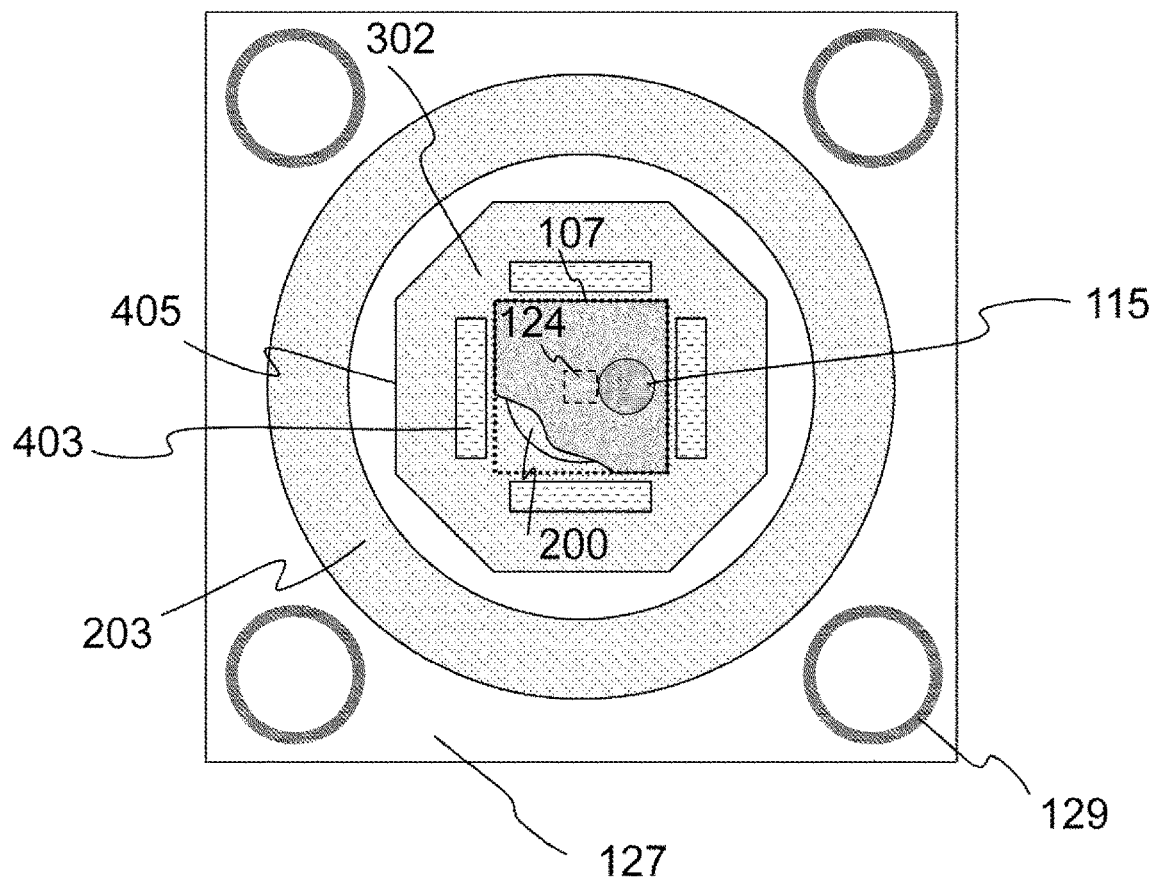
[FIG. 5E]
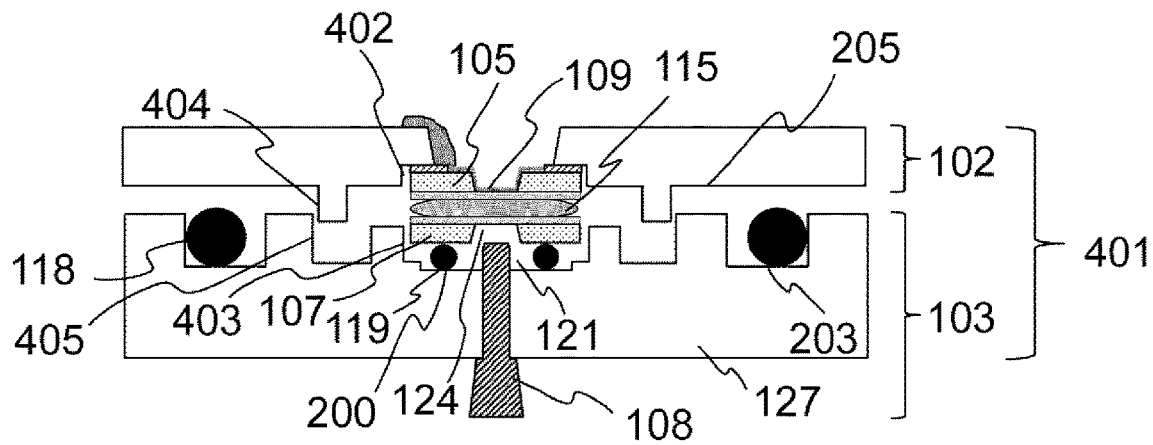

[FIG. 6A]
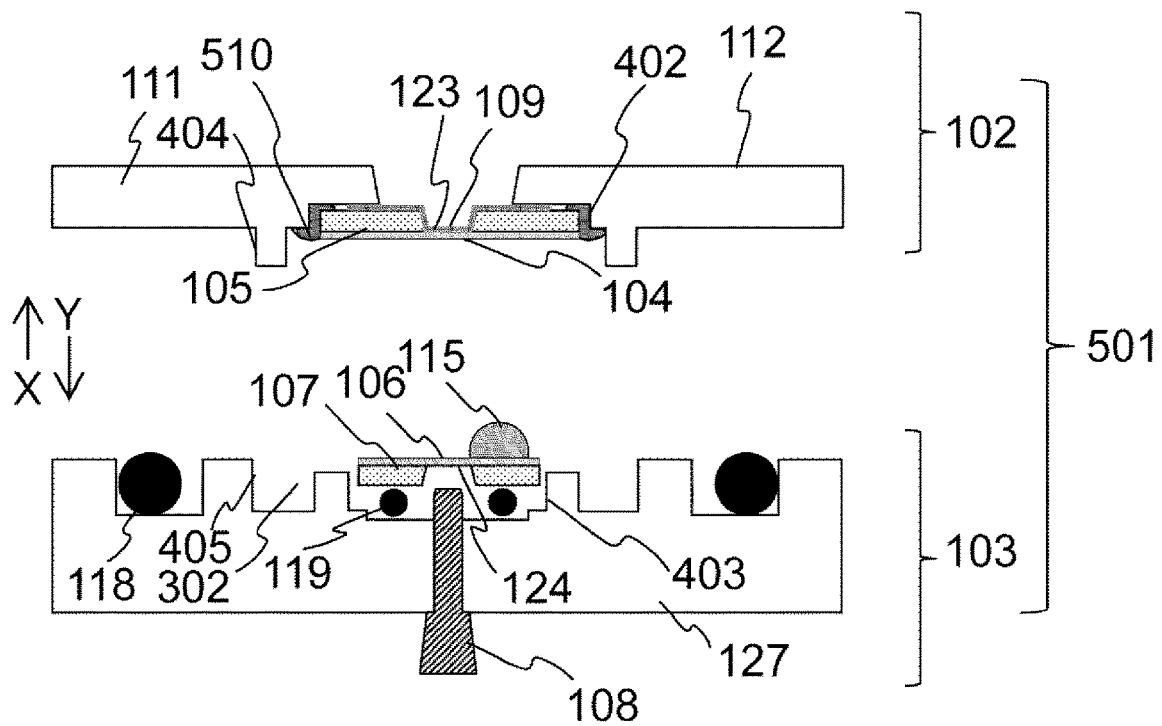
[FIG. 6B]
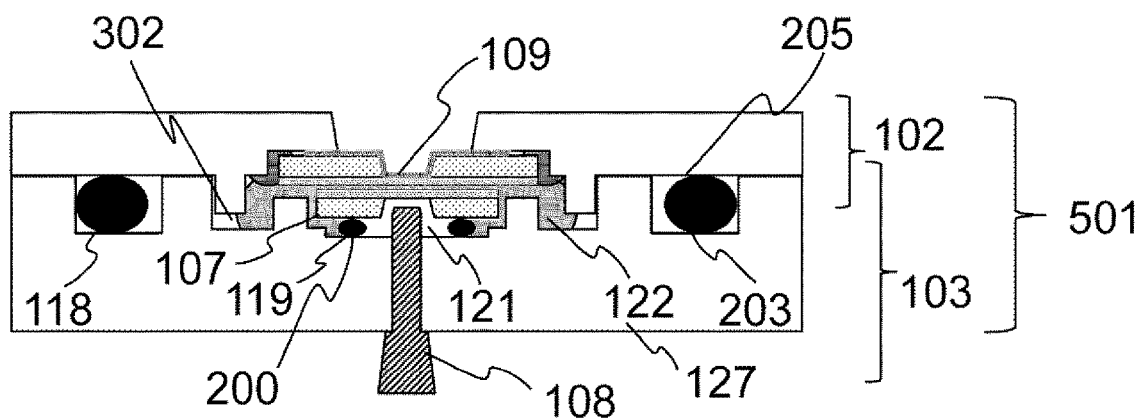

[FIG. 6C]
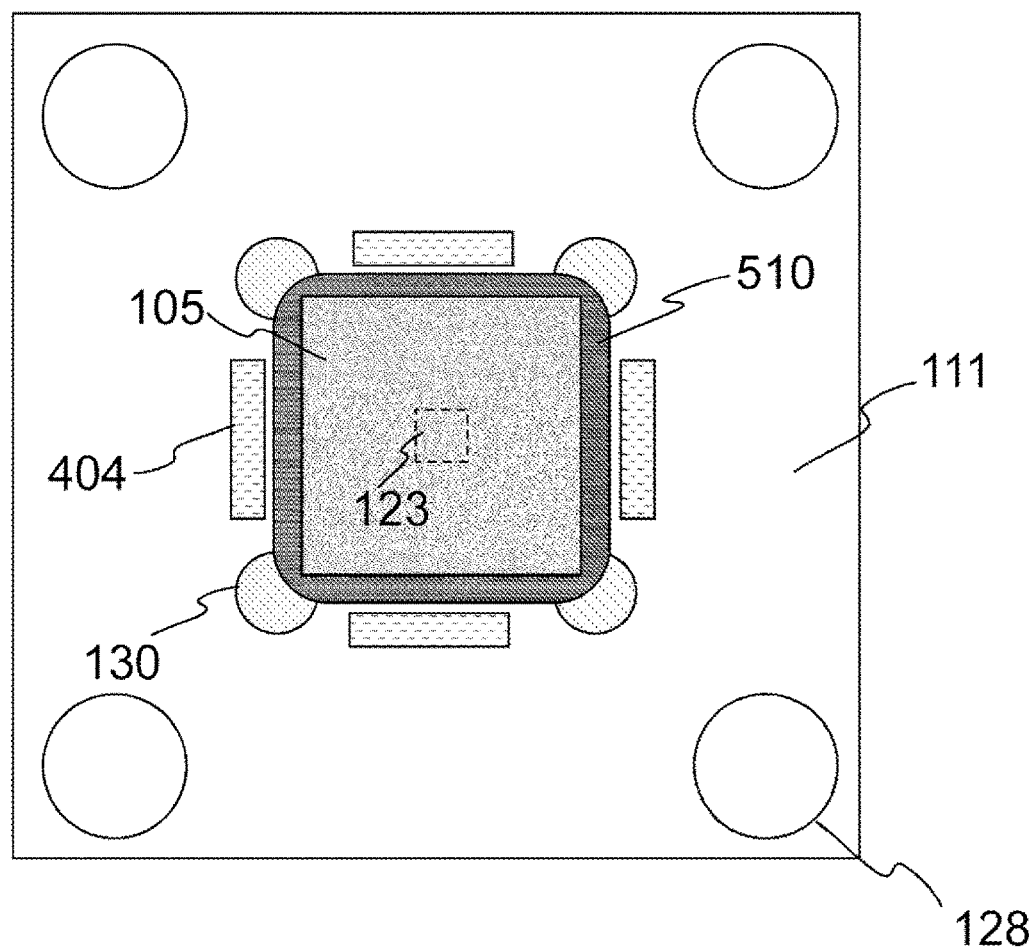

[FIG. 7A]
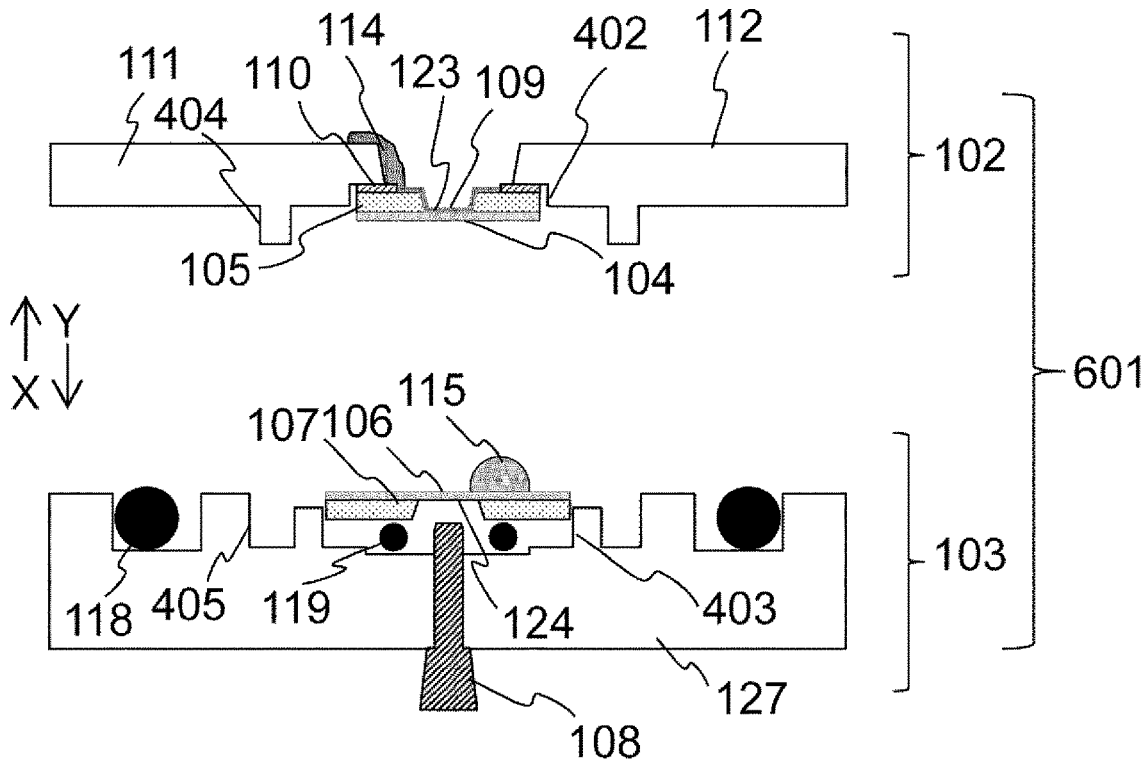
[FIG. 7B]
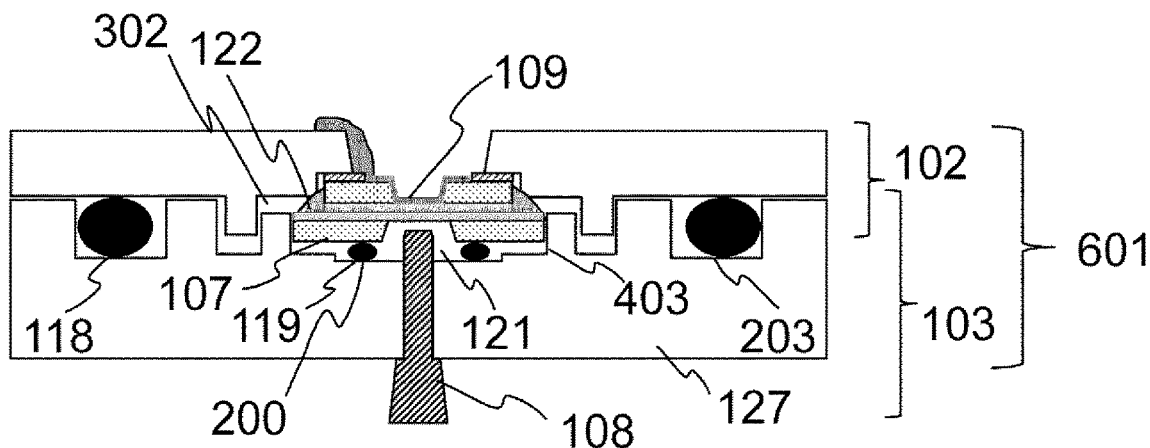

[FIG. 7C]
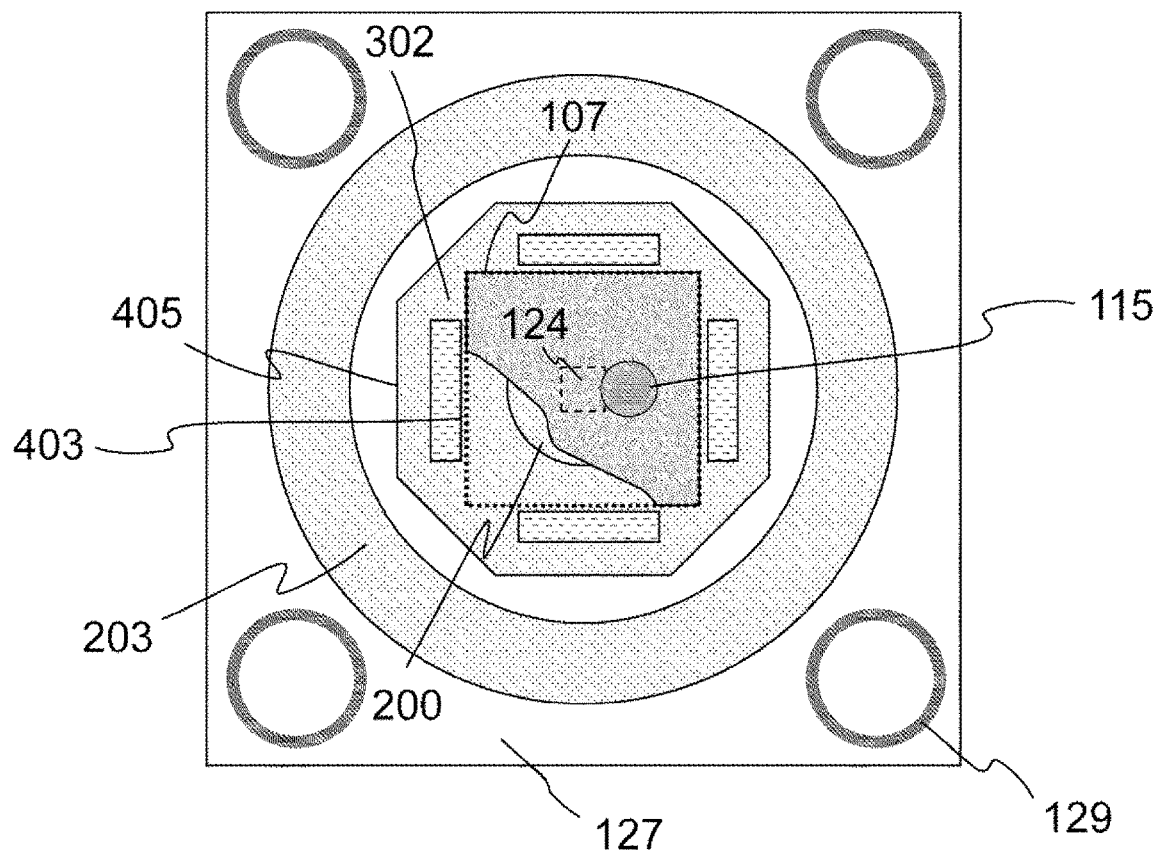
[FIG. 8A]
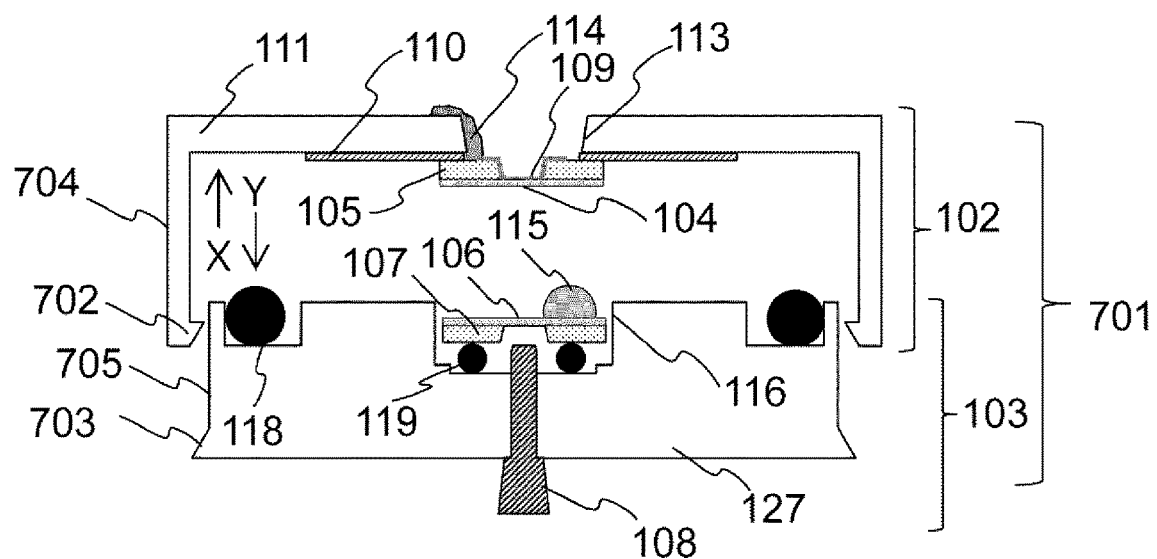

[FIG. 8B]
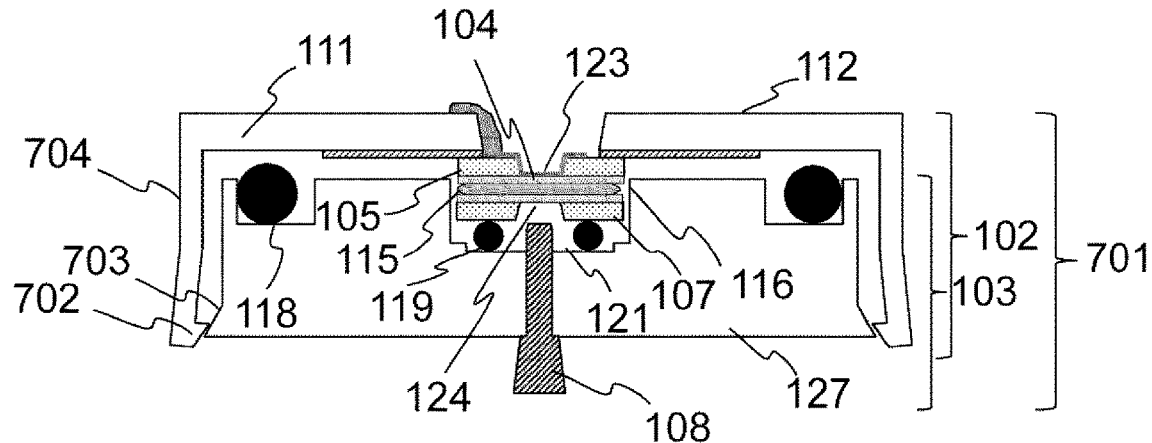
[FIG. 8C]
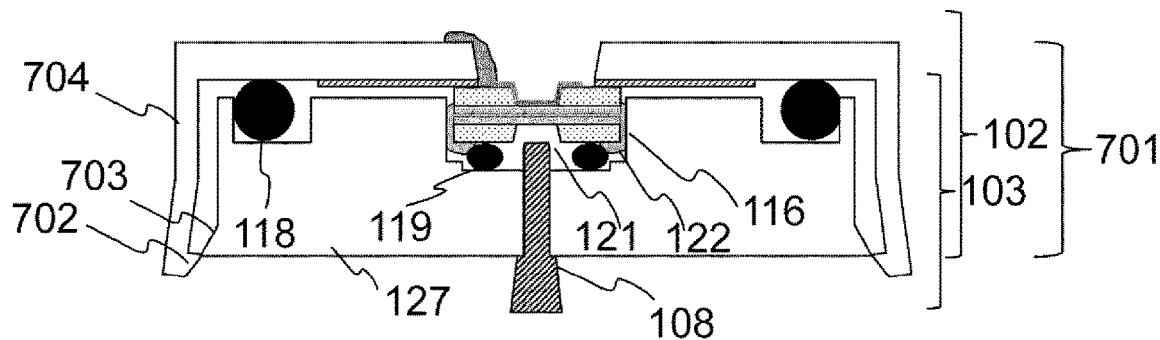
[FIG. 8D]
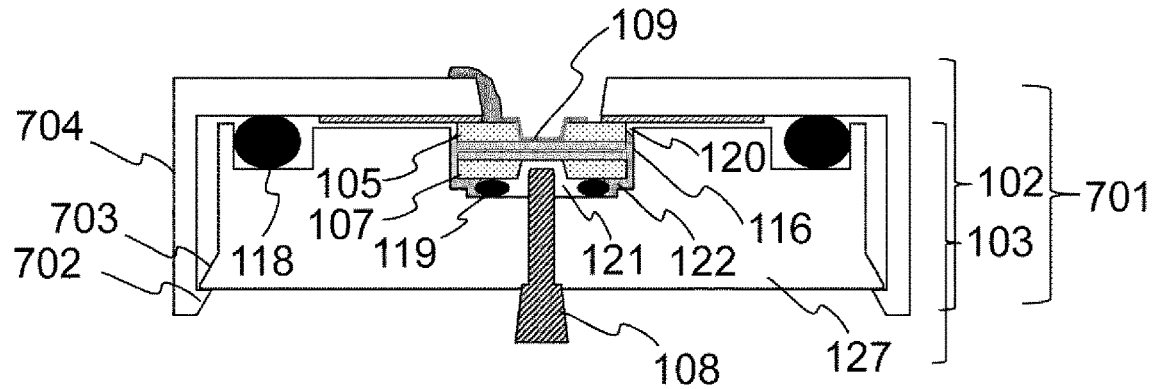

[FIG. 8E]
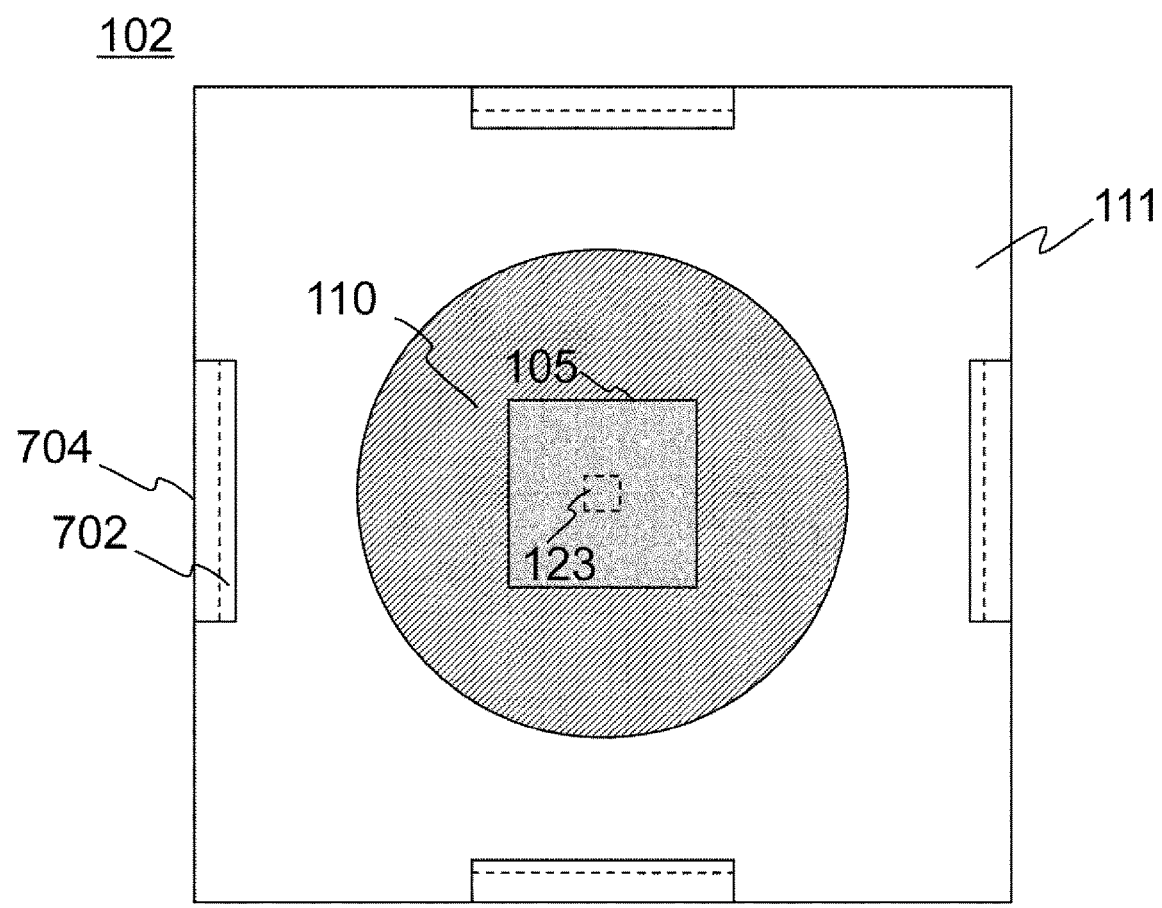

[FIG. 8F]
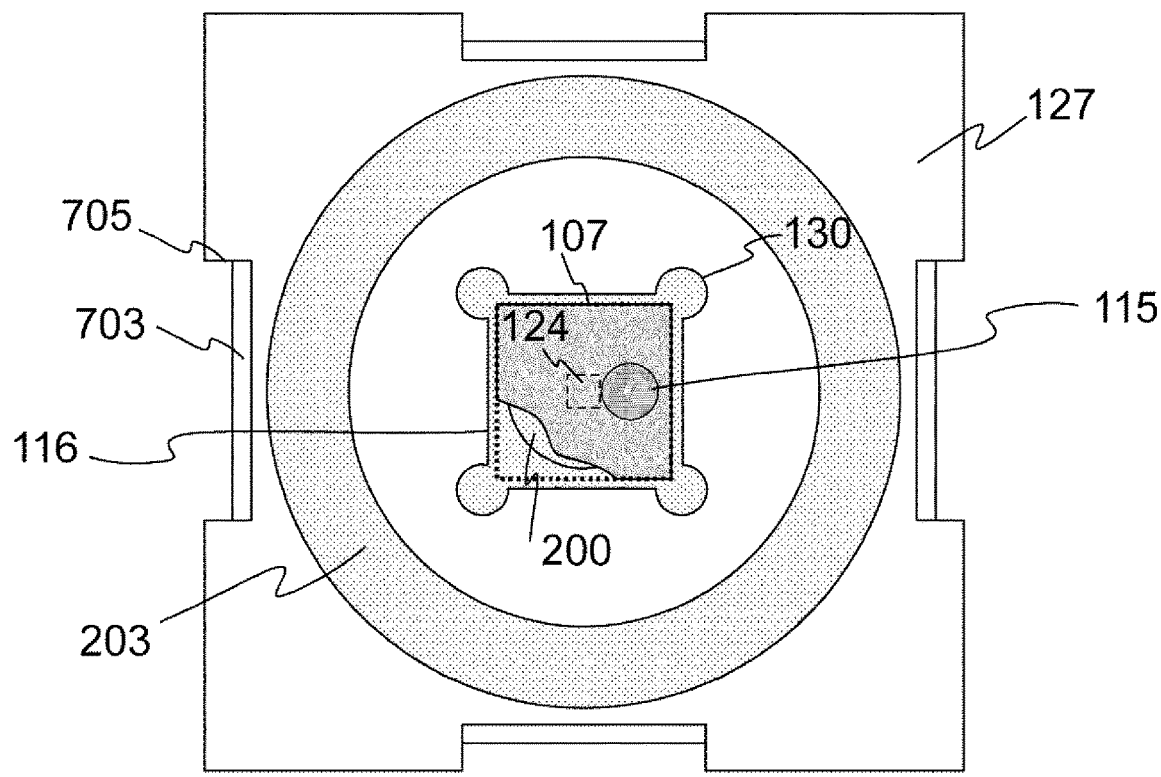

[FIG. 9A]
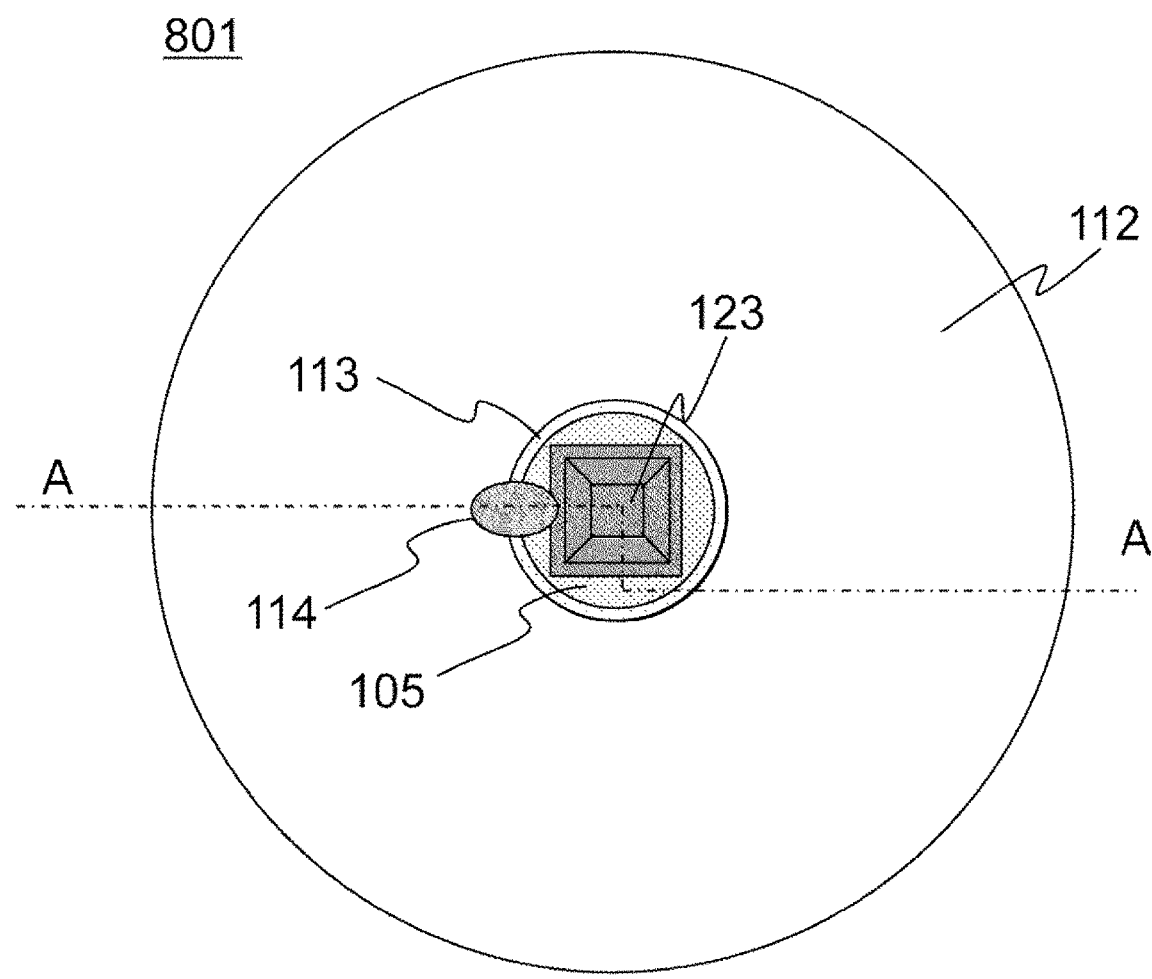

[FIG. 9B]
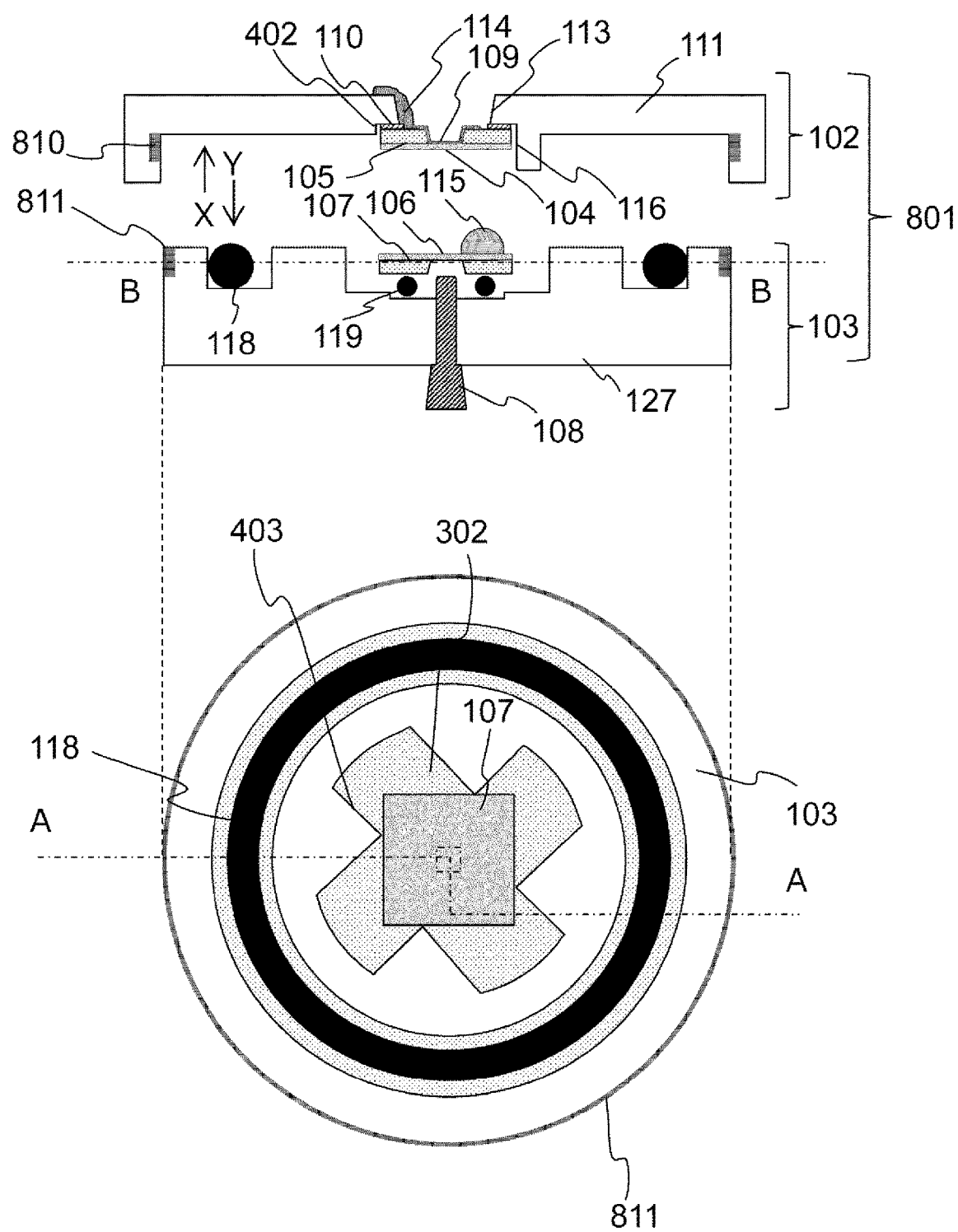

[FIG. 9C]
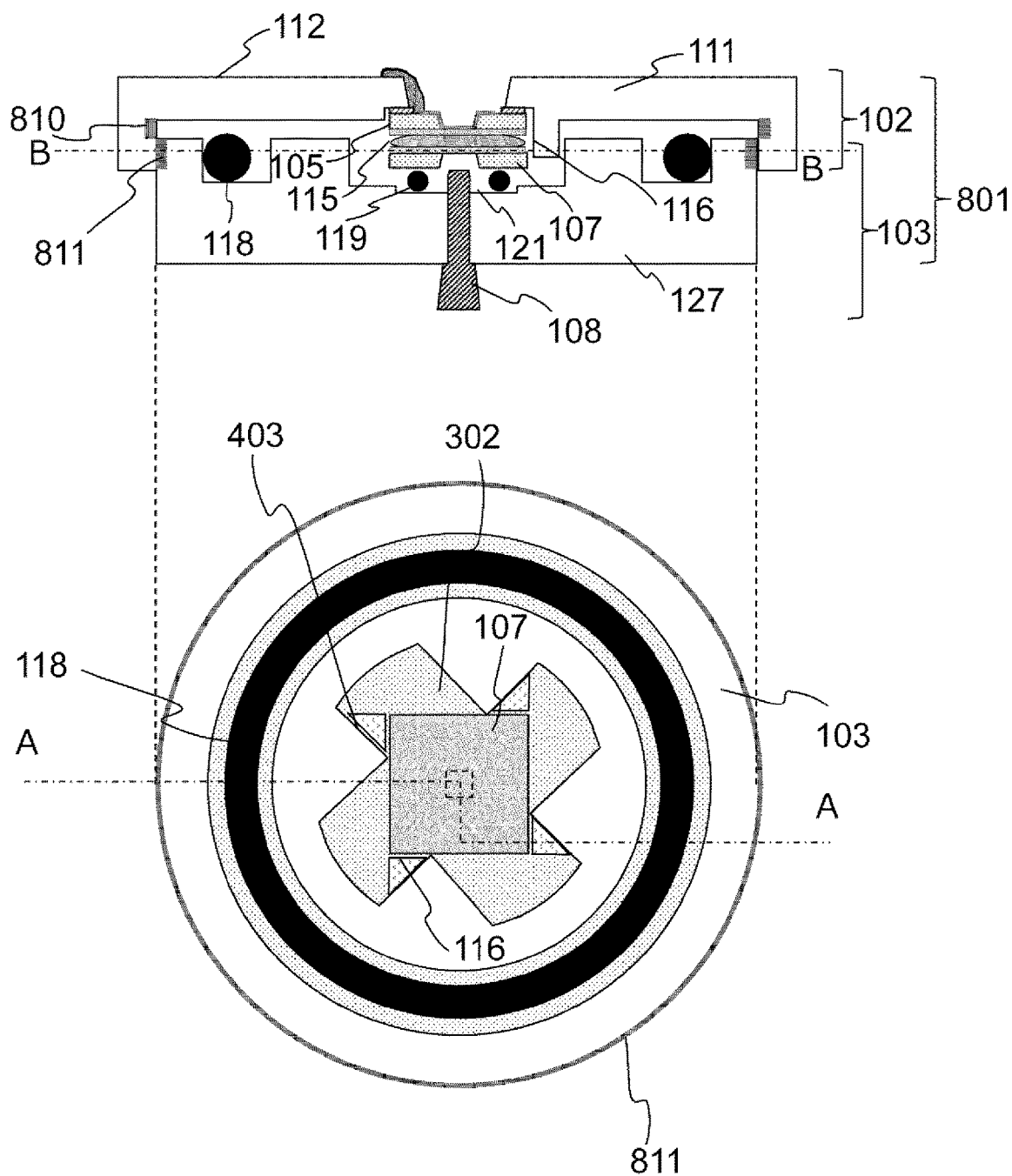

[FIG. 9D]
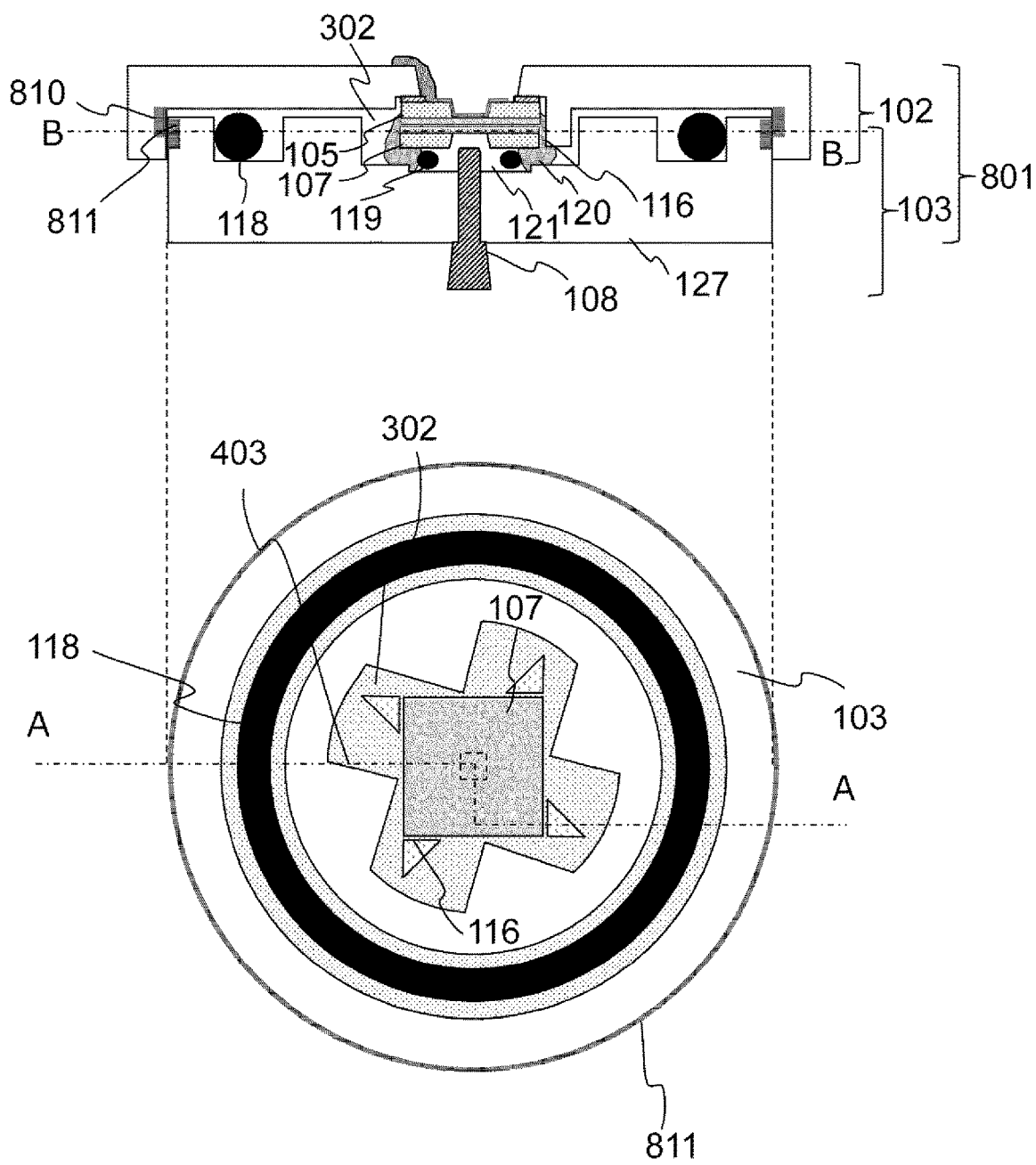

[FIG. 9E]
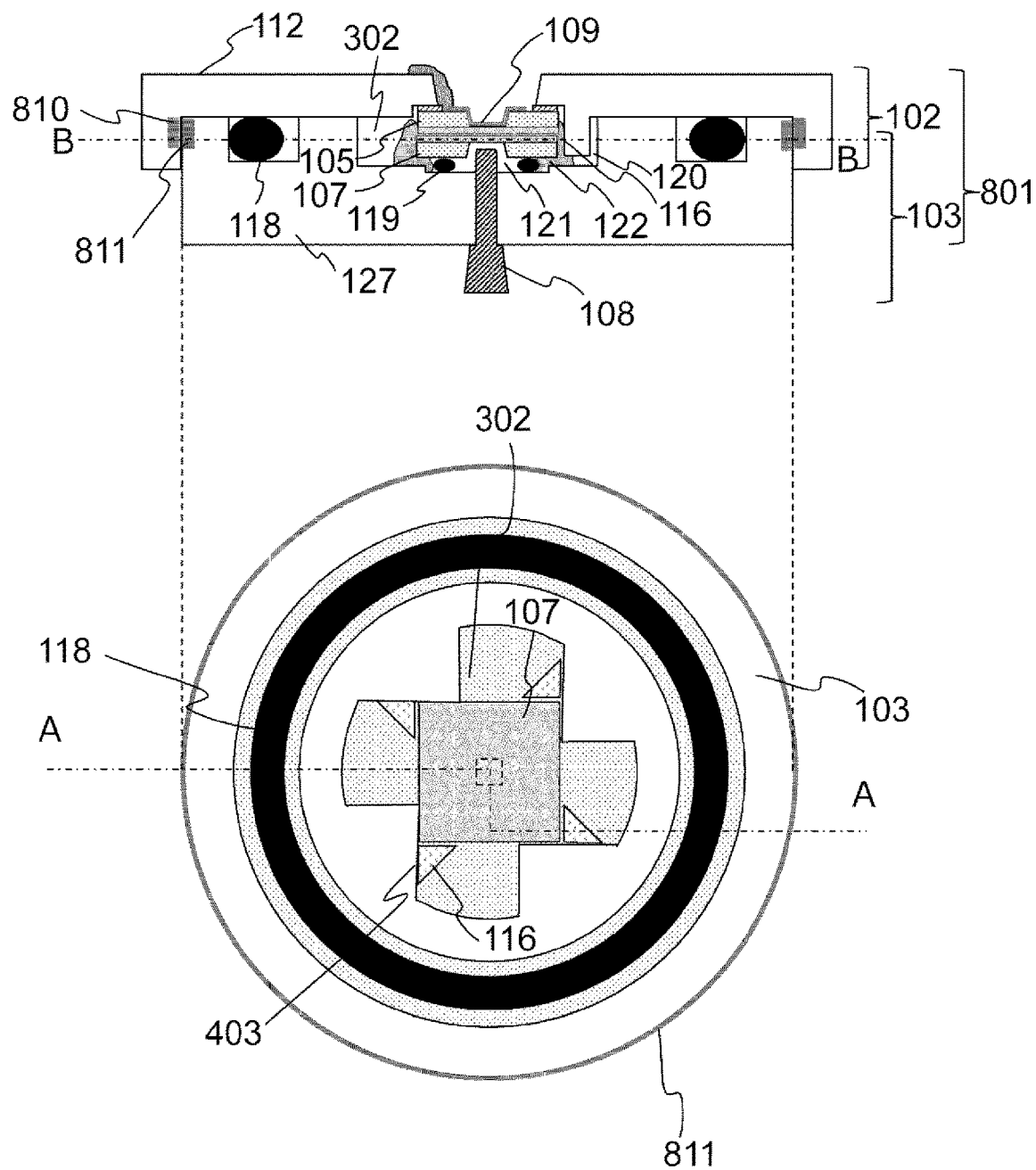

[FIG. 9F]
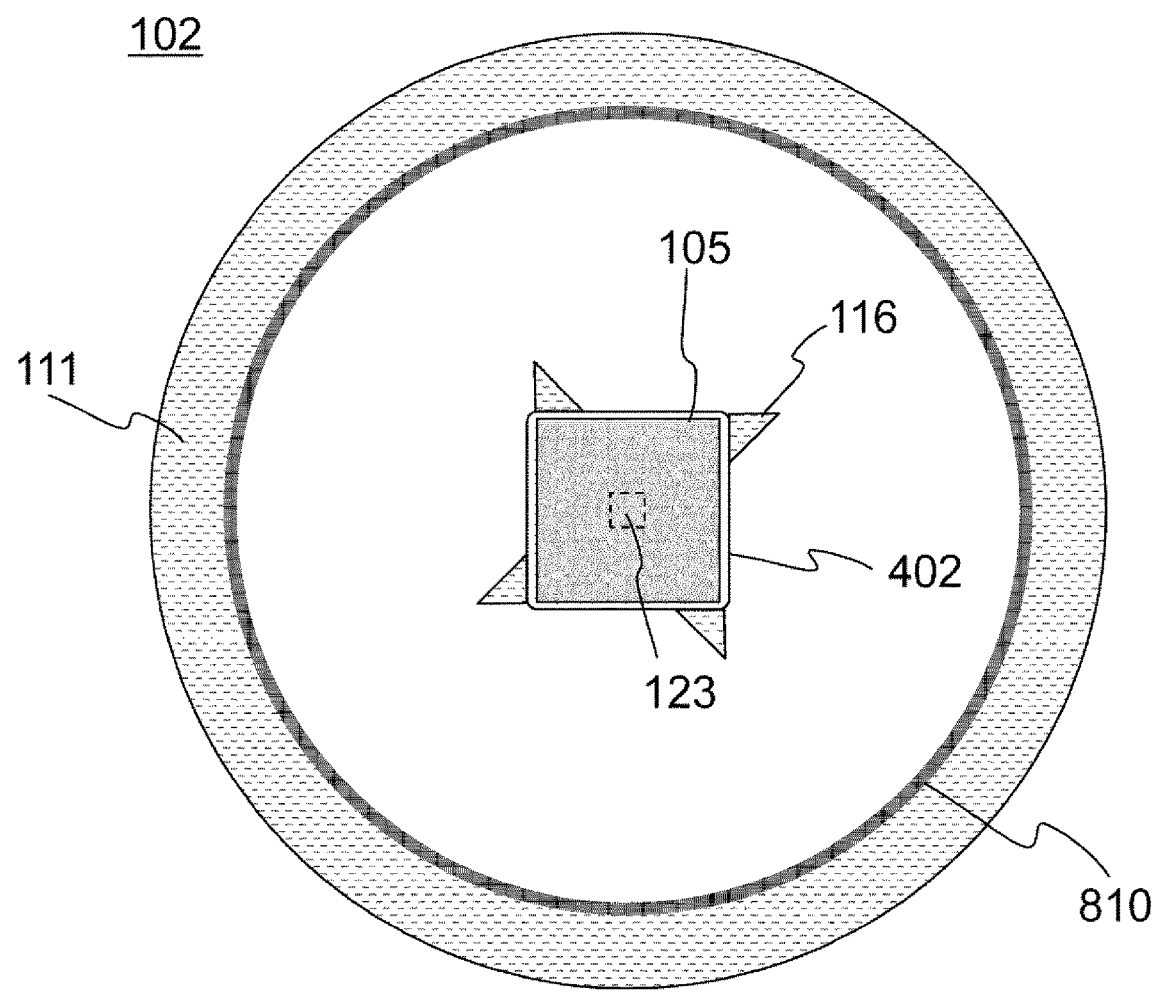

[FIG. 9G]
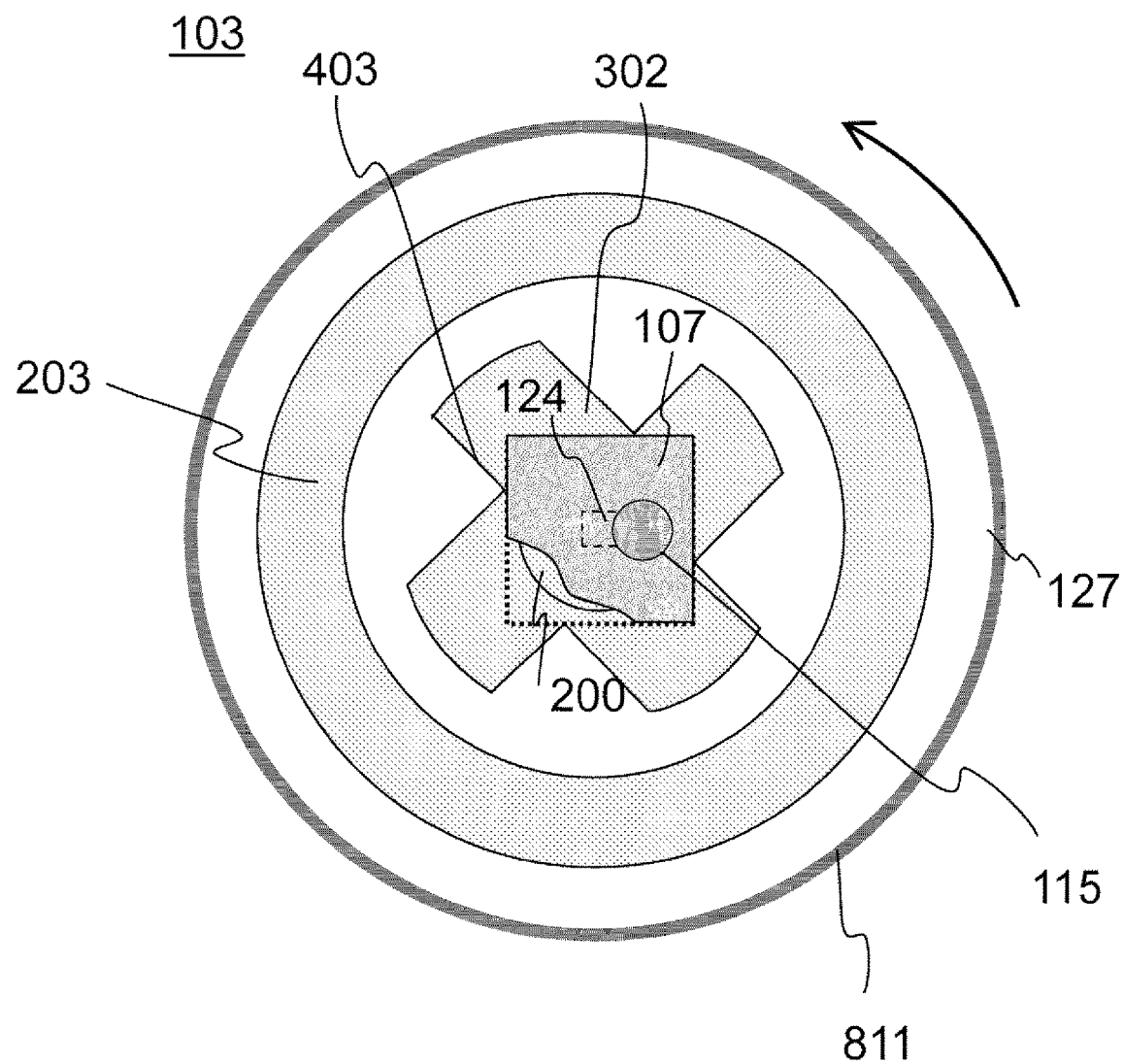

[FIG. 9H]
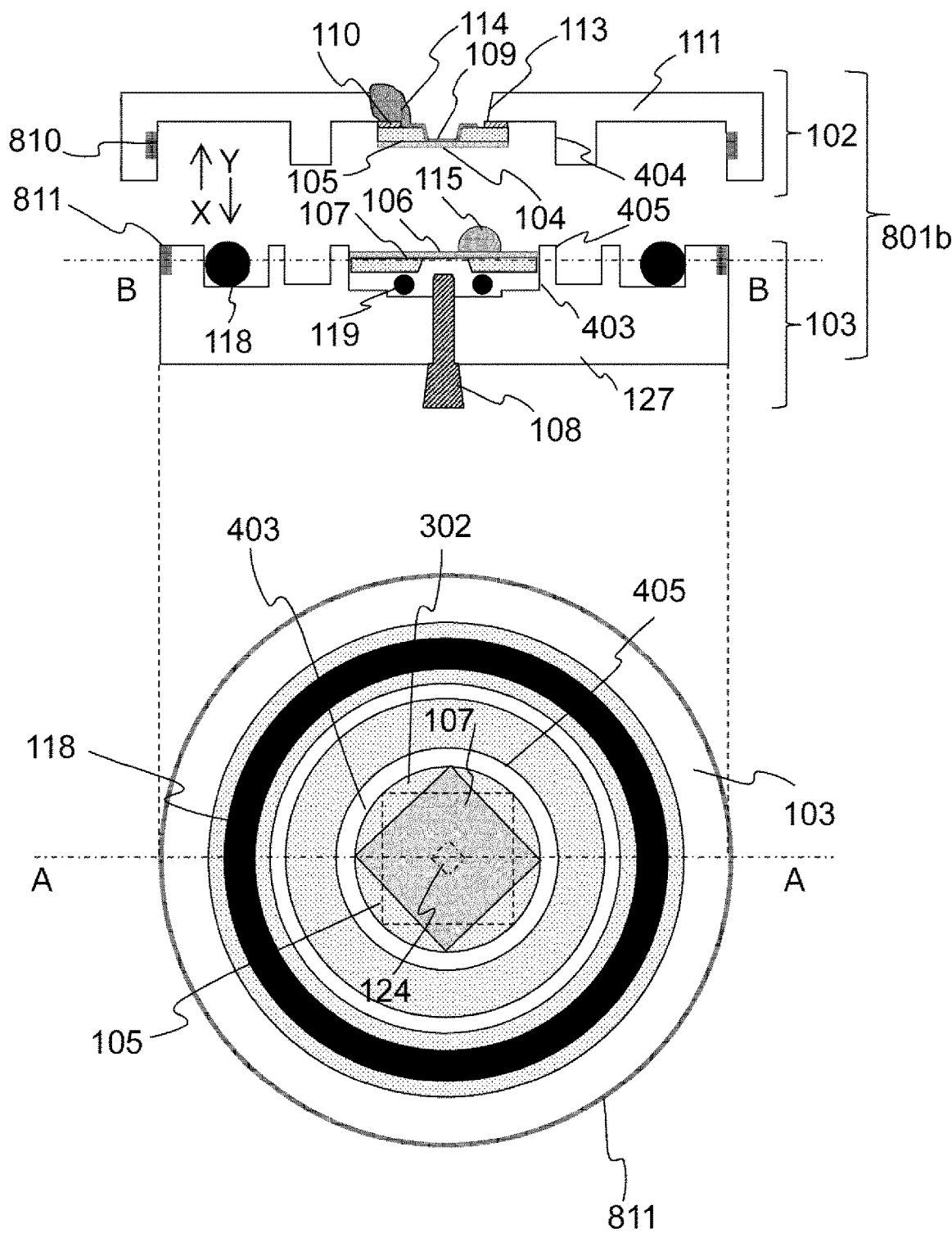

[FIG. 9I]
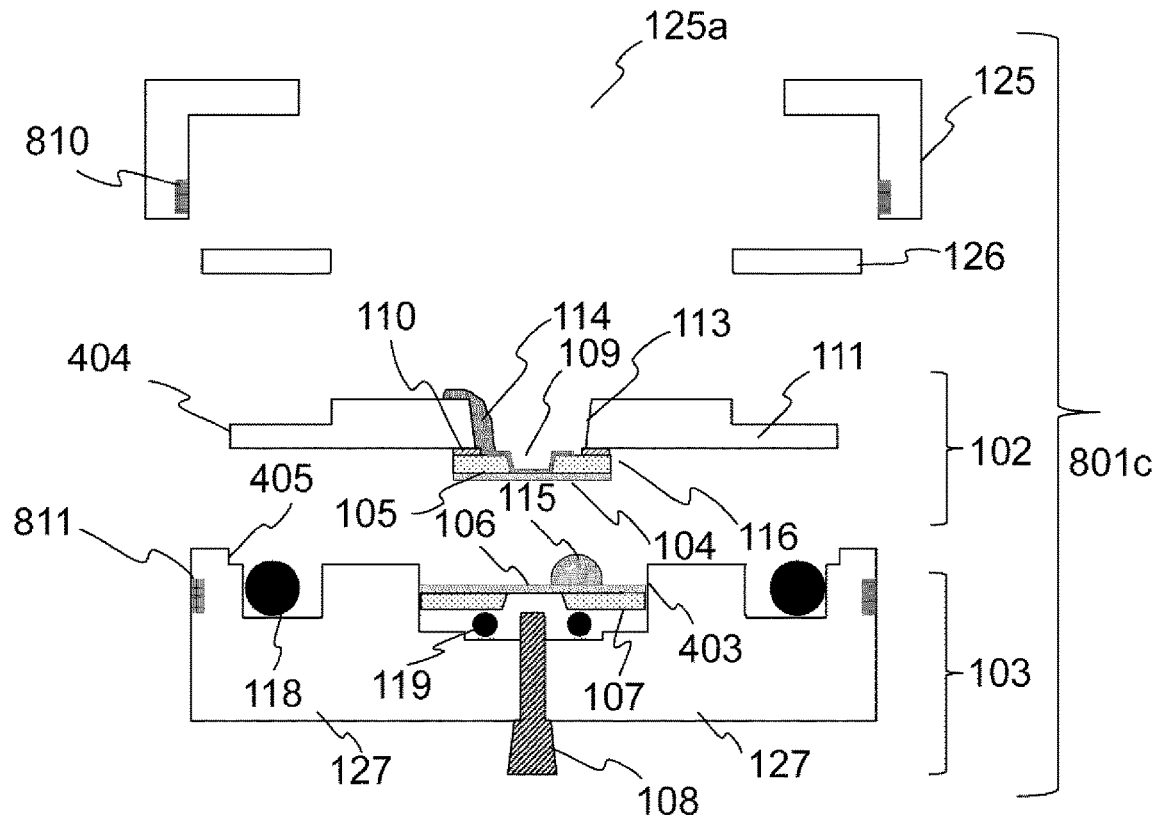
[FIG. 9J]
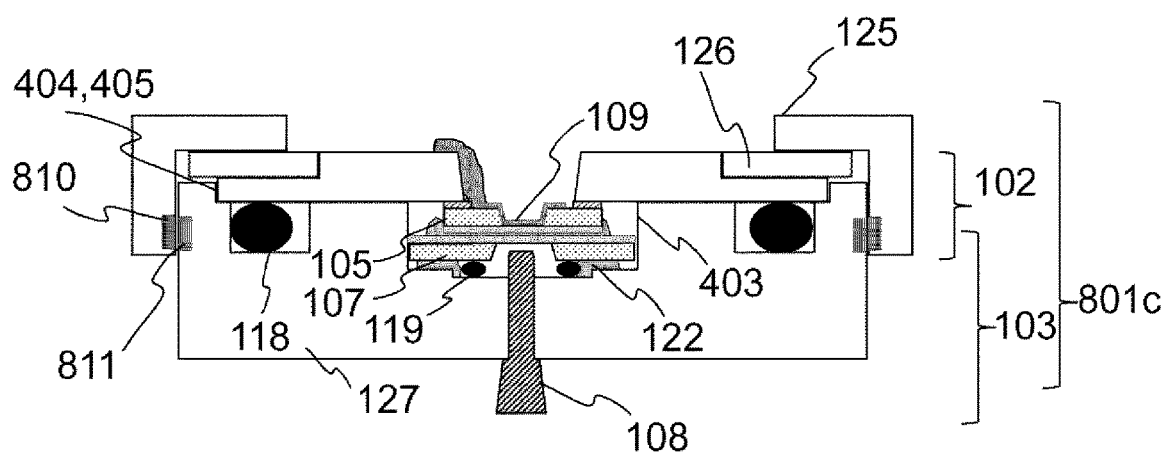

[FIG. 10A]
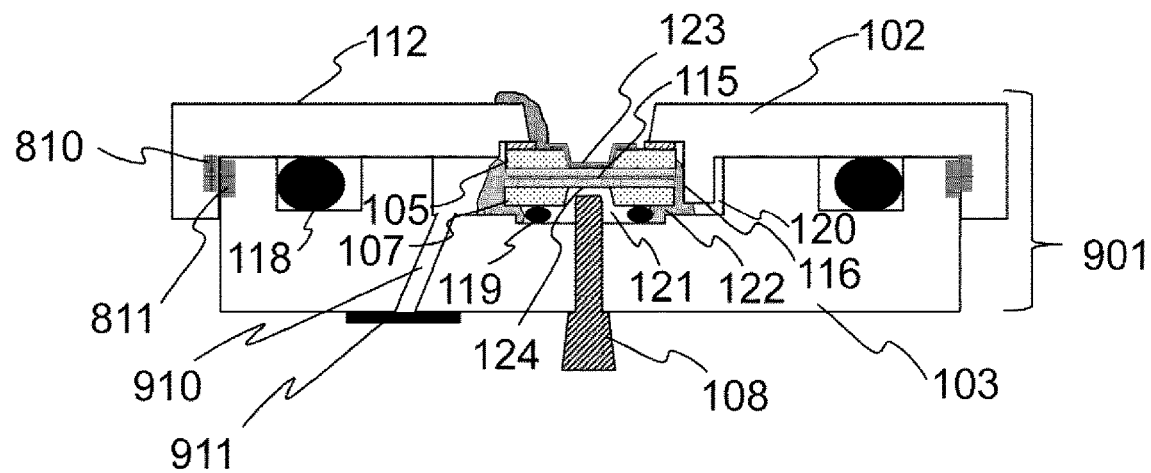
[FIG. 10B]
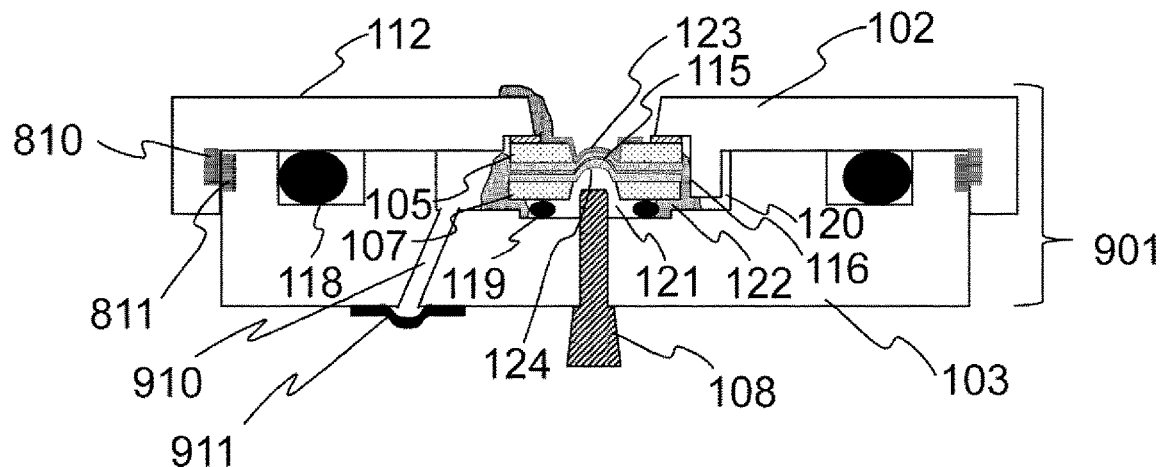

[FIG. 11A]
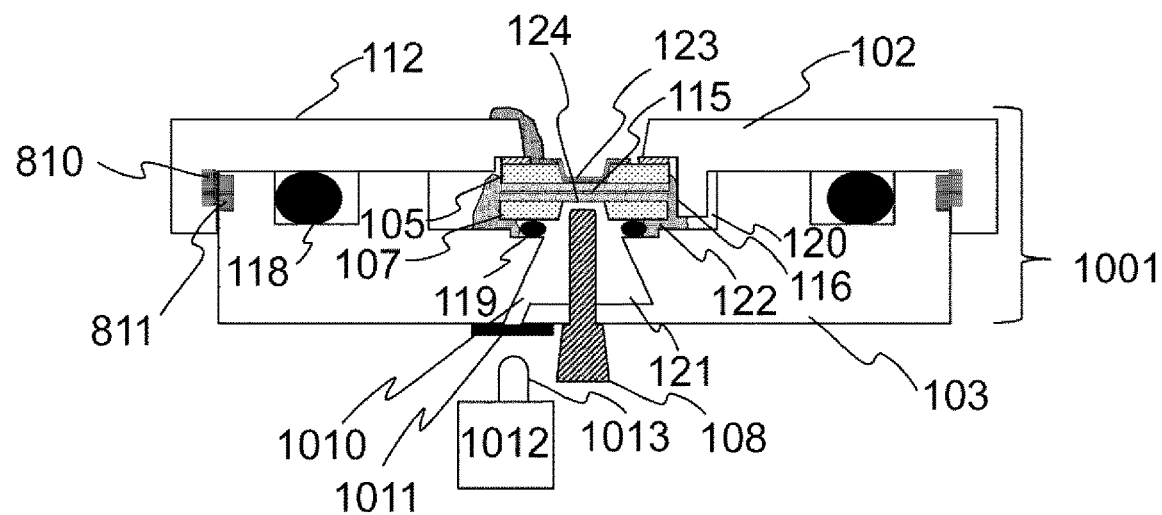
[FIG. 11B]
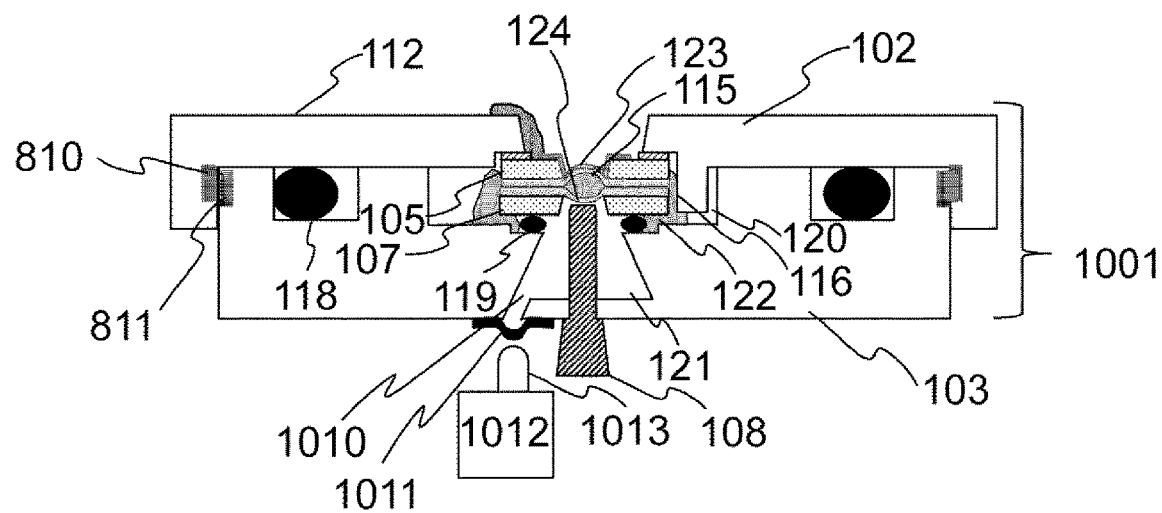

[FIG. 11C]
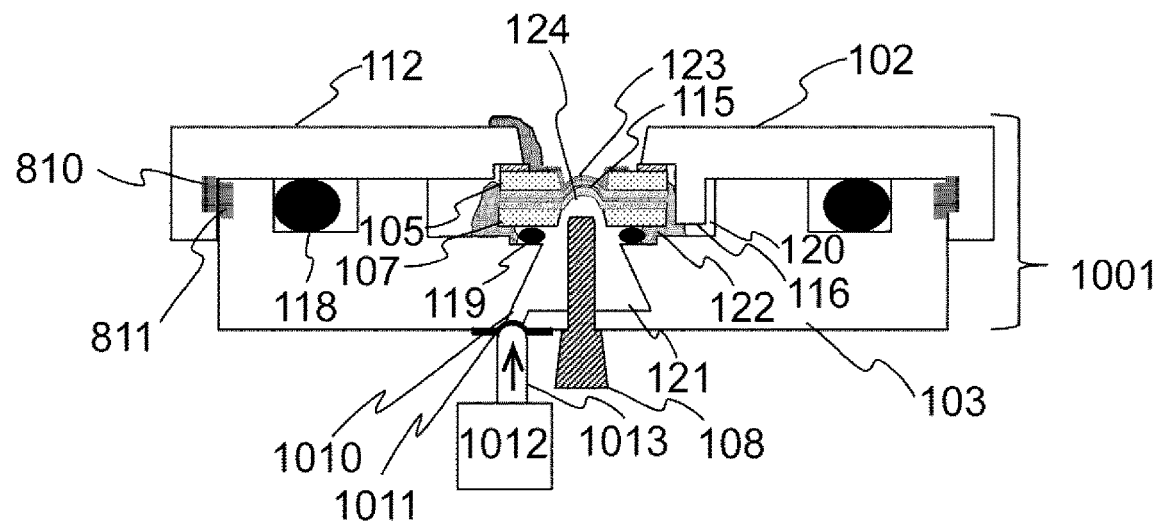
[FIG. 12]
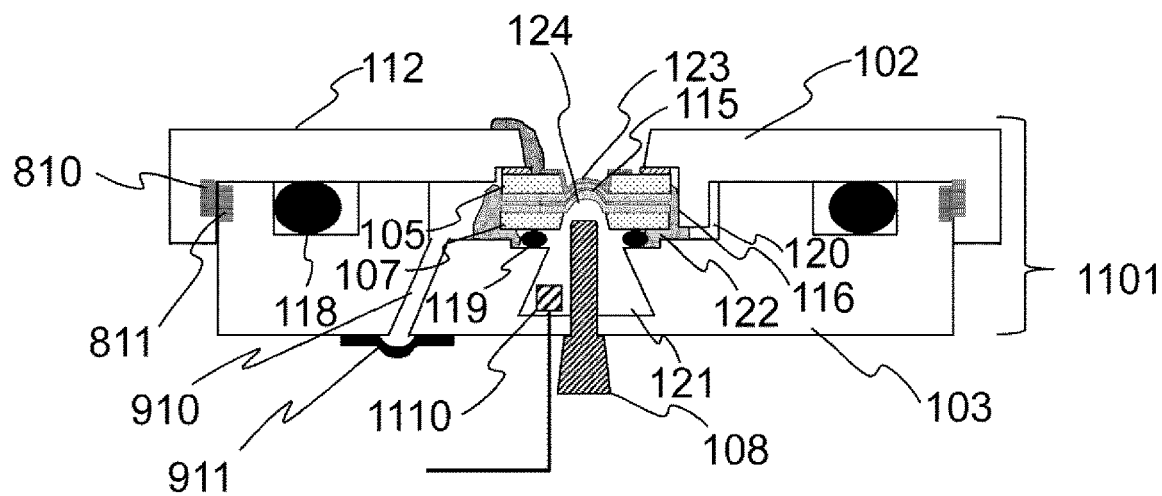

[FIG. 13]
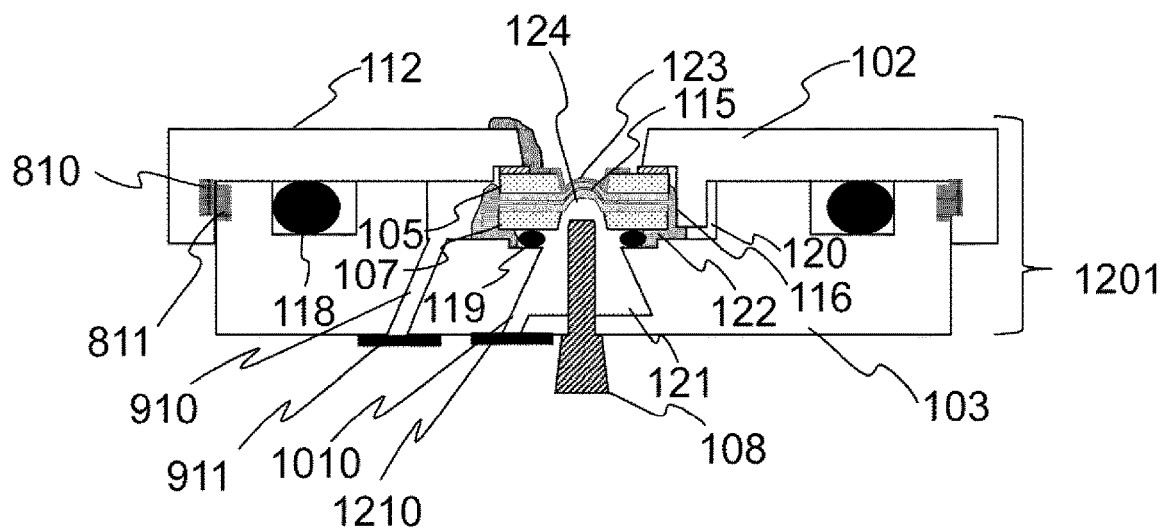
[FIG. 14A]
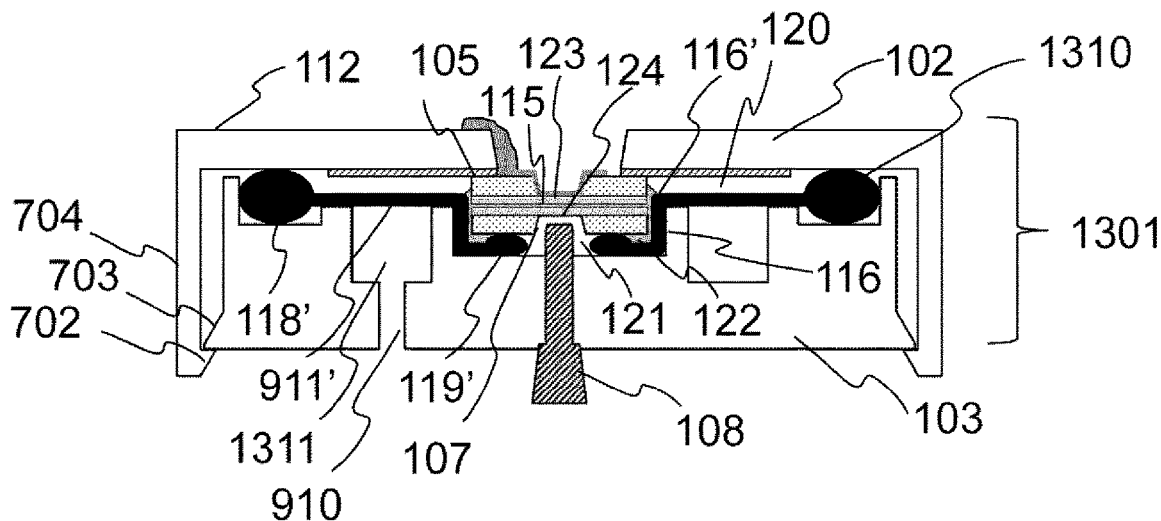

[FIG. 14B]
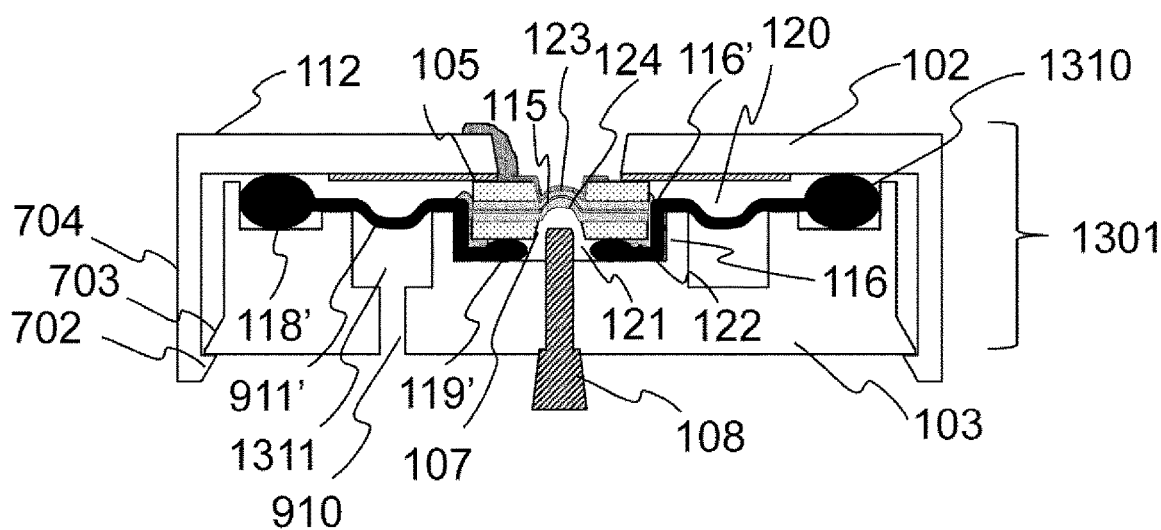

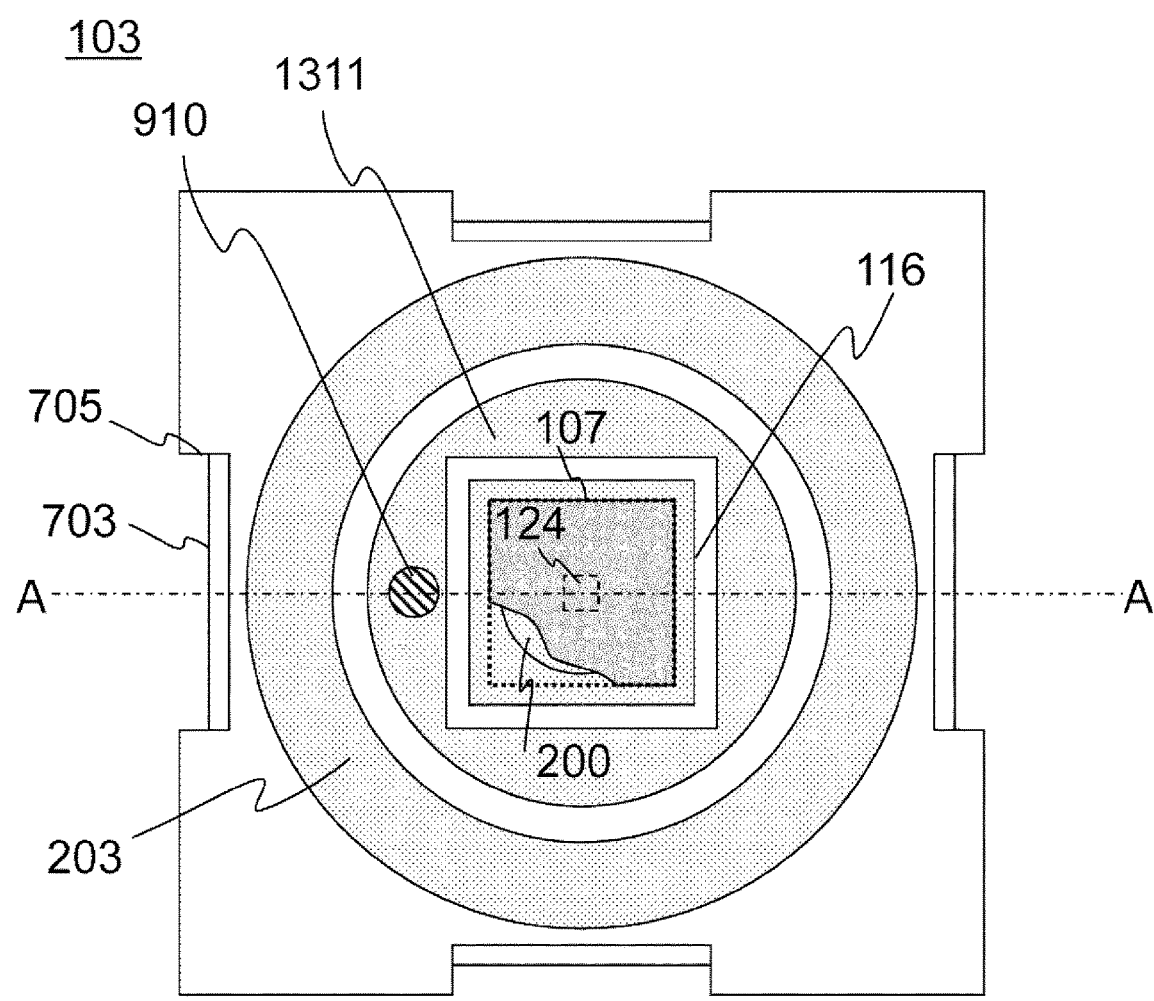
[FIG. 14C]

[FIG. 15]
A-A
CROSS-
SECTIONAL VIEW
C-C
PLAN VIEW
D-D
PLAN VIEW
E-E
PLAN VIEW
F-F
PLAN VIEW
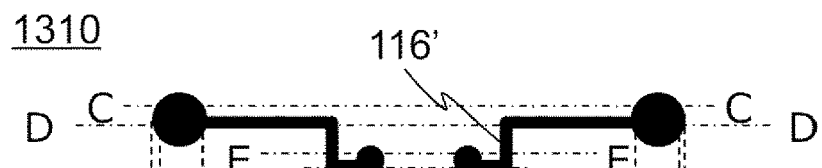
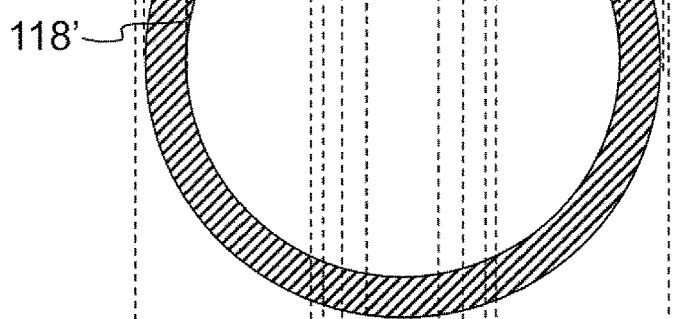
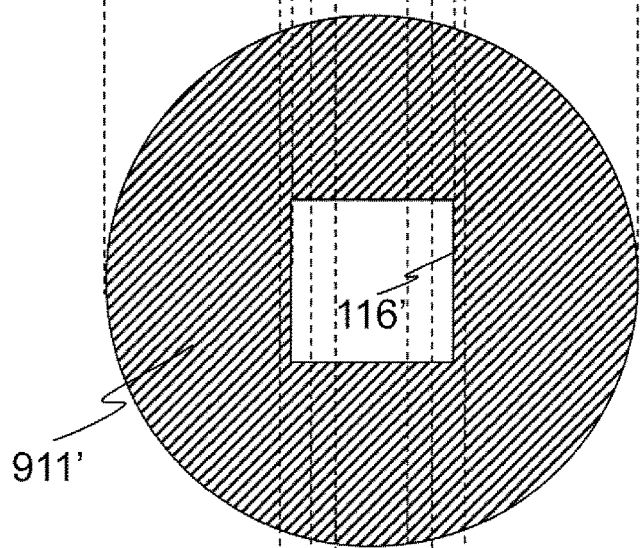
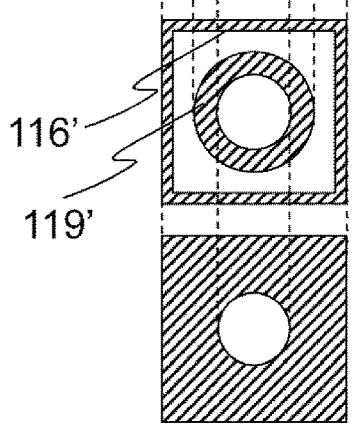
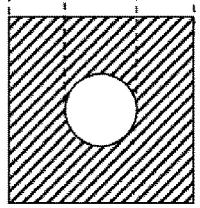

[FIG. 16A]
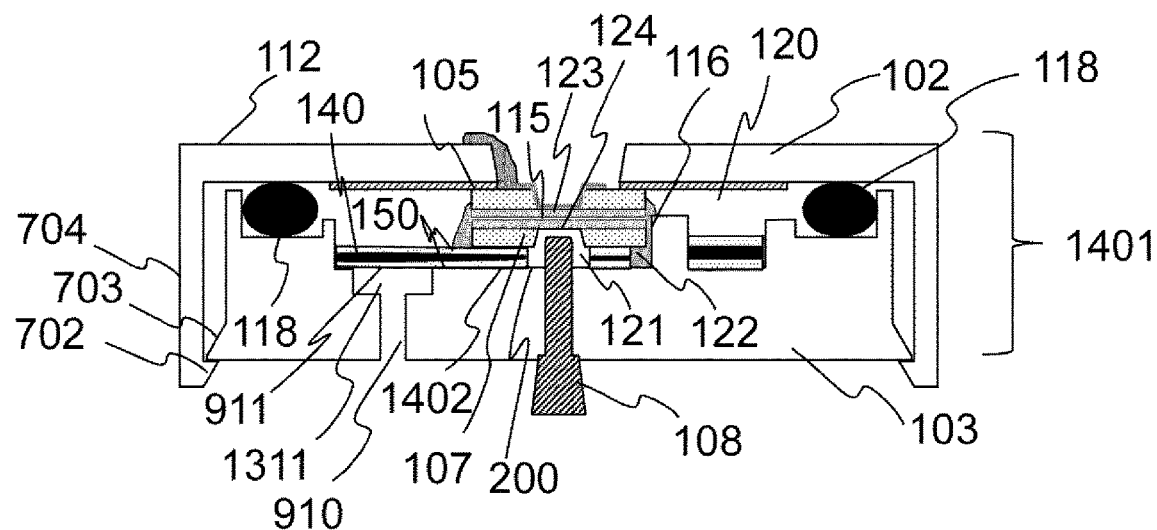
[FIG. 16B]
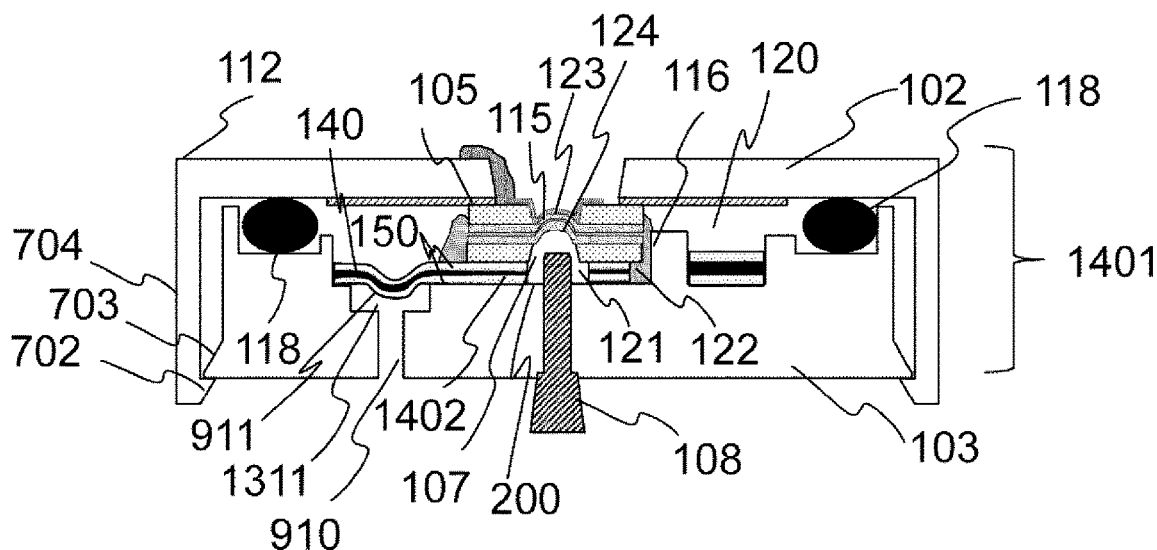

[FIG. 16C]
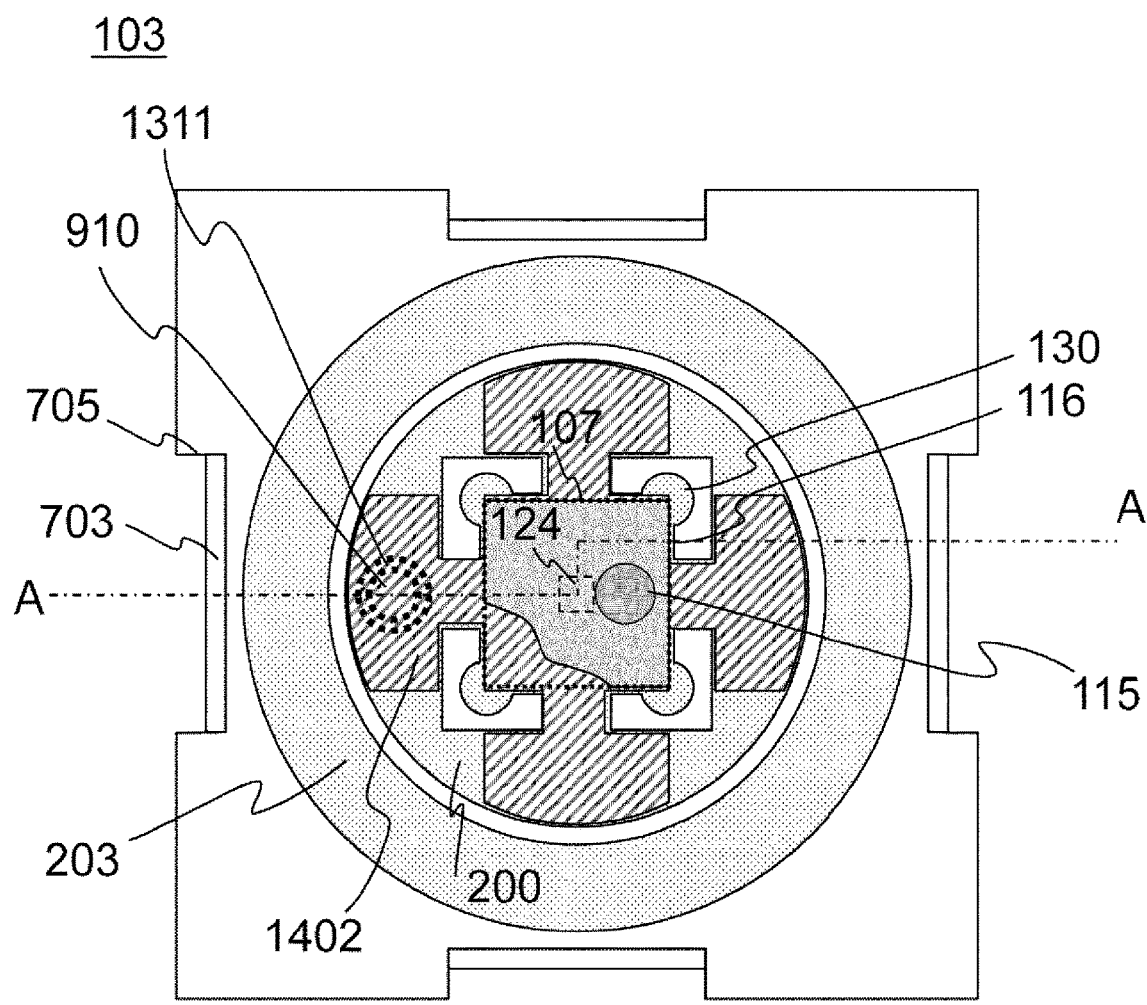

[FIG. 17]
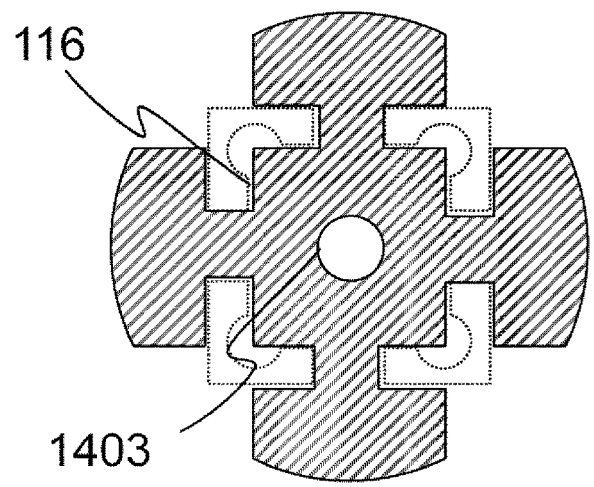
[FIG. 18]
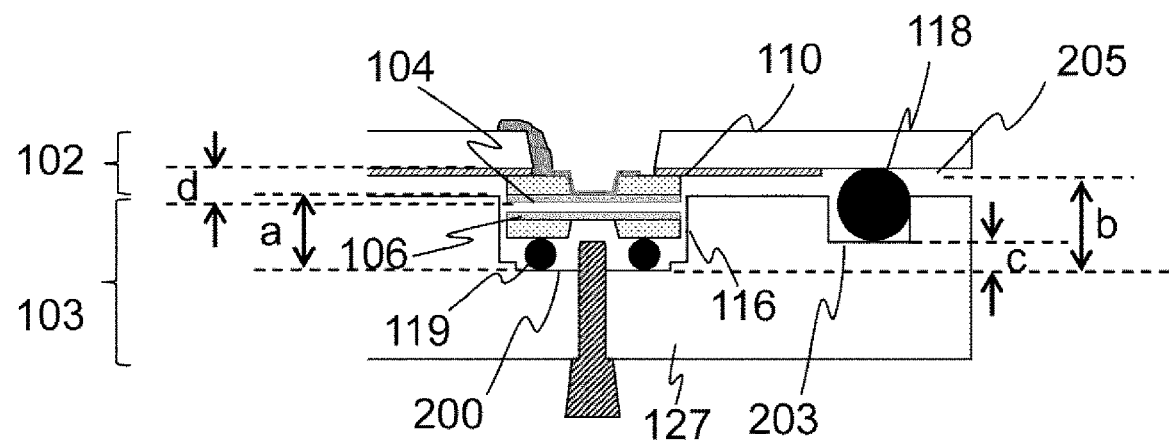

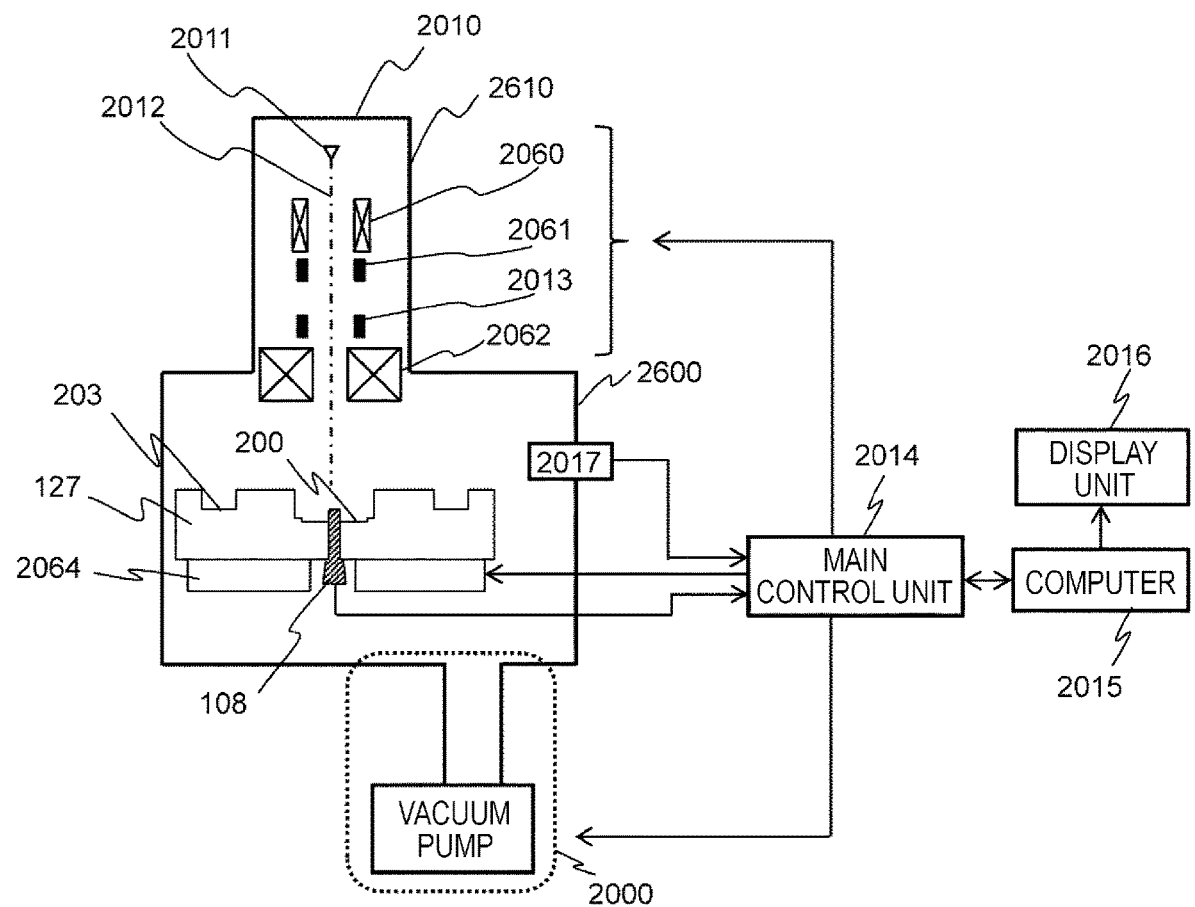
[FIG. 19]

SAMPLE HOLDER, INTERMEMBRANE DISTANCE ADJUSTMENT MECHANISM, AND CHARGED PARTICLE BEAM DEVICE

TECHNICAL FIELD

The present invention relates to a sample holder for a charged particle beam device for observing, for example, the shape or material of a sample using a detection signal resulting from charged particle beam irradiation. More specifically, the present invention relates to a sample holder for a charged particle beam device with which a liquid or gel sample can be observed in a non-invasive state.

BACKGROUND ART

Scanning electron microscopes (SEM), which are charged particle beam devices, are widely used as tools for observing not only material samples (e.g. metal and ceramics) but also biological samples with high resolution.

Generally, in these devices, sample imaging is performed with evacuation performed on a housing and a sample disposed in the vacuum atmosphere. An electron beam is scattered by liquid molecules and gas molecules such as atmospheric, and thus it is preferable to keep a path for electron beam passage in a vacuum atmosphere. A biochemical or liquid sample in a vacuum atmosphere is damaged or undergoes a change in state, and thus it is difficult to observe the sample in a non-invasive state. However, there is a great need for non-invasive sample observation and, in recent years, electron microscopes have been developed for target sample observation in an atmospheric pressure or submerged environment.

As for the observation systems disclosed in JP-A-2014-203733 (PTL 1) and JP-A-2016-072184 (PTL 2), in a first insulating thin film, one main surface is a holding surface for an observation sample and the other main surface is provided with a laminated conductive thin film, and an electron beam is emitted from the conductive thin film side with a ground potential or a predetermined bias voltage applied to the conductive thin film. The electron beam irradiation results in a local change in potential on the one main surface of the first insulating thin film. A signal based on this change in potential is detected by a detection electrode provided below a second insulating thin film disposed on the opposite side across the observation sample.

The signal based on the change in potential in the first insulating thin film and detected by the detection electrode propagates through the observation sample. At this time, the propagation force of the signal differs depending on the observation sample. For example, water has a high relative permittivity of approximately 80 and propagates the signal well whereas a biological sample has a low relative permittivity of approximately 2 to 3 and a low signal propagation force. Accordingly, based on the difference in strength of a potential change signal propagated through an observation sample, it is possible to observe the biological sample in an aqueous solution with high contrast and without staining or immobilization. This method is suitable for undamaged submerged biological sample observation as no high-energy electron beam needs to be directly applied to the sample to be observed.

Disclosed in JP-A-2013-535795 (PTL 3) are, for an SEM using an existing TEM-type holder and an existing stage, as well as a transmission electronmicroscope (TEM) and a scanning transmission electronmicroscope (STEM) for observing a sample by transmitting an electron beam as a probe and detecting electrons after the transmission, a sample holder in which a liquid or gas sample is sandwiched between two microelectronic devices provided with thin film-shaped windows capable of electron beam transmission and held in a vacuum.

CITATION LIST

Patent Literature

PTL 1: JP-A-2014-203733
PTL 2: JP-A-2016-072184
PTL 3: JP-A-2013-535795

SUMMARY OF INVENTION

Technical Problem

As for the sample holder disclosed in PTL 1 or PTL 2, an aqueous solution containing a sample (liquid sample) or a gel containing a sample (gel sample) is attached to the first or second insulating thin film fixed to a frame portion provided for the purpose of strength maintenance or the like. Then, the sample holder is created by the insulating thin films being fixed so as to face each other for sandwiching. Alternatively, the first and second insulating thin films are fixed in advance so as to face each other, an aqueous solution perfusion mechanism is provided in a gap between the insulating thin films, and a liquid sample is introduced into the gap.

The inventors have conducted studies and found that the former method is superior in terms of versatility and, in observing a high-viscosity gel sample by the latter method, it is difficult to introduce the sample between the insulating thin films, a load at least equal to a withstand pressure is applied to the insulating thin film, and film cracking may arise. Hereinafter, unless the gel and liquid samples are particularly distinguished, the gel sample is also referred to as the liquid sample.

As for a sample holder for the observation systems disclosed in PTL 1 and PTL 2, it is important that the liquid sample that leaks out from between the insulating thin films does not come into contact with the electrode positioned directly below the insulating thin film when sandwitching and fixing the liquid sample with the insulating thin films facing each other. In the event of contact between the electrode and the liquid sample that leaks out, a leakage current at least equal to an electric signal that gives the contrast of the sample image flows, and then the sample cannot be observed.

In many cases, an insulating thin film window as an observation target region is, for example, a rectangle where one side is 500 μm or less so that strength of the insulating thin film is ensured. The observable region is a region where the windows of the first and second insulating thin films overlap, and thus alignment between the insulating thin films is important. Further, it is important to expedite sample sealing in the case of high-volatility liquid samples in particular.

As described above, the sample holder is required to incorporate a brittle material such as the insulating thin film and enable a quick and precise alignment. Also required is a low-cost structure that is as simple as possible and meets the above requirements. Accordingly, the inventors have studied sample holder configurations that can achieve both functional and cost aspects.

The sample holder disclosed in PTL 3 is similar in shape to the sample holder of the present invention. However, as for the sample holder disclosed PTL 3, two microelectronic devices are pre-stored in the main body of the holder and fixed by a holder lid before liquid or gas sample introduction between the thin films. This is different from the present invention, which is on the premise that sample introduction precedes sealing.

Solution to Problem

A sample holder according to one embodiment of the present invention holding a liquid or gel sample includes: a first member that includes a lid member having an opening portion and being made of metal or covered with a metal film on at least an electron beam irradiation surface and a side surface of the opening portion, and a first chip provided with a first window where a laminated film of a conductive thin film and a first insulating thin film is formed and held on a surface of the lid member facing the electron beam irradiation surface such that the conductive thin film is exposed from the opening portion of the lid member; and a second member that includes a first seal material, a second seal material, a base material having a first bottom seal surface where the first seal material is disposed and a second bottom seal surface where the second seal material is disposed, an electrode disposed on the base material, and a second chip provided with a second window where a second insulating thin film is formed and held on the second bottom seal surface via the second seal material such that the second window faces the electrode, in which the conductive thin film of the first chip and the metal of the lid member are electrically conductive, and a region inside the first seal material is maintained airtightly from a region outside the first seal material by the first member and the second member being combined and the first seal material being crushed between the first bottom seal surface and an upper seal surface of the lid member.

Advantageous Effects of Invention

A sample holder reliably holds a liquid or gel sample, and the yield of observation with a charged particle beam device is improved.

Other issues and novel features will become apparent from the description and accompanying drawings in the present specification.

BRIEF DESCRIPTION OF DRAWINGS

FIG. 1A is a configuration diagram of a sample holder (first configuration example).
FIG. 1B is the configuration diagram of the sample holder (first configuration example).
FIG. 1C is the configuration diagram of the sample holder (first configuration example).
FIG. 1D is a configuration diagram of a first member of the sample holder (first configuration example).
FIG. 1E is a configuration diagram of a second member of the sample holder (first configuration example).
FIG. 1F is the configuration diagram of the sample holder (first configuration example).
FIG. 1G is the configuration diagram of the sample holder (first configuration example).
FIG. 2A is the configuration diagram of the sample holder (first configuration example).
FIG. 2B is the configuration diagram of the sample holder (first configuration example).
FIG. 2C is the configuration diagram of the sample holder (first configuration example).
FIG. 3 is a diagram for describing a first design guideline for the sample holder.
FIG. 4A is a configuration diagram of a sample holder (second configuration example).
FIG. 4B is the configuration diagram of the sample holder (second configuration example).
FIG. 4C is a configuration diagram of a first member of the sample holder (second configuration example).
FIG. 4D is a configuration diagram of a second member of the sample holder (second configuration example).
FIG. 5A is a configuration diagram of a sample holder (third configuration example).
FIG. 5B is the configuration diagram of the sample holder (third configuration example).
FIG. 5C is a configuration diagram of a first member of the sample holder (third configuration example).
FIG. 5D is a configuration diagram of a second member of the sample holder (third configuration example).
FIG. 5E is the configuration diagram of the sample holder (third configuration example).
FIG. 6A is a configuration diagram of a sample holder (fourth configuration example).
FIG. 6B is the configuration diagram of the sample holder (fourth configuration example).
FIG. 6C is a configuration diagram of a first member of the sample holder (fourth configuration example).
FIG. 7A is a configuration diagram of a sample holder (fifth configuration example).
FIG. 7B is the configuration diagram of the sample holder (fifth configuration example).
FIG. 7C is a configuration diagram of a second member of the sample holder (fifth configuration example).
FIG. 8A is a configuration diagram of a sample holder (sixth configuration example).
FIG. 8B is the configuration diagram of the sample holder (sixth configuration example).
FIG. 8C is the configuration diagram of the sample holder (sixth configuration example).
FIG. 8D is the configuration diagram of the sample holder (sixth configuration example).
FIG. 8E is a configuration diagram of a first member of the sample holder (sixth configuration example).
FIG. 8F is a configuration diagram of a second member of the sample holder (sixth configuration example).
FIG. 9A is a configuration diagram of a sample holder (seventh configuration example).
FIG. 9B is the configuration diagram of the sample holder (seventh configuration example).
FIG. 9C is the configuration diagram of the sample holder (seventh configuration example).
FIG. 9D is the configuration diagram of the sample holder (seventh configuration example).
FIG. 9E is the configuration diagram of the sample holder (seventh configuration example).
FIG. 9F is a configuration diagram of a first member of the sample holder (seventh configuration example).
FIG. 9G is a configuration diagram of a second member of the sample holder (seventh configuration example).
FIG. 9H is a configuration diagram of a sample holder (first modification example of seventh configuration example).

FIG. 9I is a configuration diagram of a sample holder (second modification example of seventh configuration example).

FIG. 9J is the configuration diagram of the sample holder (second modification example of seventh configuration example).

FIG. 10A is a configuration diagram of a sample holder (eighth configuration example).

FIG. 10B is the configuration diagram of the sample holder (eighth configuration example).

FIG. 11A is a configuration diagram of a sample holder (ninth configuration example).

FIG. 11B is the configuration diagram of the sample holder (ninth configuration example).

FIG. 11C is the configuration diagram of the sample holder (ninth configuration example).

FIG. 12 is a configuration diagram of a sample holder (tenth configuration example).

FIG. 13 is a configuration diagram of a sample holder (eleventh configuration example).

FIG. 14A is a configuration diagram of a sample holder (twelfth configuration example).

FIG. 14B is the configuration diagram of the sample holder (twelfth configuration example).

FIG. 14C is a configuration diagram of a second member of the sample holder (twelfth configuration example).

FIG. 15 is a shape of a depressurization film-given seal material (schematic diagram).

FIG. 16A is a configuration diagram of a sample holder (thirteenth configuration example).

FIG. 16B is the configuration diagram of the sample holder (thirteenth configuration example).

FIG. 16C is a configuration diagram of a second member of the sample holder (thirteenth configuration example).

FIG. 17 is a shape of a depressurization film-functional sheet-shaped seal material (schematic diagram).

FIG. 18 is a diagram for describing a second design guideline for the sample holder.

FIG. 19 is a configuration diagram of a charged particle beam device.

DESCRIPTION OF EMBODIMENTS

Hereinafter, an embodiment of the present invention will be described with reference to the drawings.

Example 1

FIGS. 1A to 1E illustrate a configuration example (first configuration example) of a sample holder 101 according to Example 1. The sample holder 101 has a first member 102 and a second member 103. FIG. 1A is a top view in which an electron beam irradiation surface 112 of the sample holder 101 is viewed from above. FIG. 1B is a cross-sectional view in which the first member 102 and the second member 103 are separated from each other in A-A in FIG. 1A. FIG. 1C is a cross-sectional view in which the first member 102 and the second member 103 are combined in the same line A-A. The sample holder 101 is mounted in a sample chamber of an electron microscope kept in a vacuum environment in a state where the first member 102 and the second member 103 in FIG. 1C are combined and is used for observation with the electron microscope. In addition, FIG. 1D is a diagram in which the first member 102 is viewed from the X direction in FIG. 1B, that is, a diagram in which the first member 102 is viewed from below from the side opposite to an electron beam irradiation direction. FIG. 1E is a diagram in which the second member 103 is viewed from the Y direction in FIG. 1B, that is, a diagram in which the second member 103 is viewed from above from the electron beam irradiation direction. In the illustration of FIG. 1E, a second chip 107 is partially cut out so that the structure can be understood with ease. The actual shape of the second chip 107 is the dotted-line rectangle in FIG. 1E. In addition, a first seal material 118 and a second seal material 119 are not illustrated in FIG. 1E. Although the outer peripheral shapes of the first member 102 and the second member 103 are rectangular in this example, the shapes are not limited thereto and may be, for example, polygonal or circular. The same applies to the following examples.

Hereinafter, the sample holder 101 will be described in detail. The first member 102 of the sample holder 101 has a lid member 111 and a first chip 105 as main configurations, and the first chip 105 is held on the surface of the lid member 111 that is opposite to the electron beam irradiation surface 112. The first chip 105 is a diced chip and includes an electron beam irradiation window 123 where an insulating thin film 104 for outside atmosphere isolation is formed. A silicon nitride film, a silicon oxide film, a carbon film, and a polyimide film can be exemplified as the insulating thin film 104. A conductive thin film 109 is formed on the electron beam irradiation surface side of the first chip 105, and a laminated film of the conductive thin film 109 and the insulating thin film 104 is formed in the window 123. A metal thin film containing any of tantalum, tungsten, rhenium, molybdenum, osmium, gold, and platinum as a main component can be exemplified as the conductive thin film 109.

The first chip 105 is aligned such that the center of the electron beam irradiation window 123 coincides with the center of the opening portion of the lid member 111, and the side where the conductive thin film 109 is formed is fixed to the back surface of the lid member 111 by a fixing seal material 110. The fixing seal material 110 fixes the first chip 105 and has a vacuum seal function of sealing the periphery of a liquid sample 115 from the vacuum atmosphere of the sample chamber to an atmospheric pressure or a quasi-atmospheric pressure state when the observation with the electron microscope is performed. A double-sided tape made of a Si-based adhesive material or the like can be used as the fixing seal material 110. The double-sided tape made of the Si-based adhesive material has a uniform surface and thus has an excellent vacuum seal function.

The lid member 111 may be metallic or may be made of a resin material coated with a metal film by, for example, metal plating at a part or on the entire surface. In a case where metal plating is applied to the resin material, it is preferable that at least the electron beam irradiation surface 112 of the lid member 111 and an inclined surface (side surface of opening portion) 113 of the lid member are metal-plated so that a charging phenomenon entailed by electron beam irradiation is suppressed. In addition, the electron beam irradiation surface 112 of the lid member 111 and the conductive thin film 109 of the first chip 105 are treated for electrical conduction with a conductive paste 114. However, an electrical conduction means for the electron beam irradiation surface 112 and the conductive thin film 109 is not limited to the conductive paste. When the observation with the electron microscope is performed, a bias voltage is applied to the conductive thin film 109 of the first chip 105. Accordingly, a bias voltage is applied to the electron beam irradiation surface 112 of the lid member 111 by a voltage supply means (not illustrated). The electrical conduction between the electron beam irradiation surface 112 and the conductive thin film 109 makes it possible to apply a bias voltage to the conductive thin film 109.

A base material 127 of the second member 103 of the sample holder 101 is formed of an insulator. If necessary, the surface of the base material 127 may be metal-plated. However, in that case, an electrode 108 of the second member 103 and the electron beam irradiation surface 112 of the first member 102 need to be insulated from each other with the first member 102 and the second member 103 combined such that the leakage current attributable to the bias voltage applied to the conductive thin film 109 during the observation with the electron microscope does not flow into the electrode 108.

The second member 103 includes, as main configurations, the base material 127, the second chip 107 provided with a signal transmission window 124 where an insulating thin film 106 for outside atmosphere isolation is formed, the electrode 108 disposed on the base material 127 so as not to come into contact with the second chip 107, the first seal material 118, and the second seal material 119. When the observation with the electron microscope is performed, the electrode 108 is connected to a signal amplification means (not illustrated). A film exemplified as the insulating thin film 104 can be used as the insulating thin film 106.

The base material 127 is provided with an alignment guide 116 for the second chip 107. Specifically, a recessed portion is provided in the middle portion of the base material 127, and the side wall of the recessed portion functions as the guide 116. The second chip 107 fits into the guide 116 provided on the base material 127 and is placed in contact with the second seal material 119. The center of the electrode 108 is aligned so as to coincide with the center of the guide 116. By the second chip 107 fitting into the guide 116, the center of the signal transmission window 124 of the second chip 107 is aligned so as to coincide with the center of the guide 116. With such a configuration, the center of the signal transmission window 124 and the center of the electrode 108 are aligned so as to coincide with each other. As illustrated in FIG. 1C, the first seal material 118 and the second seal material 119 are deformed so as to be crushed by pressing the first member 102 and the second member 103 against each other and the two (upper and lower) or three (upper, lower, and side) surfaces in contact with the first member 102 and the second member 103 are sealed.

Specifically, the first seal material 118 is crushed at least between a first bottom seal surface 203 formed on the base material 127 and an upper seal surface 205 of the lid member 111 and a first space 120 into which the second chip 107 is fitted is sealed from the outside atmosphere. The second seal material 119 is crushed at least between a second bottom seal surface 200 formed on the base material 127 and the bottom surface of the second chip 107, and a second space 121 where the tip portion of the electrode 108 is disposed is sealed from the first space 120 around the second space 121. The second space 121 is formed by being surrounded by the bottom surface of the second chip 107, the second bottom seal surface 200 of the base material 127, and the second seal material 119.

In the sample holder 101 illustrated in FIGS. 1A to 1E, O-rings are used as the first seal material 118 and the second seal material 119. On the other hand, an example of a sample holder in which an O-ring is used as the first seal material 118 and a double-sided tape is used as the second seal material 119 is illustrated in FIGS. 1F to 1G. The top view in which the electron beam irradiation surface 112 of the sample holder 101 is viewed from above is the same as FIG. 1A, and FIGS. 1F to 1G are cross-sectional views taken along line A-A in FIG. 1A.

In the sample holder 101 illustrated in FIGS. 1F to 1G, a double-sided tape having a structure in which a Si rubber sheet 140 is sandwiched between Si-based adhesive material sheets 150 having uniform surfaces on both surfaces can be used as the second seal material 119. In this case, the Si rubber sheet 140 is crushed as illustrated in FIG. 1G by pressing the first member 102 and the second member 103 against each other, and thus the second space 121 where the electrode 108 is disposed is sealed from the first space 120. In the following embodiment, the second seal material 119 may be an O-ring or a double-sided tape unless otherwise specified. By using a double-sided tape, the second chip 107 can be fixed to the base material 127, which leads to the advantage that it is possible to reduce the risk of the second chip 107 coming off the base material 127 when, for example, an impact is applied to the second member 103 by mistake.

Subsequently, placing a sample on the sample holder 101 and the sample becoming observable with the electron microscope will be described.

The first is the state illustrated in FIG. 1B. Those by which the first member 102 is configured and those by which the second member 103 is configured are not in contact with each other at all. In this state, the liquid sample 115 is attached with, for example, a micropipette to the insulating thin film 106 surface of the second chip 107 placed in the guide 116 of the base material 127. The surface where the liquid sample 115 is attached may be on the insulating thin film 104 of the first chip 105 of the first member 102. Subsequently, the first member 102 is brought closer to the second member 103 manually or automatically (e.g. by a robot).

FIG. 2A illustrates a state where the insulating thin film 104 of the first member 102 is in contact with the liquid sample 115. In this state, the first chip 105 begins to fit into the guide 116 of the second member 103 and the first chip 105 and the second chip 107 are aligned with each other. By fitting the first chip 105 into the guide 116, the center of the lid member 111, the center of the electron beam irradiation window 123 of the first chip 105, the center of the signal transmission window 124 of the second chip 107, and the center of the electrode 108 are aligned so as to coincide with each other. In this state, the first seal material 118 is not in contact with the first member 102 and the first seal material 118 is not deformed. Meanwhile, the second seal material 119 begins to be deformed so as to be crushed by a force of pushing down being applied via the liquid sample 115. FIG. 2C is an example in which the amount of the liquid sample 115 is extremely small. In this example, the liquid sample 115 is not in contact with the insulating thin film 104 of the first chip 105 and a force pushing down the second chip 107 does not act at the timing when the first chip 105 begins to fit into the guide 116 of the second member 103 and the first chip 105 and the second chip 107 are aligned with each other. Accordingly, when the first chip 105 and the second chip 107 are aligned in the case of FIG. 2C, the first seal material 118 is not yet to be deformed and the second seal material 119 is not yet to be deformed.

Although the guide 116 is provided as a guide for aligning the second chip 107 with respect to the base material 127 as described above, the guide 116 simultaneously functions as a guide for aligning the first chip 105 with the second chip 107. Focusing on the function used for the alignment of the facing chips, the guide 116 is referred to as a guide for facing chips. Although the guide for facing chips may or may not be a guide for a chip to be disposed on the member (lid member or base material), it is possible to obtain high alignment precision with a simple structure by using the guide for facing chips also as a guide for the chip to be disposed on the member in a case where the first chip 105 and the second chip 107 are congruent.

It is important that the first seal material 118 is not deformed at a moment when the guide 116 aligns the first chip 105 with the second chip 107 as described above (this point is referred to as "Point 1"). When the first seal material 118 begins to be deformed at this timing, the repulsive force of the first seal material 118 trying to return to its original shape exerts a force pushing the first member 102 back to the electron beam irradiation surface 112 side. Meanwhile, on condition that the lid member 111 is opaque, it cannot be visually confirmed whether the first chip 105 is fitted into the guide 116, and thus a determination is made based on the presence or absence of resistance attributable to the first chip 105 interfering with the guide 116 when the first member 102 is pushed into the second member 103. Accordingly, it becomes difficult to recognize the presence or absence of the resistance attributable to the interference on condition that the lid member 111 is in a state of receiving the repulsive force of the first seal material 118 in the alignment stage. The first chip 105 may be damaged on condition that the first member 102 is pushed into while the first chip 105 interferes with the guide 116.

It is also important that the second seal material 119 is crushed before the first seal material 118 is crushed (this point is referred to as "Point 2"). As a result, a surplus liquid sample may leak out into the first space 120 formed by the recessed portion forming the guide 116 of the base material 127 and the first member 102 and yet does not infiltrate into the second space 121 shielded by the second seal material 119. As a result, it is possible to avoid the liquid sample coming into contact with the electrode 108.

Accordingly, it is desirable that the timing at which the second seal material 119 begins to be crushed is as early as possible and, at the initiation of the crushing of the second seal material 119 in the alignment stage, the lid member 111 receives the repulsive force of the second seal material 119. The repulsive force of the second seal material 119 is smaller than the repulsive force of the first seal material 118. In this example, it is possible to effectively suppress the occurrence of a problem by the second seal material 119 beginning to be crushed in the alignment stage in a state where the risk of the liquid sample leaking out is high as illustrated in FIG. 2A and the second seal material 119 beginning to be crushed after the alignment in a state where the risk of the liquid sample leaking out is low as illustrated in FIG. 2C.

With the first chip 105 and the second chip 107 aligned with each other by the guide 116 of the second member 103, the first member 102 is pressed against the second member 103 by, for example, a plurality of screws 117 (see FIG. 1A) or other fixing means.

The first member 102 includes through holes 128 for passing the screws 117 (see FIG. 1D). The second member 103 includes screw holes 129 (see FIG. 1E). The diameter of the through hole 128 is to be slightly larger than the nominal diameter of the screw so that errors attributable to the precision of creation of the guide 116 and the precision of alignment of the first chip 105 with respect to the first member 102 can be allowed. In this example, the first chip 105 and the second chip 107 are diced in the form of rectangles of the same size in which one side is approximately several millimeters and the guide 116 is slightly larger than the first and second chips such that both chips fit with a likelihood of approximately 100 μm or less. In addition, in this example, the guide 116 is provided with circular chip reliefs 130 at corner parts as illustrated in FIG. 1E. Although the diced chip may have a residue in a corner portion, the chip is easy to fit into the guide 116 even in such a case since the chip relief 130 is provided.

FIG. 2B is a state where screw tightening or the like is performed for an additional downward push from the state of FIG. 2A. FIG. 2B is a state immediately preceding the first member 102 beginning to deform the first seal material 118. In this state, sample leakage from first and second chip side walls may occur depending on the amount of the dripped liquid sample 115. Even in this state, the second seal material is in the process of being crushed and the second space 121 where the electrode 108 is disposed is sealed from a sample 122 that leaks from the chip side wall.

FIG. 1C is a state where the first member 102 and the second member 103 are finally combined and fixed and the observation with the electron microscope is possible. As a result of pushing down, the first member 102 and the second member 103 are stopped by contact between components other than both seal materials with both the first seal material 118 and the second seal material 119 left with a crushing margin. In this case, pushing down is stopped by contact between the fixing seal material 110 of the first member 102 and the base material 127 of the second member 103. In a case where the fixing seal material 110 has a crushing margin, the tightening strength of the screw 117 fixing the first member 102 and the second member 103 may be managed with a torque wrench or the like.

In this state, the first seal material 118 seals the first space 120 airtightly from the outside environment kept in a high vacuum atmosphere for electron beam irradiation. Meanwhile, the second seal material 119 seals the second space 121 where the electrode 108 is disposed airtightly from the surrounding first space 120. In addition, the second seal material 119 seals the second space 121 from the sample 122 that leaks out of the side walls of the first chip 105 and the second chip 107. The second chip 107 is fixed in a state where the liquid sample 115 is sandwiched and pressed against the first chip 105 by the repulsive force of the deformed second seal material 119 trying to return to its original shape.

A first design guideline for the sample holder is illustrated in FIG. 3. FIG. 3 illustrates a sample-less state where the insulating thin film 104 of the first chip 105 and the insulating thin film 106 of the second chip 107 are in surface contact with each other. Shape determination is performed using the following values defined in this state. Those in the same industry can easily guess that the design needs to be performed in view of production tolerances and the dimensions and specifications of each member such as chips and seal materials. The second bottom seal surface 200 is the reference position (0) in the following description. The positive and negative distances in the description are those from the reference position to positions above and below the reference position, respectively.

A depth a of the guide 116 is defined by the distance from the second bottom seal surface 200 to the tip of the guide 116 (upper surface of the base material 127). The depth a of the guide 116 satisfies the relationship of (Equation 1).

Guide depth $a$ > Thickness of second seal material 119 + Thickness of second chip 107     (Equation 1)

The thickness of the second seal material 119 is the diameter of the O-ring in a case where the second seal material 119 is an O-ring and the thickness of the double-sided tape in a case where the second seal material 119 is a double-sided tape. By satisfying (Equation 1), it is guaranteed that the first chip 105 is fitted into the guide 116 when the insulating thin films of the first chip 105 and the second chip 107 are in contact with each other as illustrated in FIG. 3. In other words, it is guaranteed that the surface of contact between the insulating thin film 104 and the insulating thin film 106 is positioned between the base material 127 provided with the guide for facing chips and the tip of the guide for facing chips.

In addition, a first inter-seal surface distance b defined as the distance from the upper seal surface 205 of the lid member 111 to the second bottom seal surface 200 and a second inter-seal surface distance c defined as the distance from the first bottom seal surface 203 to the second bottom seal surface 200 satisfy the relationship of (Equation 2).

ABS(first inter-seal surface distance $b$–second inter-seal surface distance $c$)>Thickness of first seal material 118  (Equation 2)

The thickness of the first seal material 118 is the diameter of the O-ring in a case where the first seal material 118 is an O-ring.

In the first configuration example, both (Equation 1) and (Equation 2) are satisfied, and thus it is possible to satisfy the condition (Point 1) that "the first seal material 118 is not deformed at the moment when the first chip 105 and the second chip 107 begin to be aligned" and the condition (Point 2) that "the second seal material 119 is crushed before the first seal material 118 is crushed".

It is required to satisfy (Equation 1) because the first configuration example has a structure in which the guide 116 for facing chips provided on the second member 103 aligns the first chip 105 with the second chip 107. In other words, this is because (Equation 1) is changed accordingly on condition that the first chip 105 and the second chip 107 are aligned by a different method. For example, although it is conceivable that the first member (e.g. lid member) is provided with the guide for facing chips, what is required in place of (Equation 1) in this case is that the height of the guide for facing chips from the surface of the lid member 111 where the first chip 105 is fixed is larger than the sum of the thickness of the fixing seal material 110 and the thickness of the first chip 105 in a sample-less state where the insulating thin film 104 of the first chip 105 and the insulating thin film 106 of the second chip 107 are in surface contact with each other. With this condition satisfied, it is guaranteed that the surface of contact between the insulating thin film 104 and the insulating thin film 106 is positioned between the lid member 111 provided with the guide for facing chips and the tip of the guide for facing chips.

FIGS. 4A to 4D illustrate a configuration example (second configuration example) of a sample holder 301 according to Example 1. The top view is the same as FIG. 1A. FIGS. 4A to 4B are cross-sectional views taken along line A-A in FIG. 1A.

In the second configuration example, the first member 102 includes a first chip guide 402 into which the first chip 105 is fitted. As a result, the first chip 105 is aligned such that the center of the electron beam irradiation window 123 comes to the center with respect to the opening portion of the lid member 111. The chip guide 402 facilitates this alignment. The first chip 105 is fixed to the lid member 111 by the fixing seal material 110. As illustrated in FIG. 4C, the guide 402 is provided with the circular chip relief 130 as in the case of the guide 116 in the first configuration example.

In addition, in the second configuration example, a liquid pool 302 is provided to store the surplus sample 122 that leaks out of the side wall between the chips. With such a configuration, the risk of the sample 122 coming into contact with the electrode 108 after leaking out can be further reduced. In the first configuration example, the guide 116 surrounds the entire circumference of the chip by the base material 127 having the columnar recessed portion. On the other hand, in the second configuration example, a recessed portion including the liquid pool 302 is provided at the middle part of the base material 127 and the guide 116 that has a plate shape is provided in the recessed portion so as to face each of the four sides of the chip as illustrated in FIGS. 4A and 4D. Such a shape is advantageous in that the base material 127 can be processed with ease.

In the second as well as first configuration example, the first member 102 and the second member 103 in the process of pushing down are stopped by contact between components other than both seal materials with both the first seal material 118 and the second seal material 119 left with a crushing margin. In this example, pushing down is stopped as a result of contact between the lid member 111 of the first member 102 and the base material 127 of the second member 103. Accordingly, on condition that the lid member 111 and the base material 127 are made of a material appropriate in terms of strength, the force that fixes the lid member 111 of the first member 102 and the base material 127 of the second member 103 does not have to be managed.

Also, in the second configuration example illustrated in FIGS. 4A to 4D, it is possible to satisfy Points 1 and 2 in the event of combination of the first member 102 and the second member 103 by satisfying (Equation 1) and (Equation 2) pertaining to the first configuration example.

FIGS. 5A to 5E illustrate a configuration example (third configuration example) of a sample holder 401 according to Example 1. The top view is the same as FIG. 1A. FIGS. 5A, 5B, and 5E are cross-sectional views taken along line A-A in FIG. 1A.

In the third as well as second configuration example, the first member 102 includes the first chip guide 402 into which the first chip 105 is fitted and the first chip 105 is aligned such that the center of the electron beam irradiation window 123 comes to the center with respect to the opening portion of the lid member 111. The first chip 105 is fixed to the lid member 111 by the fixing seal material 110. Meanwhile, the second member 103 includes a second chip guide 403 into which the second chip 107 is fitted. As a result, the second chip 107 is aligned such that the center of the signal transmission window 124 coincides with the center of the electrode 108. In this example, the first chip guide 402 is the side wall of the recessed portion provided at the middle part of the lid member 111 as illustrated in FIG. 5C and the second chip guide 403 is a plate-shaped guide provided in the recessed portion including the liquid pool 302 provided at the middle part of the base material 127 as illustrated in FIG. 5D.

In the third configuration example, each of the first member 102 and the second member 103 includes a guide for alignment such that the center of the opening portion of the lid member 111 of the first member 102 coincides with the center of the electrode 108 of the second member 103. Specifically, the first member 102 includes a second member guide 404 and the second member 103 includes a first member guide 405. In this example, the second member guide 404 is a plate-shaped guide as illustrated in FIG. 5C and the first member guide 405 is the side wall of the recessed portion including the liquid pool 302 provided at the middle part of the base material 127 as illustrated in FIG. 5D.

FIG. 5B is a state where the first member 102 is pushed down, the first member 102 and the second member 103 are combined and fixed, and the observation with the electron microscope is possible. By fitting the second member guide 404 into the first member guide 405, alignment is performed such that the center of the electron beam irradiation window 123, the center of the signal transmission window 124, and the center of the electrode 108 coincide with the center of the opening portion of the lid member 111.

In the third as well as second configuration example, the first member 102 and the second member 103 in the process of pushing down are stopped by contact between the lid member 111 of the first member 102 and the base material 127 of the second member 103 with both the first seal material 118 and the second seal material 119 left with a crushing margin.

As illustrated in FIG. 5E, in the third configuration example, the first chip 105 and the second chip 107 can be aligned insofar as the second member guide 404 and the first member guide 405 are designed to come into contact with each other before the insulating thin films of the first chip 105 and the second chip 107 come into contact with each other. In other words, the first member guide 405 and the second member guide 404 have heights at which the insulating thin film 104 of the first chip 105 and the insulating thin film 106 of the second chip 107 do not come into contact with each other when the tip of the first member guide 405 and the tip of the second member guide 404 are in contact with each other. In this configuration example, the shapes of the lid member 111 and the base material 127 are complex, and yet it is possible to reduce the risk of chip damage when the first member 102 and the second member 103 are combined.

In the third configuration example, it is further preferable that the tip of the second chip guide 403 into which the second chip 107 is fitted is positioned below the upper surface of the second chip 107 (insulating thin film 106) in a state where the first member 102 and the second member 103 are combined and fixed and the observation with the electron microscope is possible as illustrated in FIG. 5B. This is because the second chip guide 403 may interfere with the lower surface of the first chip 105 (insulating thin film 104) and damage the first chip 105 in a case where there is a slight misalignment between the first chip 105 and the second chip 107 due to a manufacturing error or the like in the process of pushing down the first member 102 with the tip of the second chip guide 403 positioned above the upper surface of the second chip 107 (insulating thin film 106). For the same reason, it is preferable that the lower end of the first chip guide 402 into which the first chip 105 is fitted (equal to the lower surface of the lid member 111 in this case) is positioned above the lower surface of the first chip 105 (insulating thin film 104).

The shapes of the first chip guide 402, the second chip guide 403, the second member guide 404, and the first member guide 405 are not limited to those illustrated in FIGS. 5A to 5E. Any shape may be used insofar as the above functions are satisfied.

FIGS. 6A to 6C illustrate a configuration example (fourth configuration example) of a sample holder 501 according to Example 1. The top view is the same as FIG. 1A except that an electrical conduction means for the conductive thin film 109 of the first chip 105 and the electron beam irradiation surface 112 of the lid member 111, which will be described later, is different. Each of FIGS. 6A to 6B is a cross-sectional view at a part corresponding to line A-A in FIG. 1A. FIG. 6C is a diagram in which the first member 102 is viewed from the X direction in FIG. 6A, that is, a diagram in which the first member 102 is viewed from below from the side opposite to the electron beam irradiation direction.

In the fourth configuration example, the first chip 105 is larger than the second chip 107. In addition, the first member 102 includes the first chip guide 402 into which the first chip 105 is fitted and the first chip 105 is aligned such that the center of the electron beam irradiation window 123 comes to the center with respect to the opening portion of the lid member 111. The periphery of the first chip 105 is fixed to the lid member 111 by an adhesive material 510. The adhesive material 510 is an insulating material and also serves as a vacuum seal. As illustrated in FIG. 6A, the first chip 105 is fixed to the lid member 111 in a state where the conductive thin film 109 of the first chip 105 is in contact with the bottom surface of the recessed portion by which the first chip guide 402 is configured, and thus the conductive thin film 109 is electrically conductive with the electron beam irradiation surface 112. As a result, no conductive paste is required.

The second member 103 is the same as in the third configuration example. Although seal function enhancement can be achieved by thickening the adhesive material 510 since the adhesive material 510 also serves as a vacuum seal, the sandwiching of the liquid sample 115 by the first chip 105 and the second chip 107 may become problematic in the case of contact with the structure of the second member 103. Accordingly, the adhesive material 510 is not to be in contact with the second member 103 in a state where the first member 102 and the second member 103 are combined and fixed and the observation with the electron microscope is possible as illustrated in FIG. 6B.

FIGS. 7A to 7C illustrate a configuration example (fifth configuration example) of a sample holder 601 according to Example 1. The top view is the same as FIG. 1A. FIGS. 7A to 7B are cross-sectional views taken along line A-A in FIG. 1A. FIG. 7C is a diagram in which the second member 103 is viewed from the Y direction in FIG. 7A, that is, a diagram in which the second member 103 is viewed from above from the electron beam irradiation direction.

In the fifth configuration example, the second chip 107 is larger than the first chip 105. Along with this, the second chip guide 403 is also enlarged as illustrated in FIG. 7C. The fifth configuration example is the same as the third configuration example as to the rest. By the second chip 107 being larger than the first chip 105, the sample 122 that leaks out of the side wall of the first chip 105 can be held in the region that is the surface of the second chip 107 and does not overlap the first chip 105. As a result, it is possible to reduce the risk that the sample 122 infiltrates into the second space 121 and comes into contact with the electrode 108.

FIGS. 8A to 8F illustrate a configuration example (sixth configuration example) of a sample holder 701 according to Example 1. The sixth configuration example differs from the first to fifth configuration examples in terms of means for fixing the first member 102 and the second member 103. The top view corresponds to the top view in FIG. 1A from which the screw 117 is excluded. Each of FIGS. 8A to 8D is a cross-sectional view at a part corresponding to line A-A in FIG. 1A. FIG. 8E is a diagram in which the first member 102 is viewed from the X direction in FIG. 8A, that is, a diagram in which the first member 102 is viewed from below from the side opposite to the electron beam irradiation direction. FIG. 8F is a diagram in which the second member 103 is viewed from the Y direction in FIG. 8A, that is, a diagram in which the second member 103 is viewed from above from the electron beam irradiation direction.

As described above, the first member 102 and the second member 103 do not have any configuration required for fixing with a screw. Fixing hooks 702 in place of a screw are provided on the four sides of the first member 102. The four sides of the second member 103 are provided with hook sleds 703 corresponding to the fixing hooks 702. As illustrated in FIG. 8D, the first member 102 and the second member 103 are fixed by engaging the fixing hook 702 with the hook sled 703. The fixing hook 702 is provided at the tip of a first hook guide 704 extending in the direction perpendicular to the electron beam irradiation surface 112 of the lid member 111. The four sides of the base material 127 are provided with second hook guides 705 corresponding to the first hook guides 704.

Placing a sample on the sample holder 701 and the sample becoming observable with the electron microscope will be described with respect to FIGS. 8A to 8D.

FIG. 8A is a state where the first hook guide 704 of the first member 102 begins to fit into the second hook guide 705. The first member 102 in this state is pushed down and brought closer to the second member 103 manually or automatically (e.g. by a robot). The first chip 105 and the guide 116 provided on the second member 103 are aligned while the first member 102 is pushed down with the first hook guide 704 fitted into the second hook guide 705.

FIG. 8B is a state where the insulating thin film 104 of the first chip 105 is in contact with the liquid sample 115. In this state, the first chip 105 begins to fit into the guide 116 and the first chip 105 and the second chip 107 are aligned with each other. At this point in time, it is preferable that the fit between the first hook guide 704 and the second hook guide 705 is slightly more likely than the fit between the first chip 105 and the guide 116 so that a precise alignment can be performed. As a result, the center of the opening portion of the lid member 111, the center of the electron beam irradiation window 123, the center of the signal transmission window 124, and the center of the electrode 108 are aligned so as to coincide with each other. At this time, the first seal material 118 is not in contact with the first member 102 and the first seal material 118 is not deformed. Meanwhile, the second seal material 119 to which a force of pushing down is applied via the sample begins to be deformed so as to be crushed. In addition, the fixing hook 702 of the first member 102 interferes with the hook sled 703 of the second member 103 and begins to sled in the outward direction perpendicular to the outer peripheral surface.

FIG. 8C is a state immediately before the first member 102 begins to deform the first seal material 118 with the first member 102 further pushed down from the state of FIG. 8B. In this state, sample leakage from the first and second chip side walls may occur depending on the amount of the dripped liquid sample 115. Even in this state, the second seal material is in the process of being crushed and the second space 121 where the electrode 108 is disposed is sealed from the sample 122 that leaks from the chip side wall. At this time, the fixing hook 702 of the first member 102 is immediately before riding over the hook sled 703 of the second member 103.

FIG. 8D is a state where the first member 102 and the second member 103 are combined and fixed and the observation with the electron microscope is possible. At this time, the fixing hook 702 of the first member 102 rides over the hook sled 703 of the second member 103 and is fixed in a state where the fixing hook 702 and the hook sled 703 are in contact with each other. The first member 102 is fixed in a state where the repulsive force of the deformed first seal material 118 and the deformed second seal material 119 trying to return to their original shapes and the force of the hook sled 703 holding the fixing hook 702 are balanced.

In this state, the first seal material 118 seals the first space 120 airtightly from the outside environment kept in a high vacuum atmosphere for electron beam irradiation. Meanwhile, the second seal material 119 seals the second space 121 where the electrode 108 is disposed airtightly from the surrounding first space. In addition, the second seal material 119 seals the second space 121 from the sample 122 that leaks out of the side walls of the first chip 105 and the second chip 107. The second chip 107 is fixed in a state where the liquid sample 115 is sandwiched and pressed against the first chip 105 by the repulsive force of the deformed second seal material 119 trying to return to its original shape.

In this configuration example, screwing does not have to be performed during sample holder fixing and the sample holder can be prepared with ease and speed.

Since the first member 102 of the sample holder 701 includes the deformable first hook guide 704, it is preferable that the material of the lid member 111 is a relatively soft resin metal-plated as described above.

In an alternative configuration, the first member 102 may be provided with a hook sled with the second member 103 provided with a fixing hook by the members provided with the fixing hook and the hook sled being reversed. In this case, the first member 102 is not deformable at any part, and thus the lid member 111 can be made of a metal material.

Although an example in which a fixing method using a hook is applied to a sample holder corresponding to the first configuration example is illustrated as the sixth configuration example, application to the other configuration examples described above and modification examples thereof is also possible.

FIGS. 9A to 9G illustrate a configuration example (seventh configuration example) of a sample holder 801 according to Example 1. FIG. 9A is a top view in which the electron beam irradiation surface 112 of the sample holder 801 is viewed from above. As for each of FIGS. 9B to 9E, the upper part illustrates a cross-sectional view taken along line A-A in FIG. 1A and the lower part illustrates a plan view taken along line B-B in the cross-sectional view. FIG. 9F is a diagram in which the first member 102 is viewed from the X direction in FIG. 9B, that is, a diagram in which the first member 102 is viewed from below from the side opposite to the electron beam irradiation direction. FIG. 9G is a diagram in which the second member 103 is viewed from the Y direction in FIG. 9B, that is, a diagram in which the second member 103 is viewed from above from the electron beam irradiation direction.

As illustrated in FIG. 9A, the sample holder 801 has a circular outer peripheral shape. In the seventh configuration example, the first member 102 and the second member 103 are fixed by fitting the first member 102 into the second member 103 such that the first member 102 is screwed into the second member 103.

FIGS. 9B to 9E illustrate a process in which the first member 102 is screwed into and fixed to the second member 103. In the lower plan view, the second member 103 is illustrated to rotate without the first member 102 rotating with respect to the paper surface. As will be described later, the second chip 107 rotates with respect to the base material 127 together with the first chip 105. Accordingly, the second chip 107 is not supposed to be fixed to the base material 127. Accordingly, it is preferable to use an O-ring as the second seal material 119.

The sample holder 801 has a tea canister shape. The base material 127 of the second member 103 has a cylindrical shape. The lid member 111 of the first member 102 has a peripheral edge portion extending in the direction perpendicular to the electron beam irradiation surface.

A screw structure 810 is provided on the inner wall of the peripheral edge portion of the lid member 111 that comes into contact with the outer peripheral portion of the base material 127. The first chip 105 is fixed to the back surface of the lid member 111 by the fixing seal material 110. The first chip guide 402 into which the first chip 105 is fitted is provided on the back surface of the lid member 111 holding the first chip 105. As a result, the first chip 105 is aligned such that the center of the electron beam irradiation window 123 comes to the center with respect to the opening portion of the lid member 111. In addition, as illustrated in FIG. 9F, the back surface of the lid member 111 is provided with the guides (guides for facing chips) 116 that are four in number and used in aligning the first chip 105 with the second chip 107.

Alignment using the four guides 116 without the lid member 111 being provided with the first chip guide 402 may be performed such that the center of the opening portion of the lid member 111 coincides with the center of the electron beam irradiation window 123.

The base material 127 of the second member 103 has a cylindrical shape. The outer peripheral portion of the base material 127 of the second member 103 is provided with a screw structure 811 engaging with the screw structure 810 of the first member 102. By engaging these screw structures, the first member 102 is fitted so as to be screwed into the second member 103. Both are fixed as a result.

As illustrated in FIG. 9G, the second member 103 includes the second chip guide 403 into which the second chip 107 is fitted. The second chip 107 is placed on the second seal material 119 placed on the second bottom seal surface 200. In this state, the second chip 107 is aligned such that the center of the signal transmission window 124 coincides with the center of the electrode 108. The second chip guide 403 is the side wall of the recessed portion including the liquid pool 302 provided at the middle part of the base material 127.

Placing a sample on the sample holder 801 and the sample becoming observable with the electron microscope will be described. First, when the second chip 107 is placed in the second chip guide 403, the second chip 107 is placed in a state of being rotated up to the position of no further turning in the counterclockwise direction in FIG. 9G.

In the state illustrated in FIG. 9B, those by which the first member 102 is configured and those by which the second member 103 is configured are not in contact with each other at all. In this state, the first member 102 is brought closer to the second member 103 manually or automatically (e.g. by a robot).

FIG. 9C illustrates a state where the insulating thin film 104 of the first chip 105 is in contact with the liquid sample 115. This is a state where the first member 102 is disposed on the second member 103 without engaging the first screw structure 810 with the second screw structure 811. Meanwhile, as illustrated in the lower plan view of FIG. 9C, the second chip 107 begins to fit into the guide 116 of the first member 102 and the first chip 105 and the second chip 107 are aligned with each other. As a result, alignment is performed such that the center of the opening portion of the lid member 111, the center of the electron beam irradiation window 123, the center of the signal transmission window 124, the center of the electrode 108 coincide with each other. In addition, in this stage, the first seal material 118 is not in contact with the first member 102 and the first seal material 118 is not deformed. Meanwhile, the second seal material 119 to which a force of pushing down is applied via the liquid sample 115 begins to be deformed so as to be crushed.

FIG. 9D illustrates a state where the first screw structure 810 comes into contact with the second screw structure 811 and the first member 102 begins to be screwed into the second member 103. This state is also a state immediately before the first member 102 begins to deform the first seal material 118. At this time, sample leakage from the first and second chip side walls may occur depending on the amount of the dripped liquid sample 115. Since the second seal material 119 is in the process of being crushed, the electrode 108 is sealed from the sample 122 that leaks from the chip side wall.

As illustrated in the lower plan view of FIG. 9D, the second chip 107 slides on the second seal material 119 and rotates with the first chip 105 in a state of being aligned with the first chip 105 along the guide 116.

FIG. 9E is a state where the first member 102 and the second member 103 are combined and fixed and the observation with the electron microscope is possible. In this state, the guide 116 of the first member 102 and the second chip guide 403 of the second member 103 are fixed in contact with each other so as not to rotate further. In this manner, in the seventh configuration example, a lock mechanism limiting the amount of rotation of the base material 127 with respect to the lid member 111 is provided and the first chip 105 being pressed against the second chip 107 by an excessively large or small amount is suppressed. Although the lock mechanism in this case is realized by the guide 116 and the second chip guide 403, the mechanism may be provided independently of the guide 116 and the second chip guide 403. For example, a groove is provided in the upper end outer periphery of the base material 127 and a rotation stopper is provided at one part thereof. Meanwhile, the lid member 111 is provided with a projecting portion fitting into the groove when the first member 102 and the second member 103 are combined. The first member 102 is screwed into the second member 103, and the projecting portion moves in the groove. Then, screwing is completed when the rotation stopper is hit.

In the seventh configuration example, the first member 102 is fixed in a state where the repulsive force of the deformed first seal material 118 trying to return to its original shape and the holding force acting by the frictional force acting between the screw structure 810 of the first member and the screw structure 811 of the second member are balanced. As for the fixing method of this configuration example using screwing, the second chip 107 may be larger than the first chip 105 as in, for example, the fifth configuration example. In that case, the shapes of the four guides 116 and the second chip guide 403 may be changed in accordance with the size of the second chip 107.

The seventh configuration example has the following two advantages because the first chip 105 and the second chip 107 rotate at the same time when screwing is performed. Firstly, since the two chips rotate at the same time, the liquid sample sandwiched between the two chips is not rubbed between the thin films and the risk of thin film damage can be reduced. Secondly, since the two chips have a fixed degree of overlap, the field of view that is determined by the overlap between the window 123 of the first chip 105 and the window 124 of the second chip 107 can be ensured without being affected by the operation of liquid sample introduction into the sample holder 801. Modification examples of the seventh configuration example are as follows.

FIG. 9H illustrates a first modification example. In the first modification example, the first member 102 includes the second member guide 404 and the first chip 105 is fixed to the lid member 111. The first chip 105 is fixed such that the center of the electron beam irradiation window 123 coincides with the central axis of the second member guide 404. In addition, the second member 103 includes the second chip guide 403 and the first member guide 405. The central axes of the second chip guide 403 and the first member guide 405 are disposed so as to coincide with the central axis of the electrode 108, and the center of the signal transmission window 124 coincides with the central axis of the electrode 108 when the second chip 107 is placed along with the second chip guide 403. As illustrated in FIG. 9H, the guides 403, 404, and 405 are circular. In particular, the guides 403, 404, and 405 form concentric circles in a state where the first member 102 and the second member 103 are combined.

The first chip 105 and the second chip 107 are congruent squares, and processing is performed such that the diameter of the second chip guide 403 is slightly larger than the diagonal length of the chip. In fixing the first member 102 to the second member 103, the first member 102 is placed on the second member 103 first. Although the tip of the first member guide 405 of the second member 103 is positioned above the tip of the second member guide 404 in this example, the insulating thin film 104 of the first chip 105 and the insulating thin film 106 of the second chip 107 are not to be in contact with each other when the tip of the first member guide 405 and the tip of the second member guide 404 are in contact with each other (the positional relationship of the guide tip portions and the insulating thin films is the same as in FIG. 5E). Alignment is performed such that the center of the window 123 of the first chip 105 and the center of the window 124 of the second chip 107 coincide with each other as described above. Subsequently, the screw structure 810 of the first member 102 is engaged with the screw structure 811 of the second member 103, rotated, and fixed.

This modification example has the advantage that the structures formed on the lid member 111 and the base material 127 and including the guide can be made circular and cost reduction can be achieved. Meanwhile, when the first member 102 is screwed and fixed, the first chip 105 is fixed while rotating with respect to the second chip 107, which leads to an increase in the risk of thin film damage. In addition, the maximum field of view may not be obtained depending on the degree of overlap between the first chip 105 and the second chip 107 that are fixed. For example, the top view (lower part) of FIG. 9H illustrates an example in which the first chip 105 and the second chip 107 are out of phase by 45 degrees. However, this state is the minimum field of view of a sample holder 801b, and thus it suffices if the necessary field of view is ensured in this state.

FIGS. 9I to 9J illustrate a second modification example. FIG. 9I illustrates a state where each member of a sample holder 801c is separated, and FIG. 9J illustrates a state where the members are joined. In the second modification example, it is possible to reduce the risk of thin film damage while maintaining the guide structure of the first modification example enabling cost reduction. In the second modification example, a screw lid 125 is used to fix the first member 102 to the second member 103. The screw lid 125 has a tea canister shape provided with an opening 125a for electron beam passage and has a peripheral edge portion extending in the direction perpendicular to the bottom surface provided with the opening 125a. The inner wall of the peripheral edge portion is provided with the screw structure 810. In addition, a disk-shaped washer 126 sandwiched between the screw lid 125 and the first member 102 is provided.

The outer peripheral portion of the first member 102 is the second member guide 404, and the first chip 105 is fixed to the lid member 111. The first chip 105 is fixed such that the center of the electron beam irradiation window 123 coincides with the central axis of the second member guide 404. In addition, the second member 103 includes the second chip guide 403 and the first member guide 405. The central axes of the second chip guide 403 and the first member guide 405 are disposed so as to coincide with the central axis of the electrode 108, and the central axis of the signal transmission window 124 coincides with the central axis of the electrode 108 when the second chip 107 is placed along with the second chip guide 403. As illustrated in FIG. 9I, the guides 403, 404, and 405 are circular. In particular, the guides 403, 404, and 405 form concentric circles in a state where the first member 102 and the second member 103 are combined.

The first chip 105 and the second chip 107 are congruent squares. The chip size difference that is illustrated in FIGS. 9I and 9J is because an example in which the first chip 105 and the second chip 107 are out of phase by 45 degrees in the top view is illustrated as in the case of FIG. 9H. Processing is performed such that the diameter of the second chip guide 403 is slightly larger than the diagonal length of the chip. In fixing the first member 102 to the second member 103, the first member 102 is placed on the second member 103 first. At this point in time, the insulating thin film 104 of the first chip 105 and the insulating thin film 106 of the second chip 107 are not in contact with each other. Alignment is performed such that the center of the window 123 of the first chip 105 and the center of the window 124 of the second chip 107 coincide with each other as described above. Subsequently, the washer 126 is placed on the first member 102, the screw lid 125 covers the washer 126 from above, and the screw structure 810 is engaged with the screw structure 811 of the second member 103, rotated, and fixed.

According to this modification example, the first member 102 can be pushed down, without rotating the first member 102 with respect to the second member 103, by the frictional force that acts between the first and second members 102 and 103 and the first seal material 118 when the screw lid 125 is screwed in by sandwiching the washer 126. As a result, the risk of thin film damage can be reduced. Selected as the material of the washer 126 is a material with a coefficient of friction at which the rotational operation of the screw lid 125 is not transmitted to the first member 102.

Various sample holder configuration examples are described above. The following second design guideline can be applied in place of the first design guideline for the sample holder (see FIG. 3) described above in a case where it is assumed that there is little sample leakage during inter-chip liquid sample sandwiching or in a case where the risk of contact between the electrode 108 and a liquid sample that leaks out is low as in, for example, the fifth configuration example (see FIGS. 7A to 7C). The second design guideline for the sample holder is illustrated in FIG. 18. FIG. 18 illustrates a sample-less state where the upper seal surface 205 of the lid member 111 and the first seal material 118 are in contact with each other. At this time, the insulating thin film 104 of the first chip 105 and the insulating thin film 106 of the second chip 107 are not in contact with each other.

The first chip 105 and the second chip 107 are aligned with each other in a state where the lid member 111 and the first seal material 118 are not in contact with each other, and FIG. 18 is a state where the alignment is completed. The second design guideline can be defined as satisfying the condition (Point 1) that "the first seal material 118 is not deformed at the moment when the first chip 105 and the second chip 107 begin to be aligned" and the condition (Point 1) that "the first seal material 118 is crushed at the same time as or before the second seal material 119 is crushed".

The relationship of (Equation 3) and (Equation 4) below may be satisfied in the case of the sample holder 101 according to the first configuration example illustrated in FIG. 18. The guide depth a, the first inter-seal surface distance b, and the second inter-seal surface distance c are defined in FIG. 3. Further defined is a distance d from the lid member 111 to the insulating thin film 104 of the first chip 105 (equal to thickness of first chip 105+thickness of fixing seal material 110 in this case).

$$\text{Guide depth } a + \text{Distance } d > \text{Second inter-seal surface distance } c + \text{Thickness of first seal material } 118 \quad \text{(Equation 3)}$$

By satisfying (Equation 3), it is guaranteed that the first chip 105 is fitted into the guide 116.

$$\text{ABS(first inter-seal surface distance } b - \text{second inter-seal surface distance } c) \leq \text{Thickness of first seal material } 118 \quad \text{(Equation 4)}$$

By satisfying (Equation 4), it is guaranteed that the insulating thin film 104 of the first chip 105 and the insulating thin film 106 of the second chip 107 are not in contact with each other when the upper seal surface 205 on the lid member 111 and the first seal material 118 are in contact with each other.

In this case as well, whether it is required to satisfy (Equation 3) depends on the structure of the sample holder. For example, (Equation 3) does not have to be satisfied in a case where inter-chip alignment is precisely performed with a member guide such as what is exemplified in the third configuration example or the like.

The sample holder that follows the second design guideline has the following effects. In the sample holder that follows the first design guideline, the liquid sample is crushed by the entire weight of the first member 102 when the first member 102 is placed on the second member 103 and the hand is released. On the other hand, in the sample holder that follows the second design guideline, the first seal material 118 serves as a cushion, the first member 102 is pushed down while the first seal material 118 and the second seal material 119 are crushed, and thus it is possible to crush the liquid sample relatively slowly and uniformly. The first design guideline and the second design guideline may be selected based on the risk of short circuit attributable to liquid sample leakage and the effect on the sample of how to introduce the liquid sample into the sample holder.

Example 2

The strength of a signal detected by an electrode declines in a case where the gap between insulating thin films sandwiching a liquid sample is too thick. It is preferable that the gap between the insulating thin films is slightly thicker than an observation target in a solution or gel material. In this regard, the sample holder according to Example 2 includes a mechanism for adjusting the distance between insulating films by adjusting the pressure of the first space 120 and/or the second space 121 formed by the first seal material 118 and the second seal material 119.

FIGS. 10A to 10B illustrate a sample holder 901 (eighth configuration example) in which the sample holder of Example 1 (seventh configuration example) is provided with a mechanism depressurizing the first space 120 under high vacuum conditions for electron microscopic observation. Placed in the first space 120 is a sample sandwiched between insulating thin films. FIG. 10A illustrates a state where the sample holder 901 is disposed in an atmospheric pressure atmosphere. FIG. 10B illustrates a state where the sample holder 901 is disposed in a high vacuum atmosphere. The sample holder 901 includes a gas passage 910 connecting the outside atmosphere and the first space 120 and an elastic depressurization film 911 provided at the boundary between the gas passage 910 and the outside atmosphere. As illustrated in FIG. 10B, the depressurization film 911 swells to the outside under high vacuum conditions. As a result, the first space 120 is depressurized as compared with a state of disposition in an atmospheric pressure atmosphere. Meanwhile, the second space 121 sealed by the second seal material 119 remains at atmospheric pressure without depressurization. In other words, the second space 121 becomes relatively higher in pressure than the first space 120. As a result, the insulating thin film in the signal transmission window 124 of the second chip 107 and the insulating thin film and the conductive thin film in the electron beam irradiation window 123 of the first chip 105 are pushed from the electrode 108 side and a thin gap can be kept between the electron beam irradiation window 123 and the signal transmission window 124 sandwiching the liquid sample 115.

The depressurization film 911 may be provided in advance on the base material 127 or may be provided after the first member 102 and the second member 103 are combined to enable electron microscopic observation. In a case where the depressurization film 911 is disposed with the first member 102 and the second member 103 combined, the first space 120 is capable of maintaining open to the outside atmosphere in the process of combining the first member 102 and the second member 103. In a case where the gas passage connected to the outside atmosphere is not provided, the first seal material 118 is crushed by pressing the first member 102 against the second member 103, the volume of the first space 120 decreases by that amount, and the first space 120 may be pressurized to the atmospheric pressure or higher. By having the gas passage open to the outside atmosphere, it is possible to suppress an excessive pressurization of the first space 120.

FIGS. 11A to 11C illustrate a sample holder 1001 (ninth configuration example) in which the sample holder of Example 1 (seventh configuration example) is provided with a mechanism adjusting the pressure of the second space 121 by pressurization or depressurization under high vacuum conditions for electron microscopic observation. FIG. 11A illustrates a state where the sample holder 1001 is disposed in an atmospheric pressure atmosphere. FIG. 11B illustrates a state where the sample holder 1001 is disposed in a high vacuum atmosphere. FIG. 11C illustrates a state where the pressure of the second space 121 is adjusted in a high vacuum atmosphere. The sample holder 1001 includes a gas passage 1010 connecting the outside atmosphere and the second space 121, an elastic depressurization film 1011 provided at the boundary between the gas passage 1010 and the outside atmosphere, and a gas pressure adjusting mechanism 1012. The gas pressure adjusting mechanism 1012 adjusts the pressure of the second space 121 by changing how the depressurization film 1011 swells.

As illustrated in FIG. 11B, the depressurization film 1011 swells to the outside under high vacuum conditions. As a result, the second space 121 is depressurized as compared with a state of disposition in an atmospheric pressure atmosphere. Accordingly, the pressure difference between the first space 120 and the second space 121 causes the insulating thin film in the signal transmission window 124 of the second chip 107 to swell to the outside when viewed from the liquid sample 115 and the pressure difference between the outside atmosphere and the first space 120 causes the laminated film of the insulating thin film and the conductive thin film in the electron beam irradiation window 123 of the first chip 105 to swell to the outside when viewed from the liquid sample 115. Accordingly, as illustrated in FIG. 11C, the gas pressure adjusting mechanism 1012 extrudes a rod-shaped member 1013 in the arrow direction and pushes up the depressurization film 1011 to the second space 121 side. By changing the amount of extrusion of the rod-shaped member 1013, the pressure of the second space 121 can be adjusted to a state of pressurization or depressurization from the initial atmospheric pressure. By the gas pressure adjusting mechanism 1012 appropriately pressurizing the second space 121, the insulating thin film in the signal transmission window 124 is pushed with a relatively high gas pressure from the electrode 108 side and a thin gap can be kept between the electron beam irradiation window 123 and the signal transmission window 124 sandwiching the liquid sample 115.

An example of the gas pressure adjusting mechanism 1012 is a linear actuator. The gas pressure adjusting mechanism 1012 may be configured integrally with the sample holder 1001 or may be provided on a holder on the electron microscope side where the sample holder 1001 is mounted during observation.

In addition, the gas pressure adjustment by the gas pressure adjusting mechanism 1012 may be performed while checking an image acquired by the electron microscope. The extrusion of the rod-shaped member 1013 is stopped in a state where a desired contrast is obtained during the image check. This is because the signal strength increases as the second space 121 is pressurized and the risk of damage to the thin film of the chip increases when the pressurization is excessive.

FIG. 12 illustrates a sample holder 1101 (tenth configuration example) in which the sample holder of Example 1 (seventh configuration example) is provided with a mechanism depressurizing the first space 120 under high vacuum conditions for electron microscopic observation and a mechanism adjusting the pressure of the second space 121 by pressurization or depressurization. FIG. 12 illustrates a state where the sample holder 1101 is disposed in a high vacuum atmosphere and the pressure of the second space 121 is adjusted. The sample holder 1101 is provided with a heater 1110 in the second space 121 in order to adjust the pressure of the second space 121. The heater 1110 pressurizes the second space 121 by expanding the gas atmosphere of the second space 121. By appropriately pressurizing the second space 121 with the heater 1110, the insulating thin film 106 in the signal transmission window 124 is pushed with a relatively high gas pressure from the electrode 108 side and a thin gap can be kept between the electron beam irradiation window 123 and the signal transmission window 124 sandwiching the liquid sample 115. The gas pressure adjustment by the heater 1110 may also be performed while checking an image acquired by the electron microscope.

FIG. 13 illustrates a sample holder 1201 (eleventh configuration example) in which the sample holder of Example 1 (seventh configuration example) is provided with a mechanism depressurizing the first space 120 under high vacuum conditions for electron microscopic observation, the gas passage 1010 connecting the outside atmosphere and the second space 121, and a seal film 1210. FIG. 13 illustrates a state where the sample holder 1201 is disposed in an atmospheric pressure atmosphere.

The mechanism depressurizing the first space 120 has the gas passage 910 connecting the outside atmosphere and the first space 120 and the elastic depressurization film 911 as in the eighth configuration example.

The seal film 1210 may or may not be elastic. In a case where the seal film 1210 is elastic, a gas pressure adjusting means may be provided as in the ninth or tenth configuration example so that the pressure of the second space 121 can be adjusted. In any case, the second space 121 is relatively higher in pressure than the first space 120 in a high vacuum atmosphere. As a result, a thin gap can be kept between the electron beam irradiation window 123 and the signal transmission window 124 sandwiching the liquid sample 115.

In a case where the seal film 1210 is not elastic, it is preferable to dispose the depressurization film 911 and the seal film 1210 in a state where the first member 102 and the second member 103 are combined and electron microscopic observation is possible. As a result, it is possible to suppress the second space 121 being excessively pressurized by the second seal material 119 being crushed.

Although an example in which a gas pressure adjusting mechanism is applied to a sample holder corresponding to the seventh configuration example is illustrated as each of the eighth to eleventh configuration examples, application to the other configuration examples described as Example 1 and modification examples thereof is also possible.

The sample holder according to the eighth configuration example illustrated in FIGS. 10A and 10B is provided with a mechanism depressurizing the first space 120 with the gas passage 910 and the depressurization film 911. Alternatively, it is possible to realize a depressurization mechanism by integrating the first seal material 118 and the second seal material 119 and using a film connecting the first seal material and the second seal material as the depressurization film 911 in order to reduce the numbers of components and work processes.

FIGS. 14A to 14C illustrate a sample holder 1301 (twelfth configuration example) in which the sample holder of Example 1 (sixth configuration example) is provided with a mechanism depressurizing the first space 120 under high vacuum conditions for electron microscopic observation. The sample holder 1301 uses a depressurization film-functional seal material 1310 in which the first seal material 118 and the second seal material 119 are integrated as described above. FIG. 14A illustrates a state where the sample holder 1301 is disposed in an atmospheric pressure atmosphere. FIG. 14B illustrates a state where the sample holder 1301 is disposed in a high vacuum atmosphere. FIG. 14C is a diagram in which the second member 103 is viewed from above from the electron beam irradiation direction. In the illustration of FIG. 14C, the second chip 107 is partially cut out so that the structure can be understood with ease. The actual shape of the second chip 107 is the dotted-line rectangle in FIG. 14C. In addition, the integrated depressurization film-functional seal material 1310 is not illustrated in FIG. 14C.

In a state where the first member 102 is fixed to the second member 103, the depressurization film-given seal material 1310 of the second member 103 of the sample holder 1301 seals the first space 120 and the second space 121 with a first seal portion 118' and a second seal portion 119', respectively. In addition, the second member 103 has a third space 1311 positioned directly below a depressurization film portion 911' between the first seal portion 118' and the second seal portion 119'. The third space 1311 is connected to the outside atmosphere by the gas passage 910. As illustrated in FIG. 14B, the depressurization film portion 911' swells to the outside under high vacuum conditions, and thus the first space 120 is depressurized as compared with a state of disposition in an atmospheric pressure atmosphere. As a result, the second space 121 becomes relatively higher in pressure than the first space 120. As a result, the insulating thin film in the signal transmission window 124 of the second chip 107 and the insulating thin film and the conductive thin film in the electron beam irradiation window 123 of the first chip 105 are pushed from the electrode 108 side and a thin gap can be kept between the electron beam irradiation window 123 and the signal transmission window 124 sandwiching the liquid sample 115.

The shape of the depressurization film-given seal material 1310 is illustrated in FIG. 15 (schematic diagram). A cross-sectional view taken along line A-A in FIG. 14C is illustrated at the top. Illustrated below are C-C, D-D, E-E, and F-F plan views in the cross-sectional view. The depressurization film-functional seal material 1310 has the O-ring-shaped first seal portion 118' and the O-ring-shaped second seal portion 119' and has a shape in which both are connected by the depressurization film portion 911'. The depressurization film portion 911' is provided with a guide portion 116' disposed along the guide 116 provided on the base material 127 of the second member 103. As illustrated in FIG. 14A, the first chip 105 and the second chip 107 are aligned using the guide portion 116'.

Although an example in which a depressurization film-given seal material is applied to a sample holder corresponding to the sixth configuration example is illustrated as the twelfth configuration example, application to the other configuration examples described as Example 1 and modification examples thereof is also possible. In addition, the depressurization film-functional seal material 1310 can be used as a seal material in which the first seal material and the second seal material are integrated without using the function of a depressurization film.

FIGS. 16A to 16C illustrate a sample holder 1401 (thirteenth configuration example) in which the sample holder of Example 1 (sixth configuration example) is provided with a mechanism depressurizing the first space 120 under high vacuum conditions for electron microscopic observation. FIG. 16A illustrates a state where the first member 102 is fixed to the second member 103 and disposed in an atmospheric pressure atmosphere. FIG. 16B illustrates a state where the first member 102 is fixed to the second member 103 and disposed in a high vacuum atmosphere. FIG. 16C is a diagram in which the second member 103 is viewed from above from the electron beam irradiation direction. In the illustration of FIG. 16C, the second chip 107 is partially cut out so that the structure can be understood with ease. The actual shape of the second chip 107 is the dotted-line rectangle in FIG. 16C. FIGS. 16A to 16B are cross-sectional views taken along line A-A in FIG. 16C.

The second member 103 of the sample holder 1401 includes a depressurization film-functional sheet-shaped seal material 1402 as the second seal material. A double-sided tape having a structure in which the Si rubber sheet 140 is sandwiched between the Si-based adhesive material sheets 150 having uniform surfaces on both surfaces can be used as the depressurization film-functional sheet-shaped seal material 1402. The second member 103 of the sample holder 1401 includes the guide 116 for aligning the second chip 107 with respect to the second member 103 using the four corners of the second chip 107. As in the case of Example 1 (sixth configuration example), the guide 116 is also used in aligning the first chip 105 with the second chip 107 when the first member 102 and the second member 103 are fixed.

The second member 103 includes the third space 1311 at a part of the second bottom seal surface 200. The third space 1311 is connected to the outside atmosphere by the gas passage 910.

The shape of the depressurization film-functional sheet-shaped seal material 1402 is illustrated in FIG. 17 (schematic diagram). As illustrated in FIG. 17, the depressurization film-functional sheet-shaped seal material 1402 is bonded to the second bottom seal surface 200 without interfering with the guide 116. The dotted line in FIG. 17 indicates the position of the guide 116 on the bonding occasion. In addition, the depressurization film-functional sheet-shaped seal material 1402 is provided with an electrode center hole 1403 for avoiding contact with the electrode 108.

The second chip 107 is bonded and fixed on the depressurization film-functional sheet-shaped seal material 1402 in a state of being aligned by the guide 116 such that the center of the second chip 107 coincides with the center of the electrode 108. The depressurization film-functional sheet-shaped seal material 1402 has a function as the second seal material. The depressurization film-functional sheet-shaped seal material 1402 seals the second space 121 airtightly from the first space 120 in a state where the first member 102 and the second member 103 are fixed. In addition, the depressurization film-functional sheet-shaped seal material 1402 isolates the third space 1311 and the first space 120 and seals the first space 120 airtightly from the outside environment kept in a high vacuum atmosphere for electron beam irradiation.

When the sample holder 1401 is placed under high vacuum conditions as illustrated in FIG. 16B, the depressurization film-functional sheet-shaped seal material 1402 swells to the high vacuum atmosphere side at the part where the third space 1311 is directly below. As a result, the first space 120 is depressurized as compared with a state of disposition in an atmospheric pressure atmosphere. As a result, the second space 121 becomes relatively higher in pressure than the first space 120. As a result, the insulating thin film in the signal transmission window 124 of the second chip 107 and the insulating thin film and the conductive thin film in the electron beam irradiation window 123 of the first chip 105 are pushed from the electrode 108 side and a thin gap can be kept between the electron beam irradiation window 123 and the signal transmission window 124 sandwiching the liquid sample 115.

Although an example in which a depressurization film-given seal material is applied to a sample holder corresponding to the sixth configuration example is illustrated as the thirteenth configuration example, application to the other configuration examples described as Example 1 and modification examples thereof is also possible.

Example 3

FIG. 19 is a configuration diagram of a charged particle beam device. A housing 2010 includes a column 2610 incorporating an electron optical system irradiating a sample to be observed with an electron beam and a sample chamber 2600 where the sample is placed. The electron optical system includes an electron gun 2011, a condenser lens 2060 and an objective lens 2062 focusing an electron beam 2012 emitted from the electron gun 2011 and irradiating the sample, an astigmatism corrector 2061 correcting the astigmatism of the electron beam 2012, and a deflector 2013 two-dimensionally scanning the sample with the electron beam 2012. The sample chamber 2600 is provided with a detector 2017 detecting an electronic signal generated from the sample and a vacuum exhaust system 2000 for keeping the inside of the housing 2010 in a vacuum. The sample chamber 2600 is provided with a stage 2064 that can be moved three-dimensionally. Incorporated in the stage 2064 are the base material 127 and the electrode 108 of the sample holder described as Example 1 or 2.

A main control unit 2014 is connected to a computer 2015 to which a display unit 2016 is connected. A user performs scanning electron microscope operation using the user interfaces (GUIs) on the computer 2015 and the display unit 2016. The computer 2015 transmits a command input by the user using the GUI to the main control unit 2014. The main control unit 2014 controls the electron optical system of the scanning electron microscope, the vacuum exhaust system 2000, the stage 2064, and other components (not illustrated) in accordance with the command. Further, the computer 2015 receives signal data from the detector 2017 or the electrode 108 received by the main control unit 2014 and displays the data as an image on the display unit 2016.

The user places the first seal material 118, the second seal material 119, and the second chip 107 on the base material 127 incorporated in the stage 2064, drips the liquid sample 115, and then fixes the first member 102 and performs observation.

Alternatively, the electrode 108 of the sample holder described as Example 1 or 2 may be incorporated in the stage 2064 (the charged particle beam device in this case corresponds to the charged particle beam device in FIG. 19 from which the base material 127 is excluded). The user places the base material 127 on the electrode 108 in the state illustrated in FIG. 19. Then, the user performs sample observation in the same manner.

REFERENCE SIGNS LIST

101, 301, 401, 501, 601, 701, 801, 901, 1001, 1101, 1201, 1301, 1401: sample holder
102: first member
103: second member
104: insulating thin film
105: first chip
106: insulating thin film
107: second chip
108: electrode
109: conductive thin film
110: fixing seal material
111: lid member
112: electron beam irradiation surface
113: inclined surface
114: conductive paste
115: liquid sample
116: guide
116': guide portion
117: screw
118: first seal material
118': first seal portion
119: second seal material
119': second seal portion
120: first space
121: second space
122: sample
123: electron beam irradiation window
124: signal transmission window
125: screw lid
125a: opening
126: washer
127: base material
128: through hole
129: screw hole
130: chip relief
140: Si rubber sheet
150: Si-based adhesive material sheet
200: second bottom seal surface
203: first bottom seal surface
204: second inter-seal surface distance
205: upper seal surface
302: liquid pool
402: first chip guide
403: second chip guide
404: second member guide
405: first member guide
510: adhesive material
702: fixing hook
703: hook sled
704: first hook guide
705: second hook guide
810, 811: screw structure
910: gas passage
911: depressurization film
911': depressurization film portion
1010: gas passage
1011: depressurization film
1012: gas pressure adjusting mechanism
1013: rod-shaped member
1110: heater
1210: seal film
1310: depressurization film-functional seal material
1311: third space
1402: depressurization film-functional sheet-shaped seal material
1403: electrode center hole
2000: vacuum exhaust system
2010: housing
2011: electron gun
2012: electron beam
2013: deflector
2014: main control unit
2015: computer
2016: display unit
2017: detector
2060: condenser lens
2061: astigmatism corrector
2062: objective lens
2064: stage
2600: sample chamber
2610: column

The invention claimed is:

1. A sample holder holding a liquid or gel sample, comprising:
a first member that includes a lid member having an opening portion and being made of metal or covered with a metal film on at least an electron beam irradiation surface and a side surface of the opening portion, and a first chip provided with a first window where a laminated film of a conductive thin film and a first insulating thin film is formed and held on a surface of the lid member facing the electron beam irradiation surface such that the conductive thin film is exposed from the opening portion of the lid member; and a second member that includes a first seal material, a second seal material, a base material having a first bottom seal surface where the first seal material is disposed and a second bottom seal surface where the second seal material is disposed, an electrode disposed on the base material, and a second chip provided with a second window where a second insulating thin film is formed and held on the second bottom seal surface via the second seal material such that the second window faces the electrode, wherein the conductive thin film of the first chip and the metal of the lid member are electrically conductive, a guide for facing chips is provided on the base material in accordance with a position of the first chip at a time when the first member and the second member are combined or provided on the lid member in accordance with a position of the second chip at a time when the first member and the second member are combined, and a region inside the first seal material is maintained airtightly from a region outside the first seal material by the first member and the second member being combined and the first seal material being crushed between the first bottom seal surface and an upper seal surface of the lid member.

2. The sample holder according to claim 1, wherein, when the first member and the second member are disposed such that the first insulating thin film and the second insulating thin film are in surface contact with each other, the surface of contact between the first insulating thin film and the second insulating thin film is positioned between the base material or the lid member provided with the guide for facing chips and a tip of the guide for facing chips, and a distance between the first bottom seal surface of the base material and the upper seal surface of the lid member exceeds a thickness of the first seal material.

3. The sample holder according to claim 1, wherein a height at which the first insulating thin film and the second insulating thin film do not come into contact with each other is provided when the first member and the second member are disposed such that a center of the first window of the first chip is aligned with a center of the second window of the second chip and the upper seal surface of the lid member and the first seal material are in contact with each other.

4. The sample holder according to claim 1, wherein the first chip is held by a first chip guide provided on the lid member.

5. The sample holder according to claim 1, wherein the base material has a recessed portion having the second bottom seal surface as a bottom surface and the guide for facing chips is a side wall of the recessed portion.

6. The sample holder according to claim 1, wherein the base material has a recessed portion having the second bottom seal surface as a part of a bottom surface of the recessed portion and the guide for facing chips is provided at a position facing a side of the first chip at a time when the first member and the second member are combined in the recessed portion.

7. The sample holder according to claim 1, comprising:
a hook; and
a sled that engages with the hook, wherein
the first member is provided with one of the hook and the sled, and the second member is provided with the other of the hook and the sled.

8. A sample holder holding a liquid or gel sample, comprising:
a first member that includes a lid member having an opening portion and being made of metal or covered with a metal film on at least an electron beam irradiation surface and a side surface of the opening portion, and a first chip provided with a first window where a laminated film of a conductive thin film and a first insulating thin film is formed and held on a surface of the lid member facing the electron beam irradiation surface such that the conductive thin film is exposed from the opening portion of the lid member; and a second member that includes a first seal material, a second seal material, a base material having a first bottom seal surface where the first seal material is disposed and a second bottom seal surface where the second seal material is disposed, an electrode disposed on the base material, and a second chip provided with a second window where a second insulating thin film is formed and held on the second bottom seal surface via the second seal material such that the second window faces the electrode, wherein the conductive thin film of the first chip and the metal of the lid member are electrically conductive, the base material is provided with a first member guide, the surface of the lid member facing the electron beam irradiation surface is provided with a second member guide, and the first member guide and the second member guide have heights at which the first insulating thin film and the second insulating thin film do not come into contact with each other when the first member guide and the second member guide are in contact with each other, and a region inside the first seal material is maintained airtightly from a region outside the first seal material by the first member and the second member being combined and the first seal material being crushed between the first bottom seal surface and an upper seal surface of the lid member.

9. The sample holder according to claim 8, wherein
the base material is provided with a second chip guide in accordance with a position of the second chip, and
a tip of the second chip guide is positioned below the second insulating thin film of the second chip.

10. The sample holder according to claim 9, wherein the base material has a recessed portion having the second bottom seal surface as a part of a bottom surface of the recessed portion and the second chip guide is provided at a position facing a side of the second chip in the recessed portion.

11. The sample holder according to claim 10, wherein the first member guide is a side wall of the recessed portion and the second member guide is provided at a position corresponding to the side wall of the recessed portion at a time when the first member and the second member are combined.

12. The sample holder according to claim 8, wherein the first chip is held by a first chip guide provided on the lid member.

13. The sample holder according to claim 8, wherein a surface of the first chip where the first insulating thin film is formed is different in area from a surface of the second chip where the second insulating thin film is formed.

14. The sample holder according to claim 8, comprising:
a hook; and
a sled that engages with the hook, wherein
the first member is provided with one of the hook and the sled, and the second member is provided with the other of the hook and the sled.

15. A sample holder holding a liquid or gel sample, comprising:
a first member that includes a lid member having an opening portion and being made of metal or covered with a metal film on at least an electron beam irradiation surface and a side surface of the opening portion, and a first chip provided with a first window where a laminated film of a conductive thin film and a first insulating thin film is formed and held on a surface of the lid member facing the electron beam irradiation surface such that the conductive thin film is exposed from the opening portion of the lid member; and
a second member that includes a first seal material, a second seal material, a base material having a first bottom seal surface where the first seal material is disposed and a second bottom seal surface where the second seal material is disposed, an electrode disposed on the base material, and a second chip provided with a second window where a second insulating thin film is formed and held on the second bottom seal surface via the second seal material such that the second window faces the electrode, wherein
the conductive thin film of the first chip and the metal of the lid member are electrically conductive,
the lid member is provided with a guide for facing chips in accordance with a position of the second chip at a time when the first member and the second member are combined,
a region inside the first seal material is maintained airtightly from a region outside the first seal material by the first member and the second member being combined and the first seal material being crushed between the first bottom seal surface and an upper seal surface of the lid member,
the base material has a cylindrical shape with an outer peripheral portion provided with a first screw structure, the lid member has a peripheral edge portion extending in a direction perpendicular to the electron beam irradiation surface, and an inner wall of the peripheral edge portion is provided with a second screw structure engaging with the first screw structure, and
a tip of the guide for facing chips is positioned below the second insulating thin film of the second chip in a state where the first member is placed on the second member without engaging the first screw structure with the second screw structure.

16. The sample holder according to claim 15, comprising a lock mechanism that limits the amount of rotation of the base material with respect to the lid member when the first screw structure and the second screw structure are engaged with each other and the first member and the second member are combined.

17. The sample holder according to claim 16, wherein the base material has a recessed portion having the second bottom seal surface as a part of a bottom surface of the recessed portion and the amount of rotation of the base material with respect to the lid member is limited by interference between a side wall of the recessed portion and the guide for facing chips.

18. A sample holder holding a liquid or gel sample, comprising:
a first member that includes a lid member having an opening portion and being made of metal or covered with a metal film on at least an electron beam irradiation surface and a side surface of the opening portion, and a first chip provided with a first window where a laminated film of a conductive thin film and a first insulating thin film is formed and held on a surface of the lid member facing the electron beam irradiation surface such that the conductive thin film is exposed from the opening portion of the lid member; and
a second member that includes a first seal material, a second seal material, a base material having a first bottom seal surface where the first seal material is disposed and a second bottom seal surface where the second seal material is disposed, an electrode disposed on the base material, and a second chip provided with a second window where a second insulating thin film is formed and held on the second bottom seal surface via the second seal material such that the second window faces the electrode, wherein
the conductive thin film of the first chip and the metal of the lid member are electrically conductive,
the base material is provided with a first member guide and a second chip guide for disposing the second chip, the surface of the lid member facing the electron beam irradiation surface is provided with a second member guide, and the first member guide and the second member guide have heights at which the first insulating thin film and the second insulating thin film do not come into contact with each other when the first member guide and the second member guide are in contact with each other,
a region inside the first seal material is maintained airtightly from a region outside the first seal material by the first member and the second member being combined and the first seal material being crushed between the first bottom seal surface and an upper seal surface of the lid member, and
the second chip guide, the first member guide, and the second member guide form concentric circles in a state where the first member and the second member are combined.

19. The sample holder according to claim 18, wherein
the base material has a cylindrical shape with an outer peripheral portion provided with a first screw structure, the lid member has a peripheral edge portion extending in a direction perpendicular to the electron beam irradiation surface, and an inner wall of the peripheral edge portion is provided with a second screw structure engaging with the first screw structure, and
the first member and the second member are combined by engaging the first screw structure with the second screw structure.

20. The sample holder according to claim 18, wherein
a screw lid with an electron beam passage opening is provided,
the base material has a cylindrical shape with an outer peripheral portion provided with a first screw structure, the screw lid has a peripheral edge portion extending in a direction perpendicular to a surface provided with the opening, and an inner wall of the peripheral edge portion is provided with a second screw structure engaging with the first screw structure, and
the first member and the second member are combined by disposing the first member between the screw lid and the second member and engaging the first screw structure with the second screw structure.

21. The sample holder according to claim 20, wherein a disk-shaped washer is disposed between the screw lid and the first member.

22. The sample holder according to claim 1, 8, 15, or 18, wherein the first seal material is an O-ring and the second seal material is a double-sided tape in which a Si rubber sheet is sandwiched by an adhesive material sheet.

23. The sample holder according to claim 1, 8, 15, or 18, wherein the first seal material and the second seal material are integrally configured.

24. The sample holder according to claim 1, 8, 15, or 18, wherein the first seal material and the second seal material are O-rings.

25. The sample holder according to claim 1, 8, 15, or 18, comprising:
a first space where the sample sandwiched between the first insulating thin film and the second insulating thin film is placed, wherein
the base material has a gas passage connected to the first space and a depressurization film provided at a boundary between the gas passage and an outside atmosphere.

26. The sample holder according to claim 1, 8, 15, or 18, comprising:
a space that is surrounded by the second chip, the second seal material, and the second bottom seal surface, wherein
the base material has a gas passage connected to the space and a depressurization film provided at a boundary between the gas passage and an outside atmosphere.

27. The sample holder according to claim 26, wherein pressure of the space is adjusted by changing swelling of the depressurization film.

28. The sample holder according to claim 1, 8, 15, or 18, comprising:
a first space where the sample sandwiched between the first insulating thin film and the second insulating thin film is placed; and
a depressurization film-given seal material that includes a first seal portion functioning as the first seal material, a second seal portion functioning as the second seal material, and a depressurization film portion connecting the first seal portion and the second seal portion, wherein
the base material is provided with a second space separated from the first space by the depressurization film portion and a gas passage connecting the third space and an outside atmosphere.

29. The sample holder according to claim 1, 8, 15, or 18, comprising:
a first space where the sample sandwiched between the first insulating thin film and the second insulating thin film is placed; and
a depressurization film-functional seal material that functions as the second seal material, wherein
the base material is provided with a second space separated from the first space by the depressurization film-functional seal material and a gas passage connecting the third space and an outside atmosphere.

30. The sample holder according to claim 29, wherein the depressurization film-functional seal material is a double-sided tape in which a Si rubber sheet is sandwiched by an adhesive material sheet.

31. The sample holder according to claim 1, 8, 15, or 18, wherein at least a part of the second member is incorporated in a stage of a charged particle beam device.

* * * * *